(12) United States Patent
Koyanagi et al.

(10) Patent No.: US 9,449,948 B2
(45) Date of Patent: Sep. 20, 2016

(54) CHIP SUPPORT SUBSTRATE, CHIP SUPPORT METHOD, THREE-DIMENSIONAL INTEGRATED CIRCUIT, ASSEMBLY DEVICE, AND FABRICATION METHOD OF THREE-DIMENSIONAL INTEGRATED CIRCUIT

(71) Applicant: TOHOKU UNIVERSITY, Sendai-shi, Myagi (JP)

(72) Inventors: Mitsumasa Koyanagi, Sendai (JP); Tetsu Tanaka, Sendai (JP); Takafumi Fukushima, Sendai (JP)

(73) Assignee: TOHOKU UNIVERSITY, Sendai-shi (JP)

( * ) Notice: Subject to any disclaimer, the term of this patent is extended or adjusted under 35 U.S.C. 154(b) by 0 days.

(21) Appl. No.: 14/427,232

(22) PCT Filed: Sep. 13, 2013

(86) PCT No.: PCT/JP2013/074876
§ 371 (c)(1),
(2) Date: Mar. 10, 2015

(87) PCT Pub. No.: WO2014/046052
PCT Pub. Date: Mar. 27, 2014

(65) Prior Publication Data
US 2015/0228622 A1 Aug. 13, 2015

(30) Foreign Application Priority Data

Sep. 23, 2012 (JP) .................................. 2012-209003

(51) Int. Cl.
*H01L 21/02* (2006.01)
*H01L 25/065* (2006.01)
(Continued)

(52) U.S. Cl.
CPC ......... *H01L 25/0657* (2013.01); *B23K 20/002* (2013.01); *B23K 20/023* (2013.01);
(Continued)

(58) Field of Classification Search
CPC ............ H01L 2224/95085; H01L 2224/9512; H01L 25/50; H01L 2224/95092; H01L 2224/951
See application file for complete search history.

(56) References Cited

U.S. PATENT DOCUMENTS 5,868,305 A * 2/1999 Watts, Jr. ............. B23K 3/0607
228/254
2008/0023435 A1* 1/2008 Wu ....................... B23K 3/0623
216/2
(Continued)

FOREIGN PATENT DOCUMENTS

JP 2001-332680 A 11/2001
JP 2007-531321 A 11/2007
(Continued)

OTHER PUBLICATIONS

Internatioal Search Report dated Dec. 17, 2013, issued in corresponding application No. PCT/JP2013/074876.
(Continued)

*Primary Examiner* — Jasmine Clark
(74) *Attorney, Agent, or Firm* — Westerman, Hattori, Daniels & Adrian, LLP

(57) ABSTRACT

The present invention relates to a chip support substrate including a lyophilic region 4 that is formed on the substrate and that absorbs a chip 3A, and an electrode 6 that is formed on the substrate and in the lyophilic region and that generates electrostatic force in the chip, and to a chip support method including the steps of arranging the chip onto the lyophilic region of the chip support substrate with a liquid 15, the chip support substrate comprising the lyophilic region that is formed on the substrate, and the electrode that is formed on the substrate and in the lyophilic region, and generating the electrostatic force in the chip corresponding to the electrode by applying a voltage to the electrode.

22 Claims, 40 Drawing Sheets

(51) Int. Cl.
<table>
<tr><td>H01L 23/32</td><td>(2006.01)</td></tr>
<tr><td>H01L 21/52</td><td>(2006.01)</td></tr>
<tr><td>H01L 23/498</td><td>(2006.01)</td></tr>
<tr><td>H01L 23/544</td><td>(2006.01)</td></tr>
<tr><td>H01L 23/00</td><td>(2006.01)</td></tr>
<tr><td>H01L 21/56</td><td>(2006.01)</td></tr>
<tr><td>H01L 21/683</td><td>(2006.01)</td></tr>
<tr><td>H01L 25/00</td><td>(2006.01)</td></tr>
<tr><td>B23K 20/00</td><td>(2006.01)</td></tr>
<tr><td>B23K 20/02</td><td>(2006.01)</td></tr>
<tr><td>B23K 20/16</td><td>(2006.01)</td></tr>
<tr><td>H01L 23/31</td><td>(2006.01)</td></tr>
<tr><td>H01L 23/14</td><td>(2006.01)</td></tr>
<tr><td>H01L 23/50</td><td>(2006.01)</td></tr>
<tr><td>H01L 21/768</td><td>(2006.01)</td></tr>
</table>

(52) U.S. Cl.
CPC ............. *B23K 20/16* (2013.01); *H01L 21/52* (2013.01); *H01L 21/561* (2013.01); *H01L 21/568* (2013.01); *H01L 21/6835* (2013.01); *H01L 23/32* (2013.01); *H01L 23/49838* (2013.01); *H01L 23/544* (2013.01); *H01L 24/16* (2013.01); *H01L 24/32* (2013.01); *H01L 24/73* (2013.01); *H01L 24/75* (2013.01); *H01L 24/81* (2013.01); *H01L 24/83* (2013.01); *H01L 24/92* (2013.01); *H01L 24/95* (2013.01); *H01L 25/0652* (2013.01); *H01L 25/50* (2013.01); *H01L 21/76898* (2013.01); *H01L 23/147* (2013.01); *H01L 23/3121* (2013.01); *H01L 23/49827* (2013.01); *H01L 23/49894* (2013.01); *H01L 23/50* (2013.01); *H01L 24/11* (2013.01); *H01L 24/13* (2013.01); *H01L 24/27* (2013.01); *H01L 24/96* (2013.01); *H01L 24/97* (2013.01); *H01L 2221/68327* (2013.01); *H01L 2221/68368* (2013.01); *H01L 2221/68381* (2013.01); *H01L 2223/5442* (2013.01); *H01L 2223/54426* (2013.01); *H01L 2224/1145* (2013.01); *H01L 2224/1146* (2013.01); *H01L 2224/131* (2013.01); *H01L 2224/13023* (2013.01); *H01L 2224/13025* (2013.01); *H01L 2224/13111* (2013.01); *H01L 2224/13144* (2013.01); *H01L 2224/13147* (2013.01); *H01L 2224/16145* (2013.01); *H01L 2224/16146* (2013.01); *H01L 2224/16148* (2013.01); *H01L 2224/16225* (2013.01); *H01L 2224/16227* (2013.01); *H01L 2224/16235* (2013.01); *H01L 2224/16238* (2013.01); *H01L 2224/27436* (2013.01); *H01L 2224/32145* (2013.01); *H01L 2224/32225* (2013.01); *H01L 2224/73104* (2013.01); *H01L 2224/73204* (2013.01); *H01L 2224/75251* (2013.01); *H01L 2224/75611* (2013.01); *H01L 2224/75701* (2013.01); *H01L 2224/75723* (2013.01); *H01L 2224/75745* (2013.01); *H01L 2224/75753* (2013.01); *H01L 2224/75901* (2013.01); *H01L 2224/81002* (2013.01); *H01L 2224/8138* (2013.01); *H01L 2224/81121* (2013.01); *H01L 2224/81143* (2013.01); *H01L 2224/81193* (2013.01); *H01L 2224/81203* (2013.01); *H01L 2224/81395* (2013.01); *H01L 2224/81904* (2013.01); *H01L 2224/81907* (2013.01); *H01L 2224/8385* (2013.01); *H01L 2224/83191* (2013.01); *H01L 2224/9202* (2013.01); *H01L 2224/95145* (2013.01); *H01L 2224/95146* (2013.01); *H01L 2224/96* (2013.01); *H01L 2224/97* (2013.01); *H01L 2225/06513* (2013.01); *H01L 2225/06517* (2013.01); *H01L 2225/06541* (2013.01); *H01L 2225/06593* (2013.01); *H01L 2924/12042* (2013.01); *H01L 2924/1306* (2013.01); *H01L 2924/13091* (2013.01); *H01L 2924/1461* (2013.01); *H01L 2924/15311* (2013.01)

(56) References Cited

U.S. PATENT DOCUMENTS

2009/0023243 A1    1/2009  Koyanagi
2011/0179640 A1*   7/2011  Arnold .................. H01L 24/95
                                                      29/825

FOREIGN PATENT DOCUMENTS

<table>
<tr><td>JP</td><td>2008-177215 A</td><td>7/2008</td></tr>
<tr><td>JP</td><td>2010-153645 A</td><td>7/2010</td></tr>
<tr><td>JP</td><td>2010-206021 A</td><td>9/2010</td></tr>
<tr><td>JP</td><td>2011-192663 A</td><td>9/2011</td></tr>
<tr><td>WO</td><td>2005/099310 A2</td><td>10/2005</td></tr>
<tr><td>WO</td><td>2006/077739 A1</td><td>7/2006</td></tr>
</table>

OTHER PUBLICATIONS

Fukushima, et al., "New Three-Dimensional Integration Technology Using Self-Assembly Technique", IEEE, 2005, 348-351.
Fukushima, et al., "New Three-Dimensional Integration Technology Based on Reconfigured Wafer-on-Wafer Bonding Technique", IEEE, 2007, pp. 985-988.
Fukushima, et al., "New Heterogeneous Multi-Chip Module Integration Technology Using Self-Assembly Method", IEEE, 2008, pp. 499-502.
Fukushima, et al., "Three-Dimensional Integration Technology Based on Reconfigured Wafer-to-Wafer and Multichip-to-Wafer Stacking Using Self-Assembly Method", IEEE, 2009, pp. 349-352.
Landesberger, et al, "Electrostatic wafer handing for thin wafer processing", 2009, pp. 1-5.
Dalin, et al., "Electrostatic attraction and surface-tension-driven forces for accurate self-assembly of microparts", Microelectronic Engineering, 2010, vol. 87, pp. 159-162.
Office Action dated Dec. 7, 2015, issued in counterpart Korean Patent Application No. 10-2015-7006841 (8 pages).

* cited by examiner

CHIP SUPPORT SUBSTRATE, CHIP SUPPORT METHOD, THREE-DIMENSIONAL INTEGRATED CIRCUIT, ASSEMBLY DEVICE, AND FABRICATION METHOD OF THREE-DIMENSIONAL INTEGRATED CIRCUIT

TECHNICAL FIELD

The present invention relates to a chip support substrate, a chip support method, a three-dimensional integrated circuit, an assembly device, and a fabrication method of the three-dimensional integrated circuit.

BACKGROUND ART

An integrated circuit, in which a plurality of integrated circuit chips are laminated, is referred to as a three-dimensional integrated circuit. When the three-dimensional integrated circuit laminated with the chips, such as memory, is fabricated where a lot of non-defective chips can be obtained, a method of fabricating the three-dimensional integrated circuit by laminating a plurality of wafers is employed. A fabrication method of the three-dimensional integrated circuit like this is referred to as WtW (Wafer to Wafer). Throughput is high when the three-dimensional integrated circuit is fabricated by the WtW. When a defective chip exists in the respective wafers, however, the probability of obtaining a non-defective three-dimensional integrated circuit in the end, in other words, a yield becomes lower.

When the chips having various kinds of function are laminated to fabricate the three-dimensional integrated circuit, the non-defective chips, each being in a chip state, are laminated in the respective wafers, so as to fabricate the three-dimensional integrated circuit in which the plurality of chips, having different functions, are laminated. Such a fabrication method is referred to as CtC (Chip to Chip). Throughput is low when the three-dimensional integrated circuit is fabricated by the CtC. However, a yield becomes higher as the non-defective chips are used.

There is such a fabrication method of the three-dimensional integrated circuit that the chips are integrated three-dimensionally to the wafer (which is referred to as Chip to Wafer, CtW). However, significant problems of the CtW are low throughput and low alignment (also referred to as registration) accuracy.

In order to drastically increase the throughput and the alignment accuracy of an assembly, the present inventors have developed 3D integration technique using self-assembly of a multi-chip having surface tension of a liquid (multi chip-wafer 3D integration, which is referred to as SA-MCtW: Self Assembly based-Multi Chip to Wafer) (refer to Non Patent Literatures 1 to 4 and Patent Literature 1).

Patent Literature 1 is the invention filed by one of the present inventors. Patent Literature 1 discloses that the surface tension of an aqueous solution is used to position a chip onto a support substrate with high accuracy. The chip is temporarily fixed onto the support substrate by using absorption force of the aqueous solution. Patent Literature 1 discloses a "transfer method" in which a lot of the mounted chips are replaced onto a target substrate.

Electrostatic chucking is well known as a processing method of wafers. Recently, a processing system of a multipurpose and thin wafer, by using an electrostatic wafer carrier, has been reported by C. Landesberger, P. Ramm, K. Bock et al. (refer to Non Patent Literature 5).

CITATION LIST

Patent Literature

Patent Literature 1: WO2006/077739

Non Patent Literature

Non Patent Literature 1: T. Fukushima et al., IEDM, p. 348, 2005
Non Patent Literature 2: T. Fukushima et al., IEDM, p. 985, 2007
Non Patent Literature 3: T. Fukushima et al., IEDM, p. 499, 2008
Non Patent Literature 4: T. Fukushima et al., IEDM, p. 349, 2009
Non Patent Literature 5: C. Landesberger et al., EMPC, p. 1, 2009

SUMMARY OF INVENTION

Technical Problem

According to the SA-MCtW method, absorption of the chips onto the support substrate is not enough by the surface tension of the liquid only. For this reason, an arrangement state of the chips is deteriorated in the processes after the transfer process of the chips and the like. When the alignment accuracy of the chips is deteriorated like this, productivity is reduced.

In view of the above-described problem, the first object of the present invention is to provide a chip support substrate capable of improving alignment accuracy, the second object is to provide a three-dimensional integrated circuit using the chip support substrate, the third object is to provide the chip support substrate and a chip support method using the same, and to provide a fabrication method of the three-dimensional integrated circuit using the chip support method, and the fourth object is to provide an assembly device.

Solution to Problem

The present invention is a chip support substrate including a lyophilic region that is formed on the substrate and that absorbs a chip, and an electrode that is formed on the substrate and in the lyophilic region and that generates electrostatic force in the chip.

According to the above-described configuration, the lyophilic region includes a plurality of lyophilic regions that respectively absorb a plurality of the chips, and the electrode may be formed in each of the plurality of lyophilic regions.

According to the above-described configuration, the substrate may be formed by a semiconductor, glass, ceramic, plastic or an interposer substrate.

According to the above-described configuration, the plurality of lyophilic regions may be formed by an insulation film.

According to the above-described configuration, a region where the lyophilic region is not arranged on the substrate may be a region having a lyophilic property lower than that of the lyophilic region.

According to the above-described configuration, the electrode may include a cathode and an anode formed in the lyophilic region.

According to the above-described configuration, in the lyophilic region, the cathode and the anode may be disposed in a lattice shape along a first direction that is in parallel to an upper surface of the substrate and a second direction that is in parallel to the upper surface and that crosses the first direction.

According to the above-described configuration, in the electrode, arrangement of the anode and the cathode may be set optionally.

The present invention is a three-dimensional integrated circuit including the chip support substrate, a chip that is laminated on the lyophilic region, and another chip of one layer or more that is laminated on the chip.

According to the above-described configuration, the chip may include another lyophilic region that absorbs the another chip on its upper surface, and other electrode that is formed on the upper surface of the chip and in the another lyophilic region and that generate electrostatic force in the another chip.

The present invention is a chip support method including the steps of arranging a chip onto a lyophilic region of a chip support substrate with a liquid interposed therebetween, the chip support substrate comprising the lyophilic region that is formed on the substrate, and an electrode that is formed on the substrate and in the lyophilic region, and generating electrostatic force in the chip corresponding to the electrode by applying a voltage to the electrodes.

According to the above-described configuration, the lyophilic region may include a plurality of lyophilic regions that respectively absorb a plurality of the chips, the electrode may be formed in each of the plurality of lyophilic regions, and the step of arranging the chip may include the step of arranging each of the plurality of chips onto the each of plurality of lyophilic regions with the liquids interposed therebetween.

According to the above-described configuration, the step of allowing the chip to be absorbed to the lyophilic region may be included.

According to the above-described configuration, the electrode may include cathode and anode formed in the lyophilic region, and the step of generating the electrostatic force may include the step of generating the electrostatic force in such a manner that a center of the chip is arranged between the cathode and the anode, by supplying a voltage to the cathode and the anode while there is the liquid.

According to the above-described configuration, the step of generating the electrostatic force may include the step of generating the electrostatic force in such a manner that the chip is absorbed to the chip support substrate.

According to the above-described configuration, the step of laminating another chip on the chip while the chip is absorbed to the chip support substrate may be included.

According to the above-described process, the steps of transferring the chip that is absorbed to the chip support substrate to another substrate, and transferring the chip that is transferred to the another substrate to a semiconductor wafer may be included.

According to the above-described structure, the step of transferring the chip that is absorbed to the chip support substrate onto a semiconductor wafer may be included.

According to the above-described structure, a region where the lyophilic region is not arranged on the substrate may include a region having a lyophilic property lower than that of the lyophilic region.

According to the above-described structure, the step of removing the region having the lower lyophilic property may be included.

The present invention relates to a fabrication method of a three-dimensional integrated circuit including the chip support method.

The present invention is an assembly device including a stage for mounting a chip support substrate including a lyophilic region that is formed on the substrate and an electrode that is formed on the substrate and in the lyophilic region, a droplet supply unit for supplying a droplet onto the lyophilic region, a carrier robot for supplying a chip onto the droplet supplied onto the lyophilic region, and a power source unit for supplying a voltage to the electrode in such a manner that electrostatic force is generated in the chip.

Advantageous Effects of Invention

According to the present invention, it is possible to provide the chip support substrate capable of improving the alignment accuracy.

By using the chip support substrate of the present invention, it is possible to provide the highly functional three-dimensional integrated circuit capable of improving the alignment accuracy.

According to the chip support method of the present invention, it is possible to improve the alignment accuracy.

According to the fabrication method of the three-dimensional integrated circuit using the chip support method of the present invention, it is possible to improve the alignment accuracy.

According to the assembly device of the present invention, it is possible to improve the alignment accuracy.

BRIEF DESCRIPTION OF DRAWINGS

FIG. 19(a) and FIG. 19(b) are views studying influences of parameters on electrostatic absorption force, in which FIG. 19(a) illustrates the influences of an applied voltage and FIG. 19(b) illustrates the influences of temperature;

FIG. 20(a) and FIG. 20(b) are views studying influences of the parameters on unipolar electrostatic absorption force, in which FIG. 20(a) illustrates the influences of the applied voltage and FIG. 20(b) illustrates the influences of the temperature;

FIG. 21(a) and FIG. 21(b) are views illustrating characteristics of a MOSFET, in which FIG. 21(a) illustrates $I_D$-$V_G$ characteristics and FIG. 21(b) illustrates $I_D$-$V_D$ characteristics;

FIG. 22(a) to FIG. 22(d) are views illustrating self-assembly chips after electrostatic temporary bonding, in which FIG. 22(a) illustrates the surface after the electrostatic temporary bonding, FIG. 22(b) illustrates the surface after the chips are transferred from the chip support substrate to an adhesive wafer, FIG. 22(c) illustrates the surface after multi-chip thinning, by which the thickness is reduced from 140 μm to 25 μm, and FIG. 22(d) is a view schematically illustrating an SEM image of the cross section in which Si vias are formed, by using a Bosch process, in the chip after the self-assembly;

FIG. 27(a) and FIG. 27(b) are views illustrating infrared ray images, in which FIG. 27(a) is an image after transfer to the adhesive wafer, and FIG. 27(b) is an image after the transfer, via an NCF, to a semiconductor wafer as a target wafer;

DESCRIPTION OF EMBODIMENTS

Figure 1:
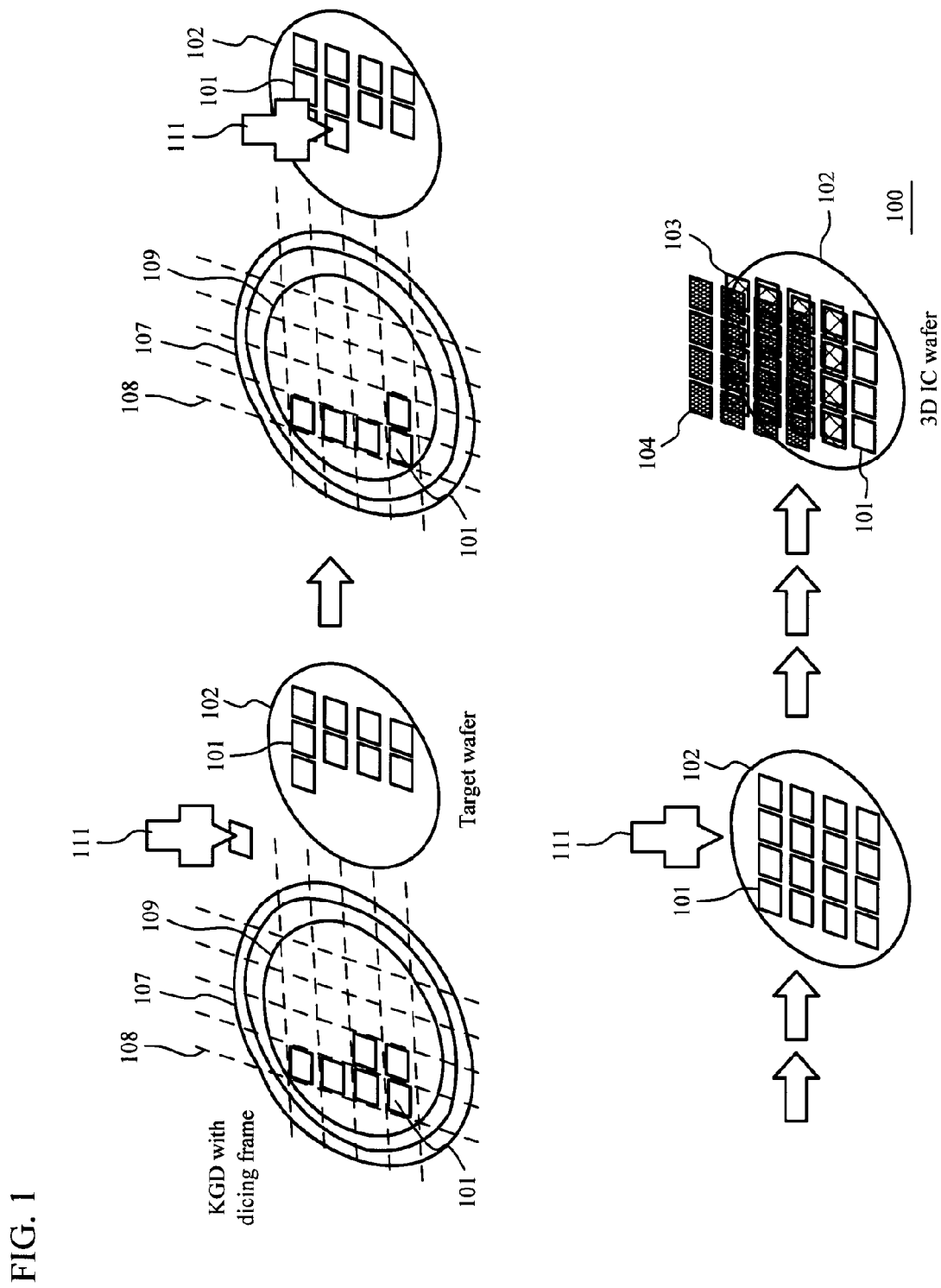
FIG. 1 is a view illustrating a fabrication method of a three-dimensional integrated circuit by CtW, according to a comparative example 1.

First, comparative examples will be explained. A comparative example 1 is an example of a fabrication method of a three-dimensional integrated circuit by using CtW. FIG. 1 is a view illustrating the fabrication method of the three-dimensional integrated circuit by using the comparative example 1. As illustrated in FIG. 1, a lot of non-defective chips (Known Good Dies, hereinafter referred to as KGD chips) 101 are affixed to a tape 109 that is affixed to a dicing frame 107. Broken lines 108 indicate dicing lines. A pickup tool 111 vacuum-absorbs the chip 101 and picks up the chip 101 from the tape 109. The pickup tool 111 carries the chip 101 onto a substrate 102, on which an integrated circuit or the like is formed. The chip 101 is mechanically positioned with high accuracy on the substrate 102 with a desired layout. The chip 101 is fixed onto the substrate 102 via an adhesive. The pickup tool 111 fixes the next chip 101 onto the substrate 102. Thus, the chips 101 are fixed onto the substrate 102 one by one.

After all the KGD chips 101 of the first layer are fixed onto the substrate 102 with predetermined alignment accuracy, the pickup tool 111 vacuum-absorbs a chip 103 and carries the chip 103 on the top of the chip 101. The chip 103 is positioned with high accuracy and fixed onto the chip 101.

The chip 103 is fixed onto the chip 101 one by one. The similar process is repeated for KGD chips 104 of the third layer. In each of the chips 101 and 103, a silicon through electrode (Through Silicon Via, hereinafter referred to as a TSV) that vertically penetrates the chips 101 and 103 is formed. The TSV connects the chips 101, 103 and 104 vertically and electrically. Thus, a three-dimensional integrated circuit 100 is fabricated.

With CtW as in the comparative example 1, bonding to the substrate 102 is made by a chip assembly method, in which the pickup tool 111 absorbs and detaches the chips 101.

According to the chip assembly method in which the chips are absorbed and detached as in the comparative example 1, however, the chips 101 are carried to the substrate 102 one by one. This causes significant problems of low throughput and low alignment accuracy.

Figure 2:
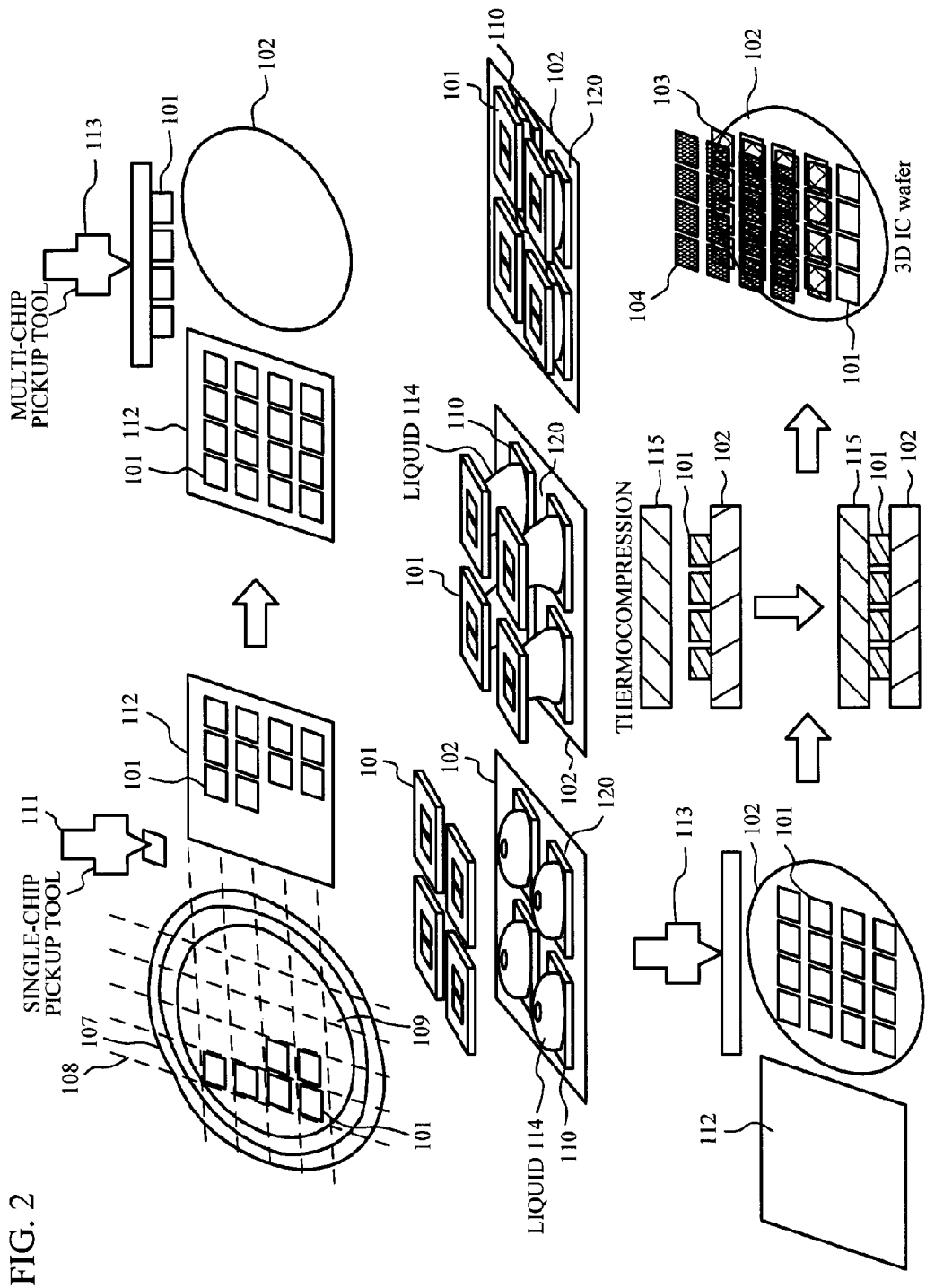
FIG. 2 is a view illustrating the fabrication method of the three-dimensional integrated circuit by SA-MCtW, according to a comparative example 2.

A comparative example 2 is an example of the fabrication method of the three-dimensional integrated circuit by using SA-MCtW. FIG. 2 is a view illustrating the fabrication method of the three-dimensional integrated circuit by using the comparative example 2. As illustrated in FIG. 2, a single-chip pickup tool 111, carrying the chips 101 one by one, temporarily places the chips 101 onto a base 112 one by one, similarly to the comparative example 1. A multi-chip pickup tool 113, carrying a plurality of the chips 101, carries the plurality of chips 101, temporarily placed onto the base 112, onto the substrate 102.

Drawings in the middle row are enlarged views of the substrate 102. On the upper surface of the substrate 102, a plurality of hydrophilic regions 110 and a hydrophobic region 120 are provided. By dropping droplets onto the plurality of hydrophilic regions 110, liquids 114 are arranged on the plurality of hydrophilic regions 110. The good chips 101 are arranged on the liquids 114. When the liquids 114 vaporize, the chips 101 are absorbed onto the substrate 102. At this time, the chips 101 are absorbed to the hydrophilic regions 110 in a self-assembling manner, by surface tension of the liquids 114.

A plate 115 is used to thermocompress the chips 101 onto the substrate 102 as a wafer. Similarly, the chips 103 are fixed onto the chips 101, and the chips 104 are fixed onto the chips 103.

According to the comparative example 2, both requests, that is, high throughput and a high yield are satisfied. According to the comparative example 2, however, the expensive multi-chip pickup tool 113 is used to assemble the plurality of chips 101 onto the liquids 114. In addition, the chips 101 are absorbed to the substrate 102 by the surface tension of the liquids 114, and hence, the absorption of the chips 101 onto the substrate 102 is not enough. For this reason, work in the subsequent processes is conducted carefully so as to suppress the movement of the chips 101. This causes low productivity. As the chips 101 are aligned with the substrate 102 by using the surface tension of the liquids 114, the alignment accuracy of the chips 101 to the substrate 102 is low. This causes the low productivity.

Figure 3:
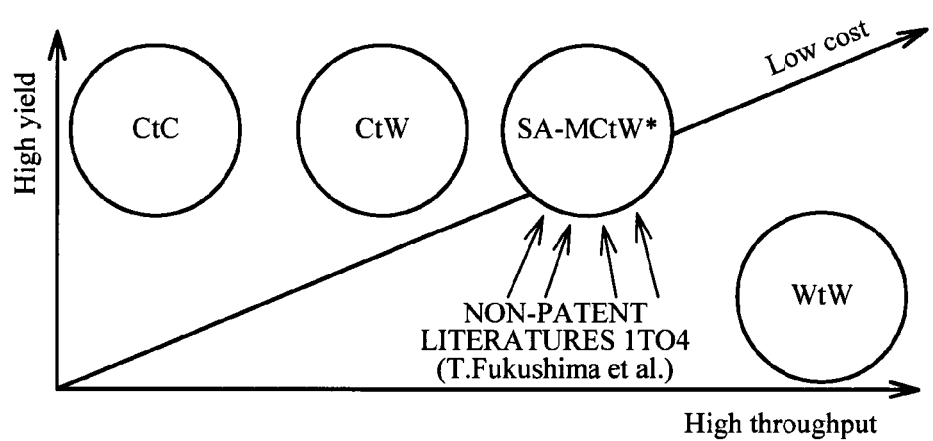
FIG. 3 is a view illustrating the relationship between throughput and a yield, according to the respective fabrication methods of the three-dimensional integrated circuit.

FIG. 3 is a view illustrating the relationship between the throughput and the yield, according to the respective fabrication methods of the three-dimensional integrated circuit. As illustrated in FIG. 3, all of CtC, CtW (the comparative example 1), and SA-MCtW (the comparative example 2), as described above, are the method of making the three-dimensional integrated circuit by the chips with different functions, and have a high yield. However, throughput is low. Meanwhile, WtW has high throughput, but a low yield.

Hereinafter, the present invention will be explained in detail based on an embodiment and its modification examples as illustrated in the drawings.

Figure 4:
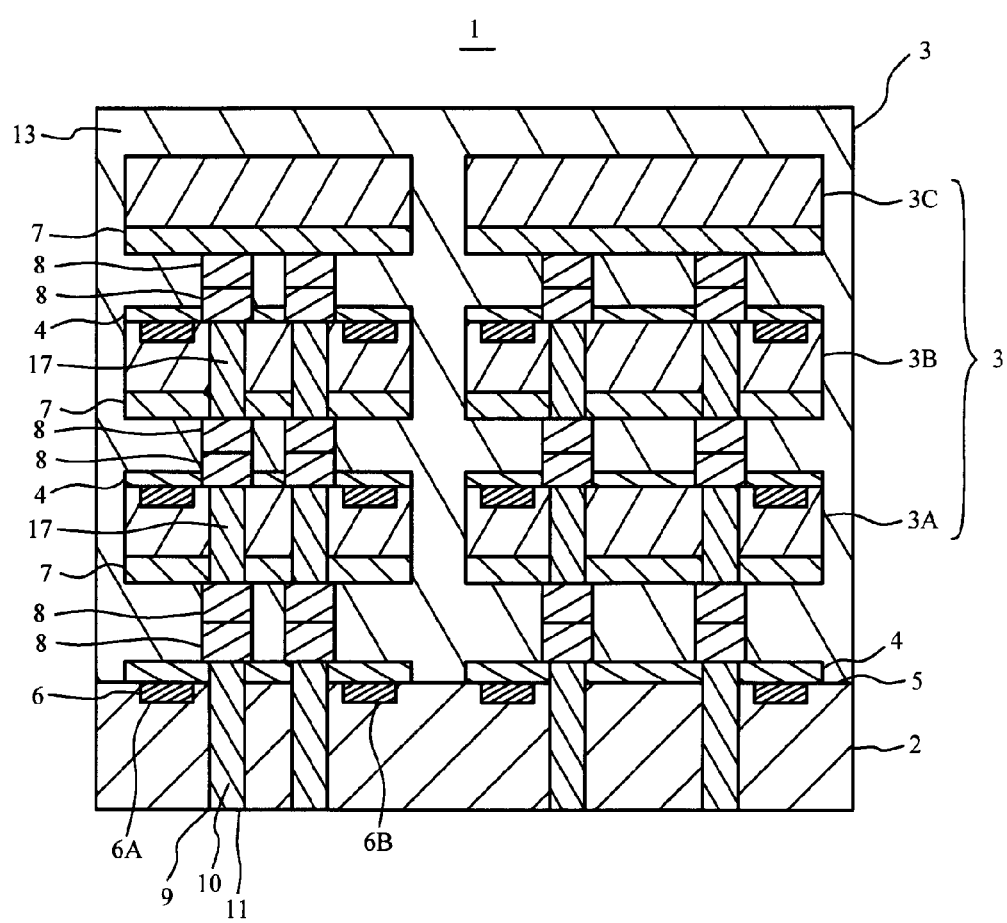
FIG. 4 is a cross sectional view illustrating the structure of an integrated circuit that is integrated three-dimensionally according to this embodiment.

FIG. 4 is a cross sectional view illustrating the structure of an integrated circuit 1 that is integrated three-dimensionally according to this embodiment.

As illustrated in FIG. 4, the integrated circuit 1 according to this embodiment that is integrated three-dimensionally (3D) has such integration structure that a plurality of chips 3A, 3B and 3C, as chips 3, are laminated three-dimensionally on a chip support substrate 2.

It should be noted that the chips 3 include semiconductor integrated circuit chips, array chips of light emitting elements and the like, which are judged as good items in a predetermined test, and which are also referred to as the KGD (Known Good Die) chips.

On the chip support substrate 2, lyophilic regions 4 that can absorb the chips 3A in a self-assembly manner, and a region 5 having a lyophilic property lower than that of the lyophilic regions 4 are formed, with the liquids interposed therebetween, and electrodes 6 for electrostatic absorption are formed. The lyophilic region 4 and the region 5 having the lyophilic property lower than that of the lyophilic region have different wettability (a contact angle at the time of dropping the liquid onto the region). In FIG. 4, the lyophilic region 4 is formed by a layer, and the region 5 is illustrated as a region where the layer is not formed, but the lyophilic region 4 and the region 5 may be respectively formed as the layer. An additive may be added to the liquid in order to increase surface tension. An inorganic liquid or an organic liquid may be used as the liquid, which may include water, glycerin, acetone, alcohol, SOG (Spin On Glass) and the like. Hereinafter, an explanation will be given supposing that the liquid is water, the lyophilic region 4 is a hydrophilic region 4, and the region 5 having the lower lyophilic property is a hydrophobic region 5. This will also apply to modification examples below.

The chip support substrate 2 is a substrate for supporting the three-dimensional structure in which the chips, each having a single layer or a plurality of circuit layers, are laminated, and may be a semiconductor, glass, ceramic, plastic, an interposer substrate or the like. As the glass, quartz glass or Pyrex (Registered-trademark) glass may be used. As the ceramic, alumina or aluminum nitride may be used. As the interposer substrate, an epoxy substrate or a glass fiber epoxy substrate (a glass epoxy substrate) may be used. The interposer substrate may be a silicon wafer or a glass wafer that is bare, in other words, that does not have the integrated circuit formed thereon, but the material of the interposer substrate is not restrictive.

Here, the chip support substrate 2 has the hydrophilic regions 4 that are covered by hydrophilic material, and the hydrophobic region 5 where the vicinity of the hydrophilic regions 4 is covered by hydrophobic material. The hydrophilic regions 4 are regions for precise registration of the plurality of KGD chips 3 by using self-assembly function, and are mounting regions where the chips are absorbed. The size and the shape of each hydrophilic region 4 are substantially same as those of the chip 3A. Thereby, the chip 3A is aligned with the hydrophilic region 4, by the surface tension of the liquid. The alignment is made in a self-assembling manner along, for example, two directions that are in parallel to the upper surface of the chip support substrate 2 (X direction and Y direction, for example), and rotation direction in the upper surface. In the chip support substrate 2, the electrodes 6, each formed by an anode 6A and a cathode 6B, are provided under the hydrophilic material (an insulation film, for example) so that the chips 3 can be absorption-fixed in an electrostatic manner, via the insulation film, for example. This electrodes 6 may be interdigital electrodes, for example. The chip support substrate 2 according to this embodiment is characterized in that the KGD chips 3 can be laminated three-dimensionally by using the chip support substrate 2 that is provided with the interdigital electrodes 6. For the simultaneous absorption-fixing of the chips 3, a high voltage of 100 V to several hundreds V or more is applied to the interdigital electrodes 6. Meanwhile, when a reverse voltage is applied, the fixed chips 3 can be separated easily, which is another remarkable characteristic.

The chip support substrate 2 (the interposer substrate, for example) is a substrate, on which the chip 3, having an LSI formed by the semiconductor or the like mounted thereon, is directly mounted. The chip support substrate 2 may be a substrate formed by plastic or resin. The chip support substrate 2 is used for connection with various printed circuit boards (not illustrated), via solder bumps, solder balls or the like (not illustrated) that are formed on the lower surface of the chip support substrate 2. Micro bumps 8 are formed on the upper surface of the chip support substrate 2. The solder bumps or the solder balls and the micro bumps 8 are electrically connected via through electrodes 11 for the chip support substrate. The through electrodes 11 for the chip support substrate are electrodes 10 embedded in through holes 9. Each of the through electrodes 11 for the chip support substrate is simply referred to as a via.

The chip 3A is a chip, on which the LSI formed by the semiconductor or the like is mounted, as described above. An insulation layer 7 or the like and the micro bumps 8 are formed on the lower surface of the chip 3A. On the upper surface of the chip 3A, the hydrophilic regions 4 that can absorb the chip 3A in a self-assembly manner and the hydrophobic region 5 (not illustrated) are formed, and the electrodes 6 for the electrostatic absorption are formed. In addition, the micro bumps 8 are formed on the chip 3A. The micro bumps 8 formed on the lower surface and the upper surface of the chip 3A are electrically connected via Si through electrodes 17. The micro bumps 8 formed on the chip support substrate 2 and the micro bumps 8 formed under the chip 3A are fixed. The chip support substrate 2 and the chip 3A are electrically connected via the micro bumps 8. The semiconductor is formed by a single element semiconductor such as Si or Ge, or by a compound semiconductor. Hereinafter, an explanation will be given supposing that the chips 3 are formed by Si.

The structures of the chips 3B and the chips 3C are the same as that of the chip 3A.

Each of the chip 3A, the chip 3B and the chip 3C has the function of, for example, a microprocessor, various kinds of memory, an image sensor, a light emitting element array, a micro machine (MEMS: Micro Electro Mechanical System) and the like. The chip 3A, the chip 3B and the chip 3C may have the same function, or different functions. In addition, the chip 3A, the chip 3B and the chip 3C that are laminated may have different functions.

(Fabrication Method)

FIG. 5(*a*) to FIG. 7(*d*) are cross sectional views illustrating a fabrication method of the integrated circuit 1 that is integrated three-dimensionally according to this embodiment.

(A) Making of the Interposer Substrate

First, as illustrated in FIG. 5(*a*), the electrodes 6 for the electrostatic absorption are formed on the chip support substrate 2 as the interposer substrate. For example, Al/W is vapor-deposited onto the chip support substrate 2, and then, a pattern of the electrodes 6 is formed by a lithography method and etching, such as RIE (Reactive Ion Etching) of Al/W.

Next, the hydrophilic regions 4 are formed at the positions where the chips 3A are absorbed, and the hydrophobic region 5 is formed at the position where the chips 3A are not absorbed. The hydrophilic regions 4 can be formed by an oxide film such as $SiO_2$. The hydrophilic regions 4 can be formed by $Si_3N_4$, other than $SiO_2$. In addition, the hydrophilic regions 4 can be formed by a two-layered film of aluminum and alumina ($Al/Al_2O_3$), and by a two-layered film of tantalum and tantalum oxide ($Ta/Ta_2O_5$).

The hydrophobic region 5 can be formed by a film formed by fluorocarbon, for example. With regard to the hydrophobic region 5, the substrate itself may be formed by single crystal silicon (Si), epoxy resin, fluororesin, silicone resin, Teflon (Registered-trademark) resin, polyimide resin, resist, wax, BCB (benzocyclobutene) or the like which are hydrophobic. The hydrophobic region 5 may be formed by coating a chip mounting surface of the interposer substrate, as the chip support substrate 2, with polycrystal silicon, amorphous silicon, fluororesin, silicone resin, Teflon (Registered-trademark) resin, polyimide resin, resist, wax, benzocyclobutene (BCB) or the like.

(B) Formation of the Through Electrodes for the Interposer Substrate

As illustrated in FIG. 5(*b*), the through holes 9 that penetrate the substrate are formed at predetermined positions of the chip support substrate 2, and the electrodes, formed by a conductor such as metal, are embedded into the through holes 9, so as to form the through electrodes 11 for the interposer substrate. On the top of the through holes 9, the micro bumps 8, formed by the conductor such as metal, are formed.

(C) Self-Assembly

As illustrated in FIG. 5(*c*), the chip 3A, whose thickness is reduced in advance, is absorbed in a self-assembling manner to the hydrophilic region 4, where the chip 3A is placed, of the chip support substrate 2. Namely, water as a liquid 15 is dropped onto the hydrophilic region 4. The chip 3A is arranged onto the liquid 15. When the liquid 15 vaporizes, the chip 3A is absorbed onto the hydrophilic region 4. Next, as illustrated in FIG. 5(*d*), another chip 3A is absorbed onto another hydrophilic region 4 in a self-assembling manner.

(D) Electrostatic Absorption

As illustrated in FIG. 6(*a*), a direct current voltage is applied to the electrodes 6 for the electrostatic absorption, and the chips 3A are absorbed electrostatically to the hydrophilic regions 4 of the chip support substrate 2, so as to bond the chips 3A temporarily and simultaneously.

(E) Resin Mold

As illustrated in FIG. 6(*b*), a resin is injected between the chip support substrate 2 as the interposer substrate and the chips 3A that are fixed simultaneously, so as to form a resin mold 13. Material of the resin mold 13 may be an epoxy resin, for example. The resin mold 13 may not be formed, and may be formed after the chips 3A to 3C are laminated. In this case, the hydrophobic region may not be formed. Hereinafter, the process of resin-molding the chips 3 can be omitted when it is not necessary.

(F) Formation of the Electrodes for Electrostatic Absorption on the Chips 3A

As illustrated in FIG. 6(*c*), the electrodes 6 for the electrostatic absorption are formed on the surfaces of the chips 3A. The formation of the electrodes 6 for the electrostatic absorption can be made similarly to the process (A). Incidentally, in FIG. 6(c), the electrodes 6 are embedded in the chips 3A, but the electrodes 6 may be formed on the flat surfaces of the chips 3A. When the resin mold 13 is formed on the upper surfaces of the chips 3A, the electrodes 6 for the electrostatic absorption are formed after exposing the surfaces of the chips 3A, on which the resin mold 13 is formed.

Figure 6A:
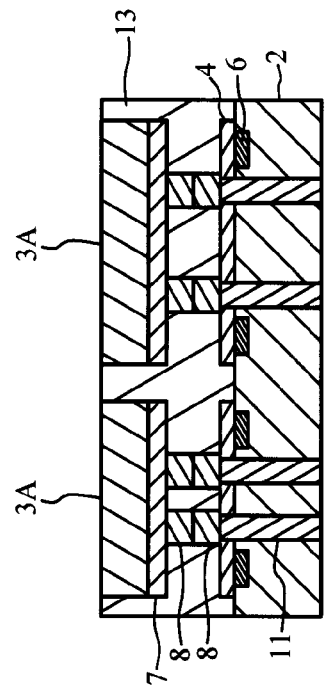
FIG. 6(a) to FIG. 6(d) are cross sectional views illustrating the fabrication method of the integrated circuit that is integrated three-dimensionally according to this embodiment.
Figure 6B:
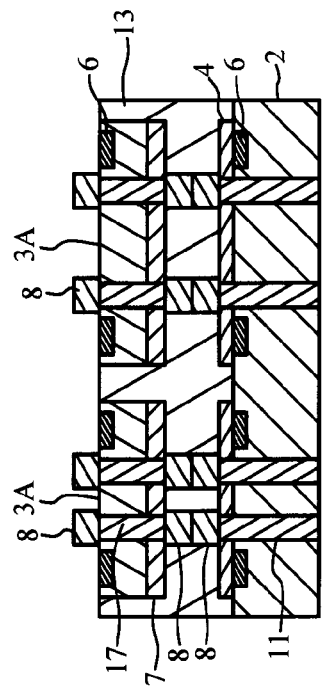
Figure 6C:
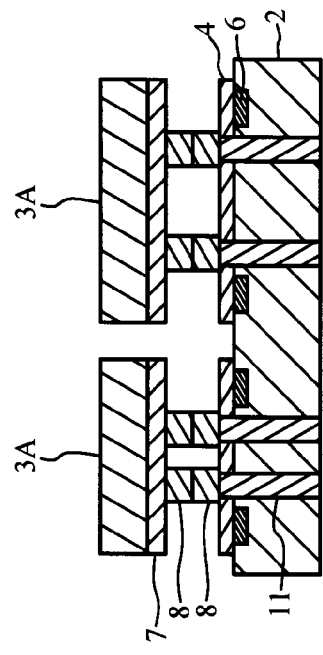
Figure 6D:
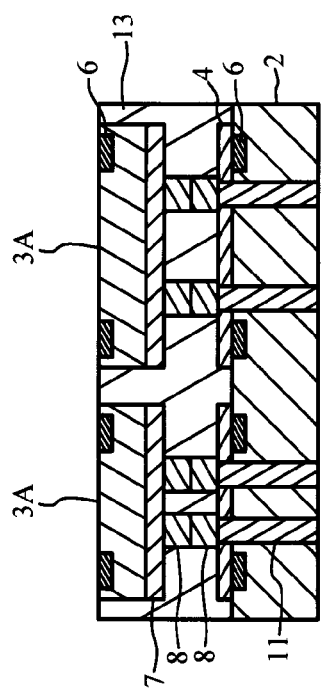

(G) Formation of the Si Through Electrodes and the Micro Bumps in and on the Chips 3A As illustrated in FIG. 6(d), the Si through electrodes (hereinafter also referred to as TSVs) 17 that vertically penetrate the chips 3A are formed. The micro bumps 8 are formed on the chips 3A. The formation of the TSVs 17 and the micro bumps 8 can be made similarly to the process (B).

(H) Formation of the Hydrophilic Region 4 on the Surface of the Chip 3A

Figure 7A:
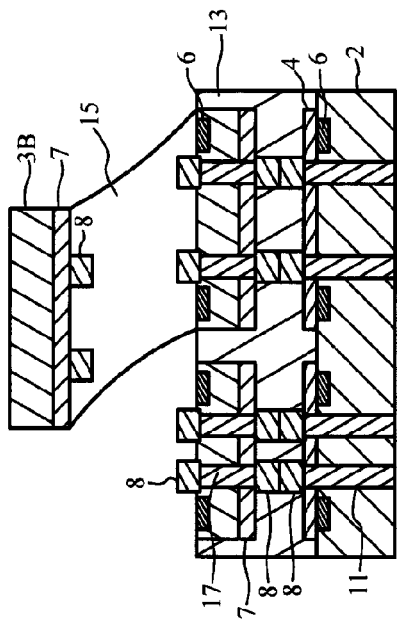
FIG. 7(a) to FIG. 7(d) are cross sectional views illustrating the fabrication method of the integrated circuit that is integrated three-dimensionally according to this embodiment.

As illustrated in FIG. 7(a), the hydrophilic region 4 and the hydrophobic region 5 are formed on the surface of the chip 3A. The formation of the hydrophilic region 4 and the hydrophobic region 5 can be made similarly to the process (A). The insulation film of the hydrophilic region 4 is not illustrated. When the size of the chip 3B is the same as that of the chip 3A, the hydrophilic region 4 is made on the surface of the chip 3A, and the hydrophobic region 5 is made on the surface of the resin mold 13. When the size of the chip 3B is smaller than that of the chip 3A, the hydrophilic region 4 and the hydrophobic region 5 are formed on the surface of the chip 3A, and the hydrophobic region 5 is formed on the resin mold 13. When the size of the chip 3B is larger than that of the chip 3A, the entire surface of the chip 3A is made as the hydrophilic region, and the hydrophilic region 4 and the hydrophobic region 5 are formed on the surface of the resin mold 13. This also applies to the chips 3B and 3C.

(I) Self-Assembly of the Chip 3B

Figure 7B:
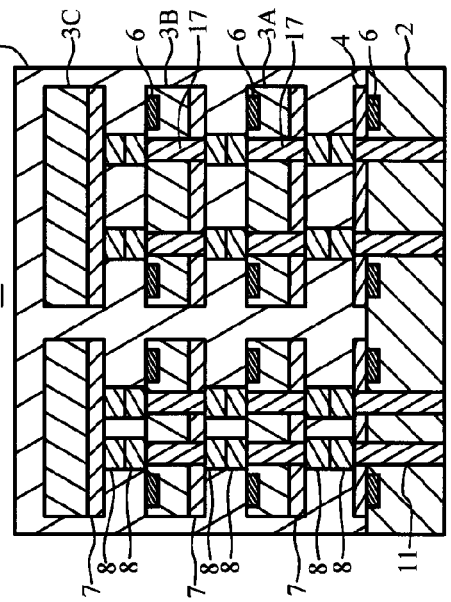

As illustrated in FIG. 7(b), the chip 3B, whose thickness is reduced in advance, is absorbed in a self-assembling manner to the hydrophilic region 4 of the chip 3A. This process can be performed similarly to the process (C).

(J) Electrostatic Absorption of the Chip 3B

Figure 7C:
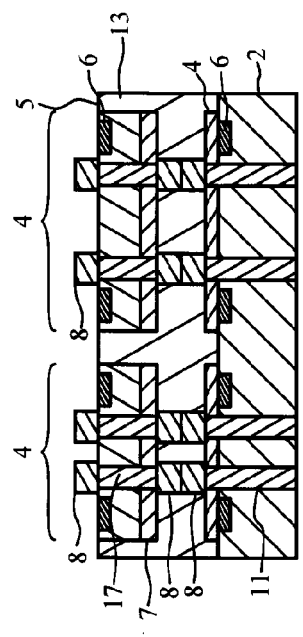

As illustrated in FIG. 7(c), the chip 3B that is absorbed in a self-assembling manner is absorbed to the chip 3A electrostatically. This process can be performed similarly to the process (D).

(K) Formation of the TSVs and the Micro Bumps in and on the Chip 3B

Figure 7D:
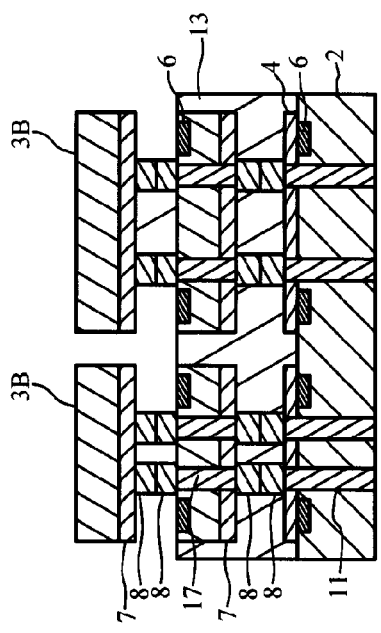

As illustrated in FIG. 7(d), the TSVs 17 and the micro bumps 8 are formed in and on the chip 3B. The formation of the TSVs 17 and the micro bumps 8 can be performed similarly to the process (G).

By repeatedly performing the above-described processes (F) to (J), the chips 3A and 3B, and the chips 3C and the like can be laminated on the chip support substrate 2. When it is necessary to connect only the chips 3C, as the uppermost layer, and the chips 3B that are on the lower side thereof, the insulation layer 7 and the micro bumps 8 are formed on the lower surface side of the chips 3C, as illustrated in FIG. 7(d), and the TSVs 17 may not be formed.

As illustrated in FIG. 5(a) to FIG. 7(d), the fabrication method of the three-dimensional integrated circuit 1 according to this embodiment is characterized in that the KGD chips 3 are dropped onto or adhered to and separated from water droplets having the self-assembly function, and then, the plurality of KGD chips 3 are absorption-fixed onto the chip support substrate 2 electrostatically and simultaneously. According to this method, the three-dimensional integrated circuit 1 having the three-dimensional lamination structure can be fabricated with a high yield, high productivity, high accuracy, and low cost.

(Electrodes for Electrostatic Absorption)

Figure 8:
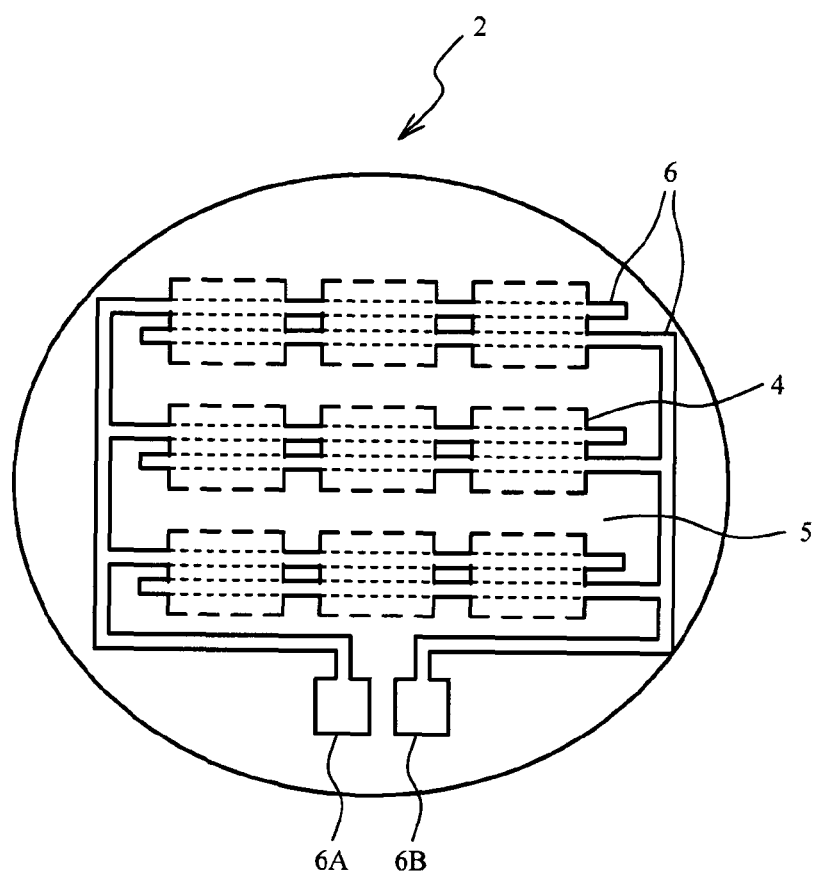
FIG. 8 is a plan view of an interposer substrate on which electrodes for electrostatic absorption are formed.

FIG. 8 is a plan view of the chip support substrate 2 on which the electrodes 6 for the electrostatic absorption are formed. As illustrated in FIG. 8, the electrode 6 for the electrostatic absorption are the so-called bipolar electrode, formed by the anode 6A and the cathode 6B. In the hydrophilic region 4, the anode 6A and the cathode 6B are formed. The bipolar electrode 6 is the interdigital electrode, as illustrated in FIG. 8, for example. A positive voltage is applied to the anode 6A, and a negative voltage is applied to the cathode 6B in the interdigital electrode 6 as illustrated in FIG. 8. Electrostatic force applied to the chip 3A, by using the bipolar electrode 6 like this, can be provided by the following expression (1).

[Expression 1]

$$F_{bp} = \frac{(\varepsilon_0 \varepsilon_r A V^2)}{8d^2} \qquad (1)$$

Where, $F_{bp}$ is the electrostatic force generated in the electrostatic bonding by using the bipolar electrode 6, A is an area of the interdigital electrode, d is a distance between the electrode 6 and the chip 3, $\varepsilon_r$ is a relative permittivity, $\varepsilon_0$ is permittivity in vacuum, and V is an applied voltage.

Figure 9:
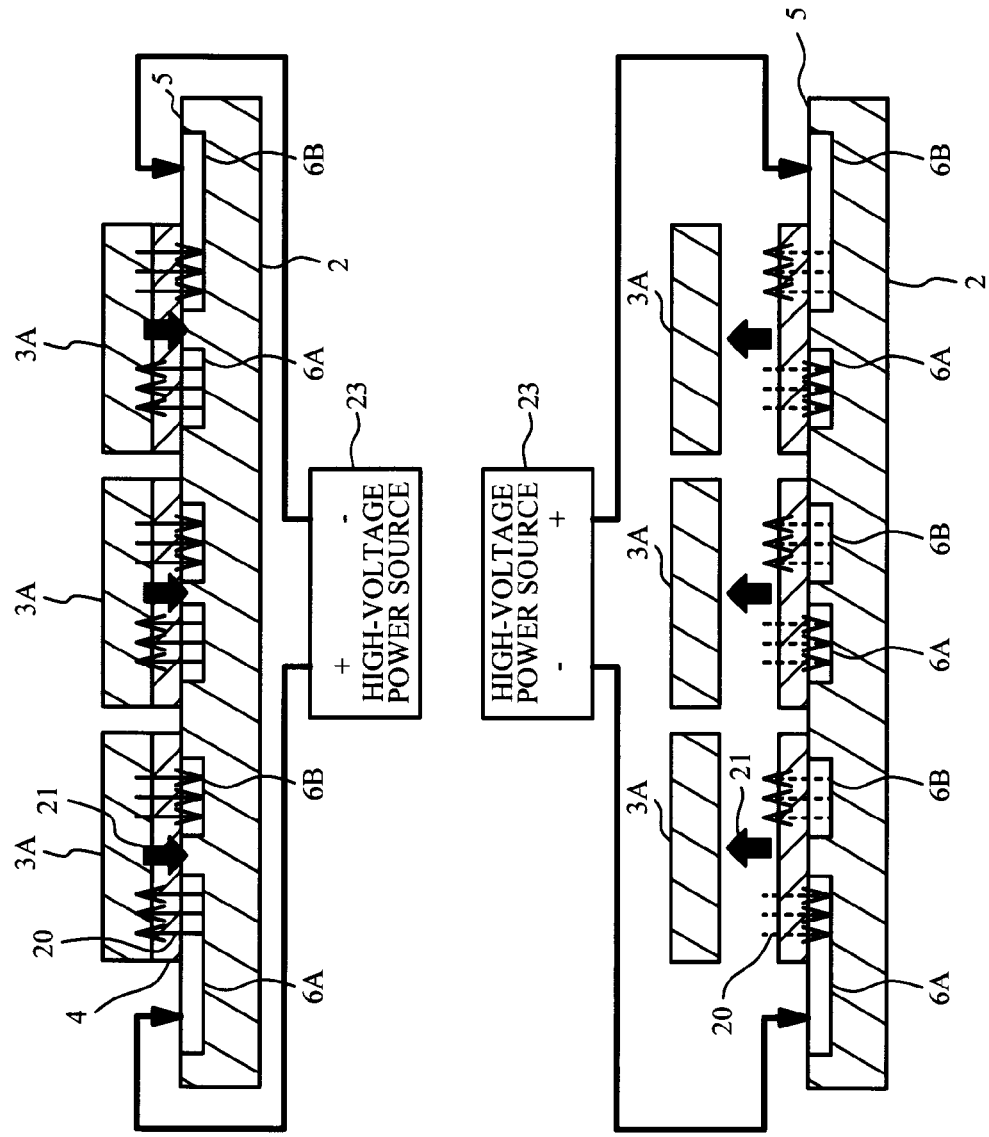
FIG. 9 is a schematic view illustrating voltage application at the time of the electrostatic absorption.

FIG. 9 is a schematic view illustrating voltage application at the time of the electrostatic absorption. In the case of the bipolar electrode 6, as illustrated in the upper drawing in FIG. 9, a high-voltage power source 23 is used to apply a direct current (DC) voltage having a high voltage, across the anode 6A and the cathode 6B of the interdigital electrode. The positive voltage is applied to the anode 6A, and the negative voltage is applied to the cathode 6B. Lines of electric force in the upward direction, as illustrated by arrows 20, are formed in the anode 6A. Lines of electric force in the downward direction, as illustrated by arrows 20, are formed in the cathode 6B. Electric charges that are opposite to the electrode 6 are stored in the insulator in the chips 3A. Thereby, the electrostatic force in the downward direction is generated in the chips 3A, as illustrated by arrows 21, and the chips 3A are electrostatically absorbed to the chip support substrate 2. Next, as illustrated in the lower drawing in FIG. 9, the high-voltage power source 23 is used to apply the DC voltage, having the polarity opposite to that of the upper drawing in FIG. 9, is applied across the anode 6A and the cathode 6B. The lines of electric force in the downward direction, as illustrated by arrows 20, are formed in the anode 6A. The lines of electric force in the upward direction, as illustrated by arrows 20, are formed in the cathode 6B. The electrode 6 has the same polarity as that of the electric charges stored in the insulator in the chips 3A. Thereby, the upward electrostatic force is generated in the chips 3A, as illustrated by the arrows 21, and the chips 3A are separated from the chip support substrate 2. In other words, the electrostatic absorption is released.

With the integrated circuit 1 that is integrated three-dimensionally according to this embodiment, the plurality of chips 3A, 3B and 3C can be laminated on the chip support substrate 2, as explained in the fabrication method with reference to FIG. 5(a) to FIG. 7(d). The hydrophilic regions 4, formed on the chip support substrate 2 and the chips 3A and 3B, are formed by the oxide film. Therefore, the formation of the hydrophilic regions 4 does not affect the chips 3A, 3B and 3C of the integrated circuit 1 that is integrated three-dimensionally.

Similarly, the hydrophobic region 5, formed on the chip support substrate 2 and the chips 3A and 3B, is formed by the film of fluorocarbon or the like. Therefore, the formation of the hydrophobic region 5 does not affect the chips 3A, 3B and 3C of the integrated circuit 1 that is integrated three-dimensionally.

In addition, the electrodes 6 for the electrostatic absorption, formed on the chip support substrate 2 and the chips 3A and 3B, are insulated from the TSVs 11 and 17 via the insulator. Therefore, the formation of the electrodes 6 does not affect the chips 3A, 3B and 3C of the integrated circuit 1 that is integrated three-dimensionally.

According to the comparative example 2, the chips 3 are absorbed by absorption force of an aqueous solution having the self-assembly function. For this reason, the absorption force is very weak, or too strong to remove the chip 3 once it is fixed, which causes such a disadvantage that a yield of lamination by transfer is low. According to the fabrication method of the three-dimensional integrated circuit 1 by using the chip support substrate 2 of this embodiment, the self-assembly function and electrostatic interaction are used to allow the plurality of KGD chips 3A to be absorption-fixed to the chip support substrate 2 simultaneously and strongly. Thus, productivity is increased, and highly reliable registration can be made possible. Further, as in the lower drawing in FIG. 9, the voltage having the opposite polarity to the electrostatic absorption is applied to the electrodes 6, so that the chips 3A can be easily removed from the chip support substrate 2.

Modification Example 1 of the Integrated Circuit that is Integrated Three-Dimensionally An explanation will be given to a modification example 1 of the integrated circuit that is integrated three-dimensionally, which can be fabricated by using a chip support substrate 42 based on hybrid self-assembly according to this embodiment.

Figure 10:
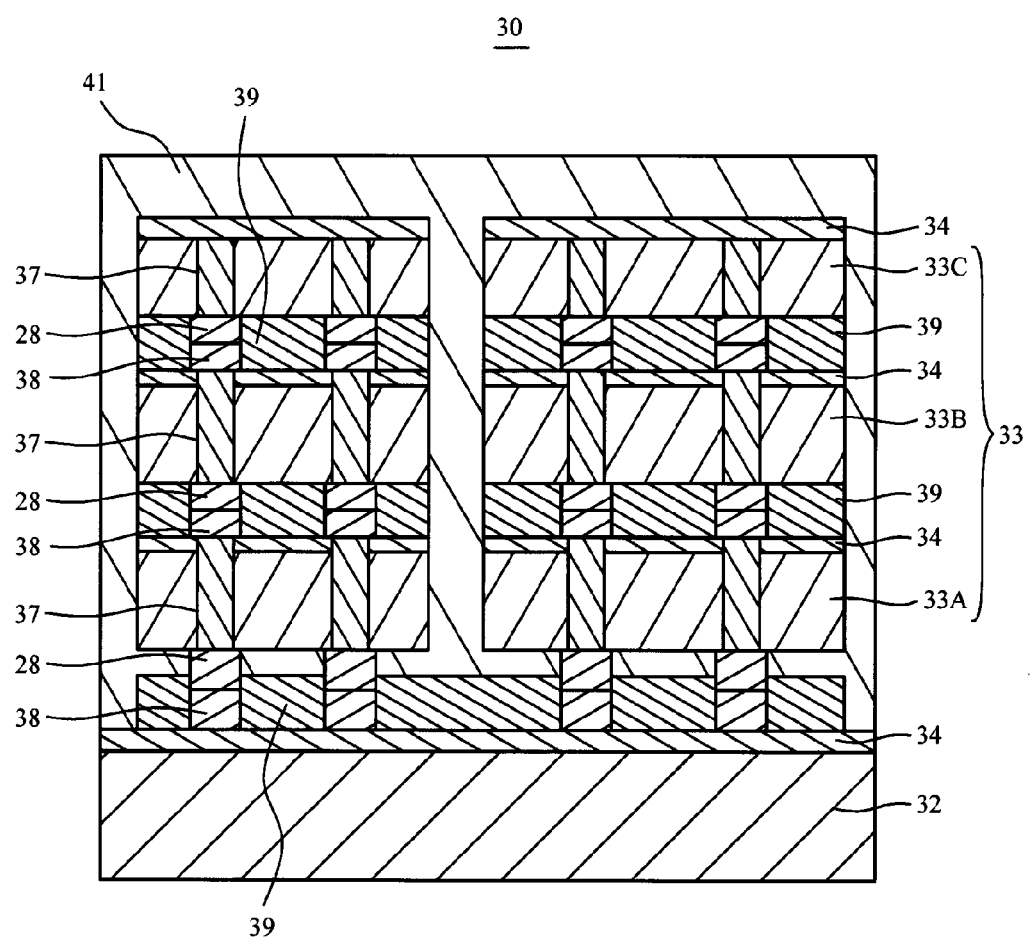
FIG. 10 is a cross sectional view illustrating the structure of another three-dimensional integrated circuit, which is fabricated by using a chip support substrate of this embodiment.

FIG. 10 is a cross sectional view illustrating the structure of an integrated circuit 30 that is integrated three-dimensionally, which is fabricated by using the chip support substrate 42 according to the modification example 1 of this embodiment.

As illustrated in FIG. 10, the integrated circuit 30 that is integrated three-dimensionally has such structure that chips 33A to 33C are laminated three-dimensionally on an Si wafer 32. On the top of each of the chips 33A, 33B and 33C, an element forming region 34 is formed. On the element forming region 34, a transistor or a light emitting element is formed, for example. Micro bumps 38 are disposed via a not-illustrated interlayer insulation film on the element forming region 34. The micro bumps 38 are formed on the lower surfaces of the respective chips 33A, 33B and 33C.

In the integrated circuit 30 that is integrated three-dimensionally, the micro bumps 38, formed on the Si wafer 32, and the micro bumps 38, formed on the lower surfaces of the chips 33A are joined to each other. Thereby, the Si wafer 32 and the chips 33A are connected electrically and mechanically. The chips 33B are laminated on the chips 33A, and the chips 33C are laminated on the chips 33B. TSVs 37 that vertically penetrate the chips 33A, 33B and 33C are formed. The micro bumps 38 that are formed on the upper and lower sides of the chips 33A and 33B are electrically connected via the TSVs 37.

On the semiconductor wafer 32, for example, the integrated circuit or the light emitting element array is formed. The semiconductor wafer 32 may be the Si wafer, for example. In the following explanation, an explanation will be given supposing that the semiconductor wafer 32 is the Si wafer.

Between the plurality of micro bumps 38 formed on the Si wafer 32, a gap filling resin 39 is embedded. Between the plurality of micro bumps 38 formed on the surfaces of the chips 33A that oppose to the chips 33B, the gap filling resin 39 is embedded, and the upper surface side of the chips 33A and the lower surface side of the chips 33B are connected via the micro bumps 38.

Similarly, the gap filling resin 39 is embedded between the plurality of micro bumps 38 formed on the surfaces of the chips 33B that oppose to the chips 33C, and the upper surface side of the chips 33B and the lower surface side of the chips 33C are connected via the micro bumps 38.

The integrated circuit 30 that is integrated three-dimensionally is sealed by a resin mold 41. An integrated circuit is formed on the Si wafer 32.

The Si wafer 32 may be provided with not-illustrated through electrodes and the micro bumps on the lower surface of the Si wafer 32. In this case, the integrated circuit 30 that is integrated three-dimensionally is connected to an external circuit via the micro bumps on the lower surface side of the Si wafer 32.

FIG. 11(a) to FIG. 13(d) are flow diagrams explaining an example of a H (Hybrid) SA-CtW process according to the modification example 1 of this embodiment, and an explanation will be given in due order.

Figure 11A:
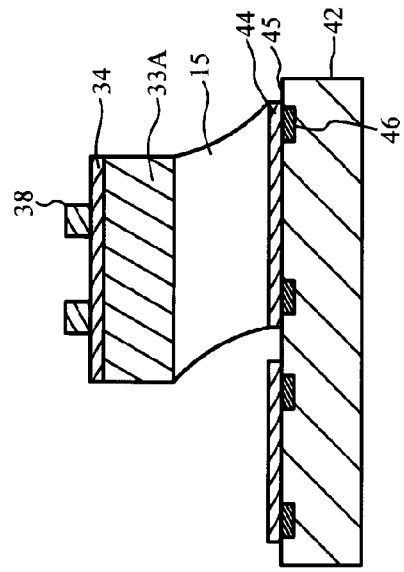
FIG. 11(a) to FIG. 11(d) are flow diagrams explaining an example of a HSA-CtW process according to a modification example 1 of this embodiment.

(A) As illustrated in FIG. 11(a), the KGD chip 33A is first selected directly from the wafer surrounded by the dicing frame. Then, a multi-chip carrier that is provided with the hydrophilic regions and the electrodes for electrostatic absorption, that is, the chip support substrate 42 is placed onto a stage 61 of an assembly device 60 that will be described later. On the upper surface of the chip support substrate 42, hydrophilic regions 44 (lyophilic regions) as bonding regions and a hydrophobic region 45 (a region having a low lyophilic property) are formed. The hydrophilic regions 44 are formed by the insulation film, for example. Electrodes 46 are formed under the insulation film of the hydrophilic regions 44.

Figure 11B:
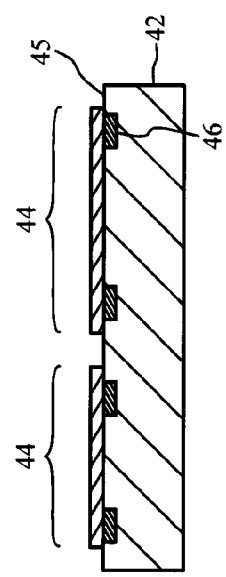

(B) Next, as illustrated in FIG. 11(b), the chip 33A is discharged onto the liquid 15, as the water droplet disposed on the hydrophilic region 44 that is formed on the chip support substrate 42 and that is hydrophilic. The element forming region 34 is formed on the top of the chip 33A, and the micro bumps 38 are formed on the element forming region 34.

Figure 11C:
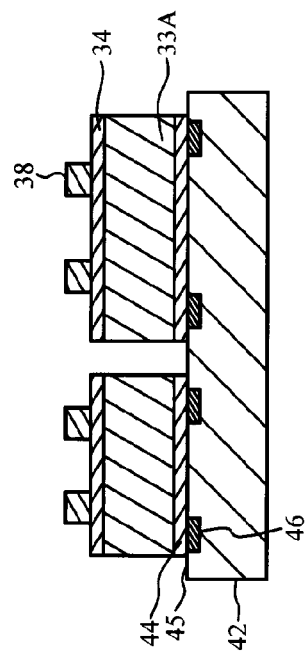

When the above-described processes are repeated, a lot of the chips 33A are disposed continuously and precisely on the chip support substrate 42 in a self-assembling manner, as illustrated in FIG. 11(c).

Figure 11D:
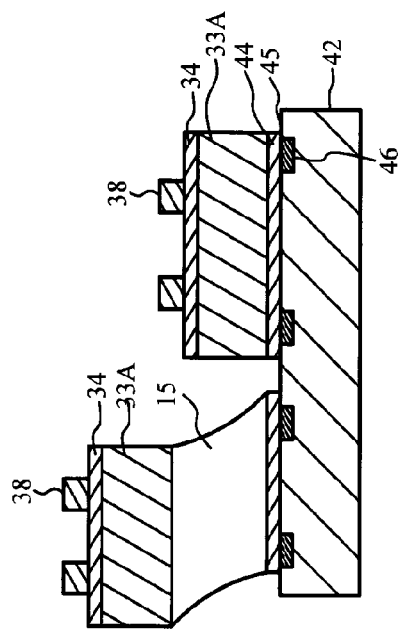

(C) Next, as illustrated in FIG. 11(d), the DC voltage having the high voltage is applied to the electrodes 46. Thereby, the chips 33A are temporarily bonded onto the chip support substrate 42.

Figure 12A:
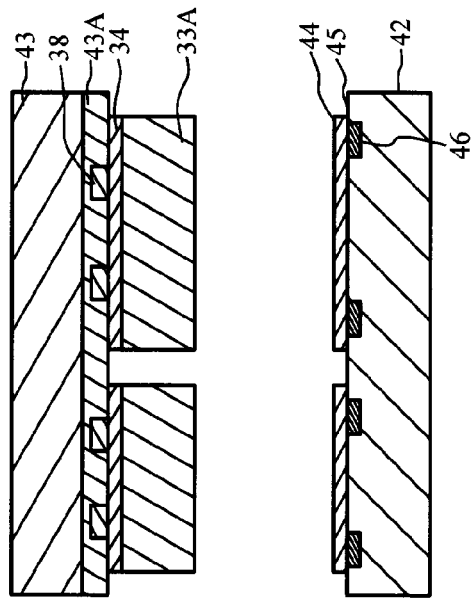
FIG. 12(a) to FIG. 12(d) are flow diagrams explaining the example of the HSA-CtW process according to the modification example 1 of this embodiment.

(D) As illustrated in FIG. 12(a), the chip support substrate 42 that has the chips 33A is aligned and temporarily bonded to a transfer support substrate 43. For example, a wafer bonder is used for the alignment.

An adhesive layer 43A is coated on the transfer support substrate 43 (the lower surface in FIG. 12(a)). Hereinafter, the transfer support substrate 43 that is coated with the adhesive layer 43A is referred to as an adhesive wafer 43.

The heat-resistant adhesive layer 43A that is used in this process is formed by novel material, and is introduced for the first time. This novel adhesive layer 43A for the temporary adhesion can be easily peeled off from the adhesive wafer 43 by using a visible laser. This is the basic technique of this process.

Figure 12B:
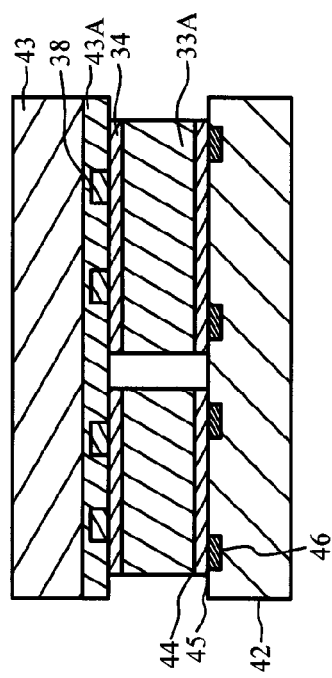

(E) In the HSA-CtW process, as illustrated in FIG. 12(b), a lot of the chips 33A that are temporarily adhered are released from the chip support substrate 42 by electric discharge, and are moved to the adhesive wafer 43. In other words, the chips 33A are transferred. This process is referred to as the first transfer. The chip support substrate 2, as illustrated in FIG. 5(a) to FIG. 7(d), becomes a part of the three-dimensional integrated circuit, but the chip support substrate 42 does not become the wafer of the integrated circuit 30 that is integrated three-dimensionally. The chip support substrate 42 can be reused after the first transfer.

Further, the subsequent processes will be explained.

Figure 12C:
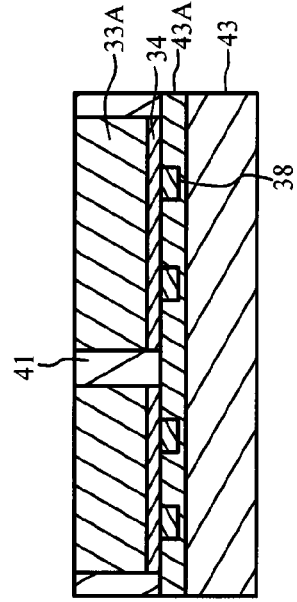

(F) As illustrated in FIG. 12(c), the resin mold 41 is formed on the adhesive wafer 43 to cover the chips 33A. In FIG. 12(c), the formation of the resin mold 41 may not be made, and may be made after laminating the chips 33A to 33C. In this case, the hydrophobic region is not formed.

(G) Thinning Process of Multi-Chips

Figure 12D:
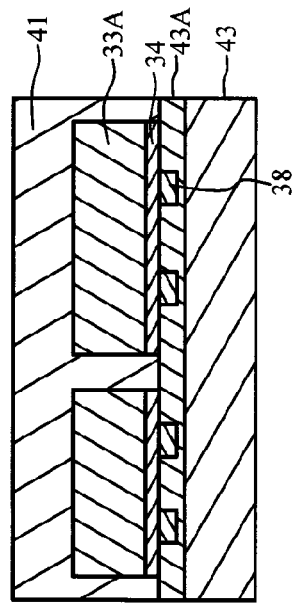

In this process, as illustrated in FIG. 12(d), the plurality of chips (multi-chips) 33A are thinned as required, in order to adjust the thickness of the three-dimensional integrated circuit. The multi-chips 33A are thinned by subjecting the back surfaces of the chips 33A, where the element forming regions 34 are not formed (the upper surfaces in FIG. 12(d)), to grinding or CMP (Chemical Mechanical Polishing). The element forming regions 34 of the chips 33A are protected by the adhesive wafer 43. The upper surfaces of the chips 33A are exposed at the resin mold 41.

(H) Formation Process of the TSVs 37 and the Micro Bumps 38

Figure 13A:
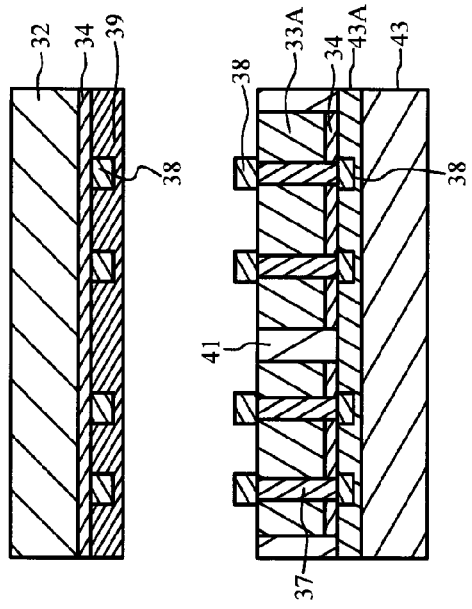
FIG. 13(a) to FIG. 13(d) are flow diagrams explaining the example of the HSA-CtW process according to the modification example 1 of this embodiment.

As illustrated in FIG. 13(a), the TSVs 37 that vertically penetrate the chips 33A are formed. The micro bumps 38 are formed on the upper surfaces of the chips 33A.

(I) Second Multi-Chip Transfer Process from the Adhesive Wafer 43 to the Semiconductor Wafer 32

Figure 13C:
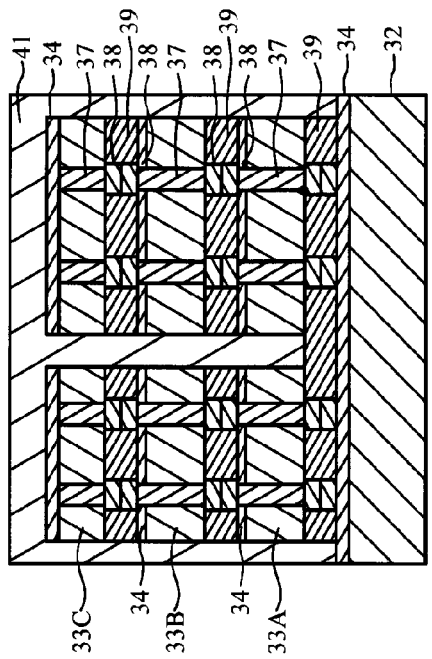
Figure 13B:
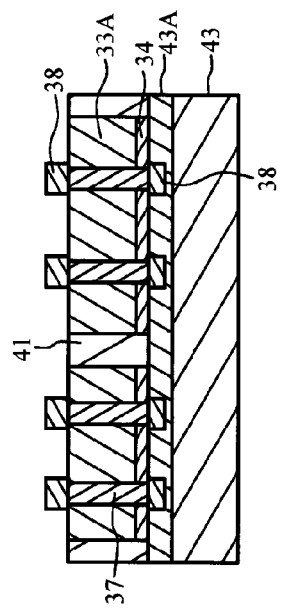

As illustrated in FIG. 13(b), the chips 33A are moved from the adhesive wafer 43 to the semiconductor wafer 32, by using the wafer bonder, for example. The element forming region 34 is formed on the top of the semiconductor wafer 32 (the lower side in FIG. 13(b)). The micro bumps 38 are formed on the element forming region 34. In this process, the micro bumps 38 of the semiconductor wafer 32 and the micro bumps 38 of the chips 33A are subjected to thermocompression, by a wafer joining device for the thermocompression. A thermocompression process has such a thermal process that a stage of a bonding device for the thermocompression is heated from, for example, 50° C. to 250° C., and then cooled to 50° C. For example, a target LSI, a light emitting element array or the like is mounted on the semiconductor wafer 32. The gap filling resin 39 is embedded between the plurality of micro bumps 38 of the semiconductor wafer 32. This gap filling resin 39 is formed by the epoxy resin or the like. The gap filling resin 39 is also referred to as a non-conductive film (referred to as an NCF). An explanation will be given supposing that the semiconductor of the semiconductor wafer 32 is Si.

(J) Peeling Process of the Chips 33A from the Adhesive Wafer 43

After the micro bumps 38 of the Si wafer 32, on which the target LSI is mounted, and the micro bumps 38 of the chips 33A are subjected to the thermocompression, the chips 33A are peeled off from the adhesive wafer 43, by using vacuum absorption force of the wafer joining device, as illustrated in FIG. 13(c). The adhesive wafer that is peeled off after the micro bumps 38 of the chips 33A are subjected to the thermocompression to the Si wafer 32, on which the target LSI is mounted, can be reused. As the adhesive layer 43A can be easily peeled off from the adhesive wafer 43 by using the visible laser, the substrate of the adhesive wafer 43, on which the adhesive layer 43A is placed, can be used repeatedly. Namely, after the used adhesive layer 43A is peeled off from the adhesive wafer 43, a new adhesive layer 43A is formed on the substrate by spin coating or the like, so that the substrate can be used again. The adhesive layer 43A may be peeled off not only by the visible laser, but also by heating, peeling processing by solvent, light, an ultraviolet laser, or a combination thereof (K) Repeated Lamination of the Chips 33

Figure 13D:
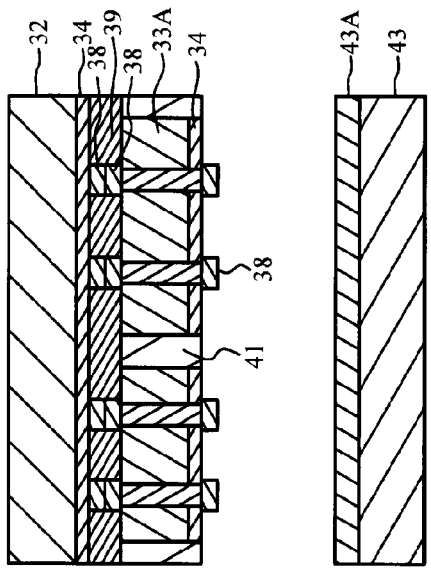

When the above-described processes are repeated, the thin chips 33A to 33C, having the plurality of TSVs 37, can be laminated on the semiconductor wafer 32, as illustrated in FIG. 13(d).

According to the chip-wafer 3D integration (HSA-CtW) based on the hybrid self-assembly in the fabrication method of the three-dimensional integrated circuit of this embodiment and the modification example 1, the self-assembling absorption of the chips 3A to 3C or 33A to 33C, driven by the surface tension of the liquids 15, and the temporary bonding technique of the plurality of chips 3A to 3C or 33A to 33C by the electrostatic absorption are combined. The temporary bonding technique of the plurality of chips 3A to 3C or 33A to 33C by the electrostatic absorption allows direct bonding of the chips that are absorbed in a self-assembling manner, without causing any stress.

When the chips are absorbed in a self-assembling manner, bonded temporarily after the electrostatic absorption, and transferred onto the target semiconductor wafer 32, as will be described later, registration accuracy is as high as about 1 μm, lateral displacement is not caused at the time of the transfer, and high registration accuracy can be secured. In addition, with the three-dimensional integrated circuit 30 that uses the micro bumps 38 formed by Cu/SnAg and the through electrodes 11 and 17 using Cu, it is possible to obtain excellent electric characteristics.

According to the fabrication method of the three-dimensional integrated circuit of this embodiment and the modification example 1, it is possible to increase production throughput, without using the expensive multi-chip pickup tool of the comparative example 2. Thereby, chip assembly of 10,000 chips/hour can be realized.

According to the integrated circuit 1 or 30 that is integrated three-dimensionally of this embodiment and the modification example 1, the lamination of the chips 3A to 3C or 33A to 33C to the chip support substrate 2 or the semiconductor wafer 32 can be made with excellent position accuracy. In addition, the fabrication is performed with high throughput and low cost.

(Assembly Device)

Next, an explanation will be given to the assembly device 60 that can be used for fabricating the three-dimensional integrated circuit 1 as illustrated in FIG. 4 and the three-dimensional integrated circuit 30 as illustrated in FIG. 10. The assembly device 60 can also be used for the modification examples that will be described later.

Figure 14:
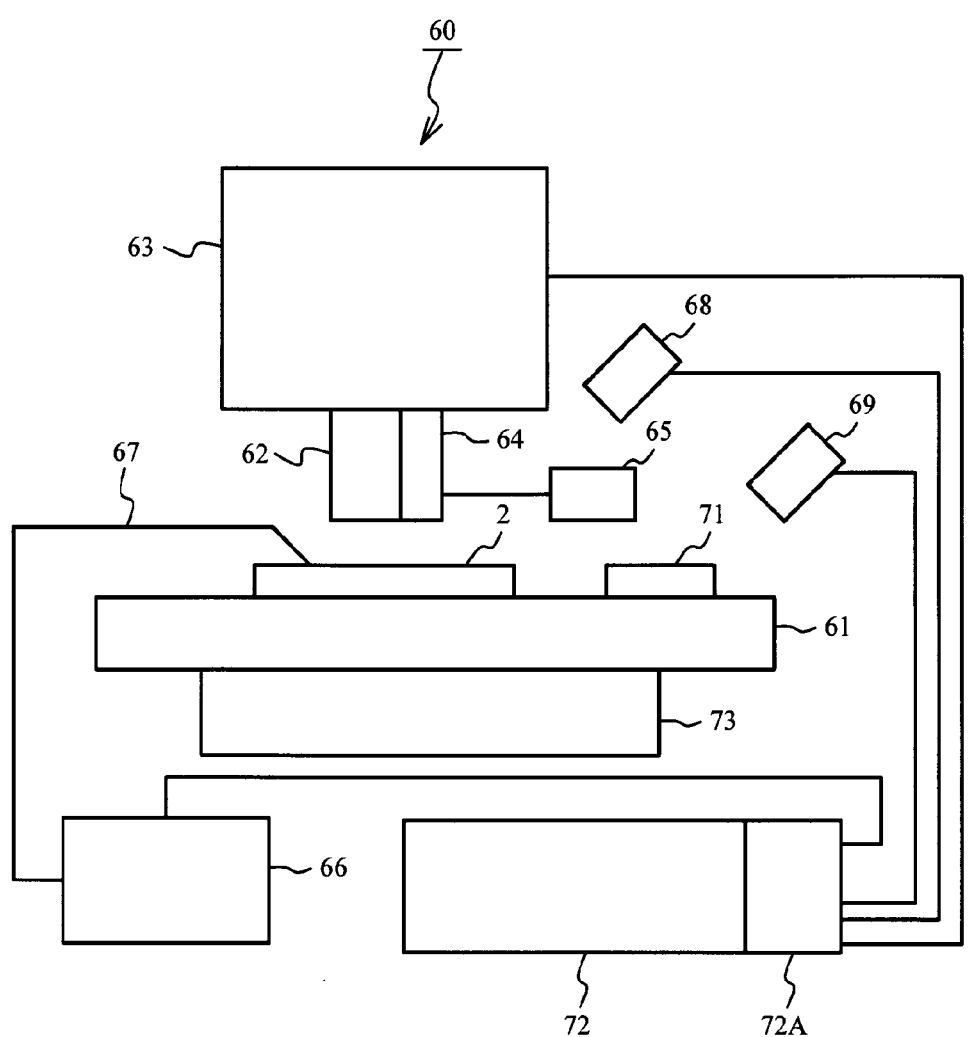
FIG. 14 is a block diagram illustrating the structure of an assembly device used for hybrid assembly in which self-assembling absorption and the electrostatic absorption are made.

FIG. 14 is a block diagram illustrating the structure of the assembly device 60 used for hybrid assembly in which the self-assembling absorption and the electrostatic absorption are made.

As illustrated in FIG. 14, the assembly device 60 is formed by including the stage 61, on which the chip support substrate 2 or 42 is placed, a carrier robot 63 that is provided with a pickup tool 62 of the chips 3A to 3C or 33A to 33C, a high-precision droplet discharge unit 64, a droplet supply unit 65, a power source for electrostatic absorption 66, a probe 67 that supplies the power source for electrostatic absorption 66 to the substrate, an image pickup unit that is formed by a first camera 68 and a second camera 69 and that carries out an observation of the chip support substrate and the chips, a chip storage tray 71, a control unit 72, and the like. The stage 61 may be further provided with an inclination correction mechanism 73. The assembly device 60 can be used for fabricating the three-dimensional integrated circuit 1 as illustrated in FIG. 4, and the three-dimensional integrated circuit 30 as illustrated in FIG. 10.

A needle of the probe 67 that is connected to the power source for electrostatic absorption 66 is brought into contact with the electrostatic absorption electrodes 6 or 46 that are formed on the interposer substrate 2 or the chip support substrate 42, so as to apply the power source for electrostatic absorption 66. A plurality of the probes 67 may be provided corresponding to the anode 6A and the cathode 6B.

The carrier robot 63 carries the hydrophilic droplets and the chips 33 to the substrate. The carrier robot 63 is provided with the high-precision droplet discharge unit 64 that supplies the hydrophilic droplets to the substrate, and the pickup tool 62 of the chips 33. The carrier robot 63 is the so-called industrial robot, which may be an X-Y robot that performs two-dimensional carrying, or a SCARA robot. An explanation will be given supposing that the carrier robot 63 is the SCARA robot.

The high-precision droplet discharge unit 64 is connected to the droplet supply unit 65, and the control unit 72 controls the amount of the droplets and discharge time during when the droplets are discharged.

The pickup tool 62 of the SCARA robot 63 is provided with a chuck for absorbing the chips 3A to 3C or 33A to 33C, and its position is monitored by the first and the second high-resolution cameras 68 and 69. The chuck for absorbing the chips 3A to 3C or 33A to 33C is, for example, a vacuum chuck. The first and the second cameras 68 and 69 are the so-called high-resolution cameras.

The position of the pickup tool 62 of the SCARA robot 63 is first controlled by being monitored by the first camera 68 that is disposed on the top of the stage 61, so as to discharge a droplet, formed by pure water, for example, to the predetermined position on the chip support substrate 2 or the chip support substrate 42.

Next, the position of the pickup tool 62 of the SCARA robot 63 is controlled by being monitored by the second camera 69 that is disposed under the first high-resolution camera 68, and controlled to move to the chip storage tray 71, so as to absorb the chips 3A to 3C or 33A to 33C in the chip storage tray 71 by the vacuum chuck. The vacuum-absorbed chips 3A to 3C or 33A to 33C, whose position is controlled by being monitored by the first camera 68, are carried to the predetermined positions on the chip support substrate 2 or the chip support substrate 42 and, by stopping the vacuum absorption, temporarily adhered to the positions where the droplets are dropped on the chip support substrate 2 or the chip support substrate 42.

Next, the direct current voltage is applied to the electrodes for electrostatic absorption 6 or 46 on the chip support substrate 2 or the chip support substrate 42, and the chips 3A to 3C or 33A to 33C are absorbed electrostatically to the chip support substrate 2 or the chip support substrate 42.

The control unit 72 controls the operation of the above-described hybrid self-assembling assembly device 60. The control unit 72 is configured to include a computer, a display device, a memory device and the like that are not illustrated. The computer controls the SCARA robot 63, the high-precision droplet discharge unit 64, the droplet supply unit 65, the power source for electrostatic absorption 66, the first and the second cameras 68 and 69 and the like via an interface circuit 72A.

(Structure of the Chip Support Substrate)

The chip support substrate 42 can be made by using a standard lithography method, a CVD (Chemical Vapor Deposition) method, a RIE method or the like onto the substrate 42A as the Si wafer.

Figure 15:
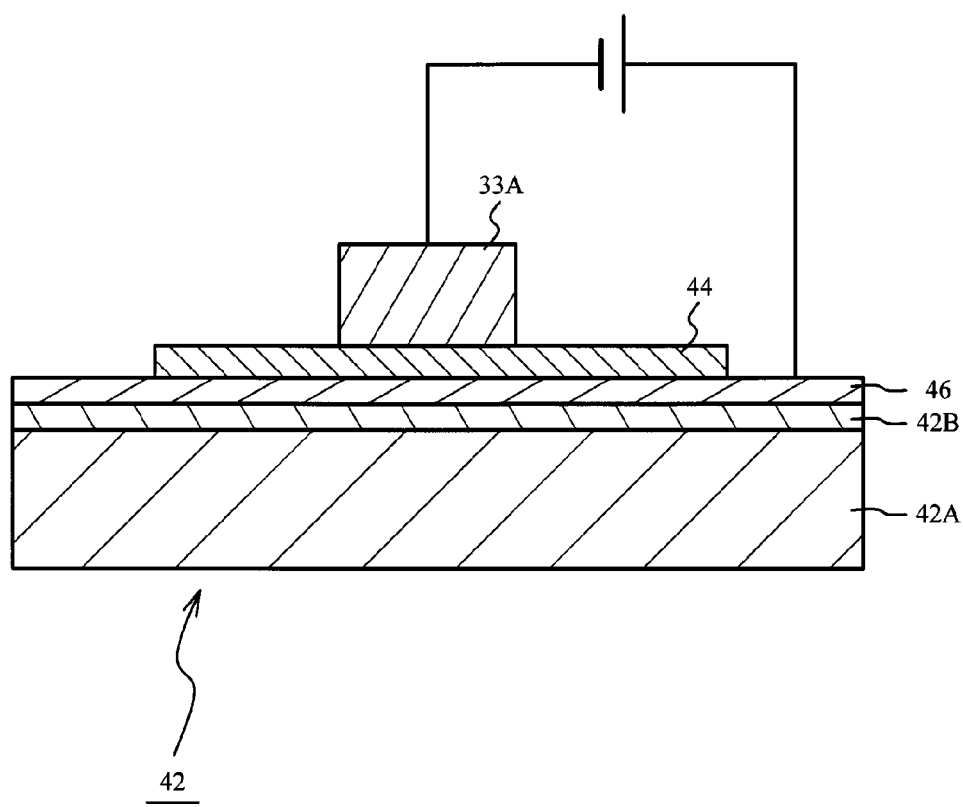
FIG. 15 is a cross sectional view illustrating an example of the structure of the chip support substrate.

FIG. 15 is a cross sectional view illustrating an example of the structure of the chip support substrate 42. As illustrated in FIG. 15, the chip support substrate 42 is provided with the hydrophilic region 44 as the bonding region where the chip 33A can be absorbed in a self-assembling manner, and the electrode 46 for the electrostatic absorption. The direct current voltage for the electrostatic absorption is applied to the electrode 46 and the chip 33A itself to be absorbed. The electrode like this is referred to as a unipolar electrode. With the unipolar electrode 46, the electrostatic force applied to the chip 33A can be provided by the following expression (2).

[Expression 2]

$$F_{up} = \frac{(\varepsilon_0 \varepsilon_r A V^2)}{2d^2} \quad (2)$$

Where, $F_{up}$ is the absorption force generated in the electrostatic bonding when the unipolar electrode 46 is used, A is an area of the electrode 46, d is a distance between the electrode 46 and the chip 33A, $\varepsilon_r$ is the relative permittivity, $\varepsilon_0$ is the permittivity in vacuum, and V is the applied voltage. Therefore, the electrostatic absorption force increases as a surface voltage increases.

(Fabrication Example of the Chip Support Substrate Having the Unipolar Electrode)

(1) First, a thermal oxide film 42B having the thickness of 100 nm is formed on a boron-doped p-type Si substrate 42A having the resistivity of 10 to 15Ω-cm.

(2) An Al/W film is deposited on the thermal oxide film 42B by a sputtering method.

(3) The Al/W film is patterned by the lithography method. The electrode 46 is formed by the Al/W film.

(4) A plasma TEOS (Tetraethyl orthosilicate) oxide film having the thickness of 6 μm is deposited. Thereafter, the TEOS oxide film is etched to form the hydrophilic region 44.

According to the HSA-CtW process as illustrated from FIG. 11(a) to FIG. 13(d), throughput of 0.3 seconds/chip (about 12,000 chips/hour) can be achieved for assembly performance by the picking and the absorption, for example.

Here, pure water of 2.5 μl (microliter, $10^{-6}$ liters) was used in order to precisely assemble the chip 33A of 10 mm square on the hydrophilic region 44 that is formed on the chip support substrate 42 as an 8-inch Si substrate and that is hydrophilic. The surrounding region was highly hydrophobic, and a contact angle of water was 115 degrees. Hereinafter, this embodiment will be explained in more detail with an example.

EXAMPLE

The assembly device 60 in FIG. 14 was used to perform the HSA-CtW process, by the processes illustrated in FIG.

11(a) to FIG. 13(d). The three-dimensional integrated circuit is made by the fabrication method as illustrated in FIG. 11(a) to FIG. 13(d), unless otherwise mentioned. The bipolar electrodes 46 were used for the chip support substrate 42. The main components used in the assembly device 60 are as follows:

SCARA robot 63: YK600X manufactured by Yamaha Corporation;

High-precision droplet discharge unit 64, droplet supply unit 65: AD3000CLLL manufactured by Iwashita Engineering, Inc.;

Power source for electrostatic absorption 66: HECA-3B10X2LPo manufactured by Matsusada Precision Inc.;

Probe 67: 708fT-008 manufactured by Micronics Japan Co., Ltd.;

Inclination correction mechanism 73: Automatic levelling stand (Auto Stage AS-21) manufactured by Sakamoto Electric MFG Co., Ltd.; and First camera 68 and second camera 69: Camera CV-200M and CV-5500 controller manufactured by Keyence Corporation.

(Formation of the TSV)

The side wall of the through hole was coated with an $SiO_2$ film. TiN and copper (Cu) to be a barrier layer were coated on the formed $SiO_2$ film by the sputtering method.

Next, a Cu plug was formed in the through hole by Cu plating, and the micro bump 38, formed by Cu and Ag/Sn, was formed on the surface of the chip 33A after the self-assembly. The micro bump 38 was formed by the processes of Cu plating, Ag/Sn vapor-deposition and the like.

Figure 16:
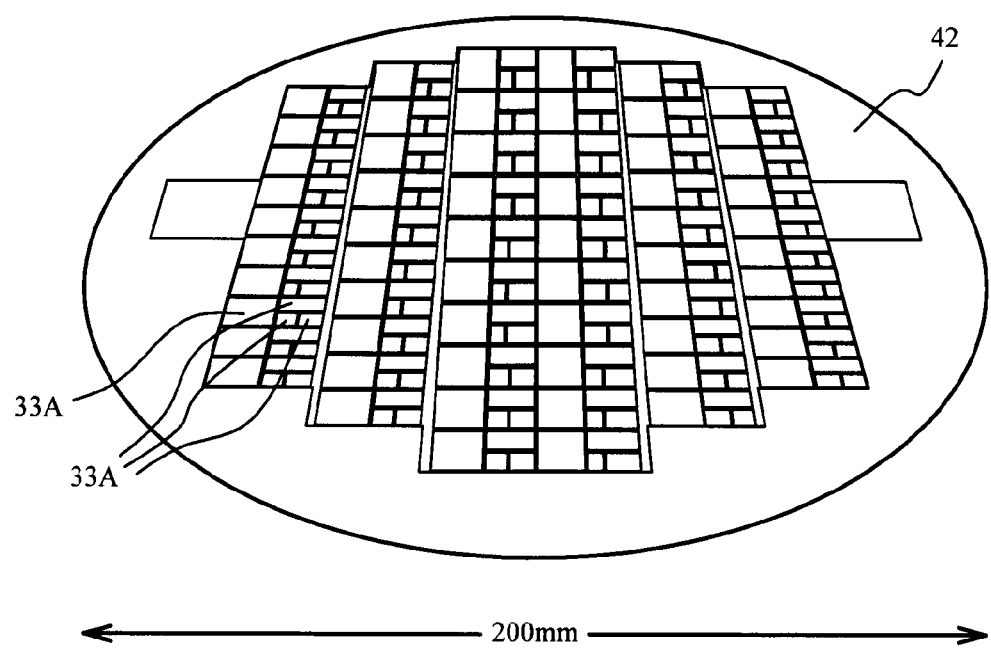
FIG. 16 is a view schematically illustrating an optical image of chips that are bonded by the assembly device.

FIG. 16 is a view schematically illustrating an optical image of the chips 33A that were bonded by the assembly device 60. It is found out that, as illustrated in FIG. 16, four types of the chips 33A, each having the thickness of 140 μm and the size of 3 mm square, 5 mm square, 4 mm×9 mm square, and 10 mm square, are continuously and precisely assembled, in a self-assembling manner, on the 8-inch Si substrate as the chip support substrate 42.

Figure 17A:
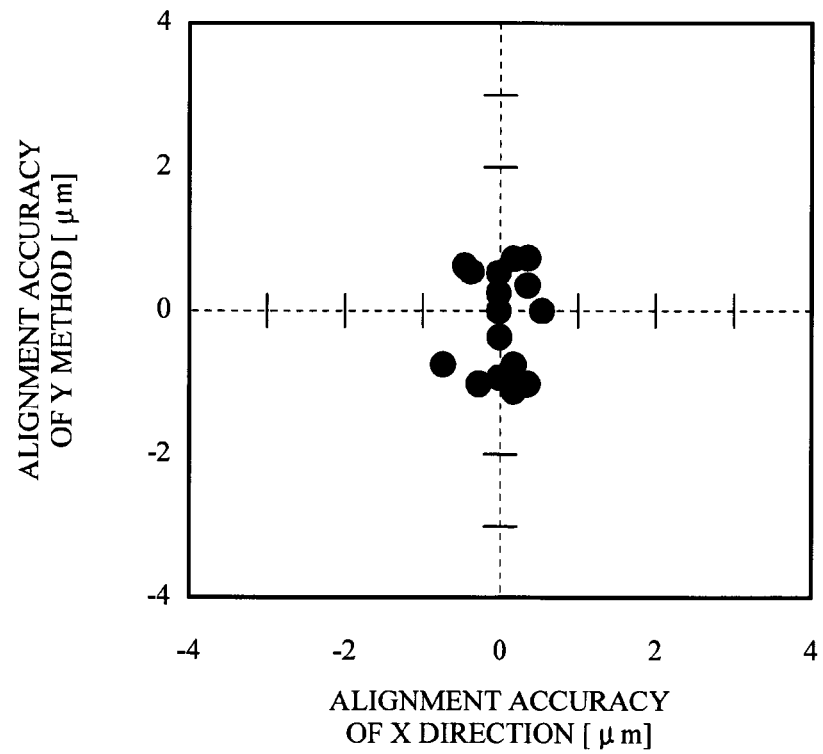
FIG. 17(a) and FIG. 17(b) are views illustrating alignment accuracy of the chips, in which this embodiment is illustrated in FIG. 17(a) and the comparative example is illustrated in FIG. 17(b)
Figure 17B:
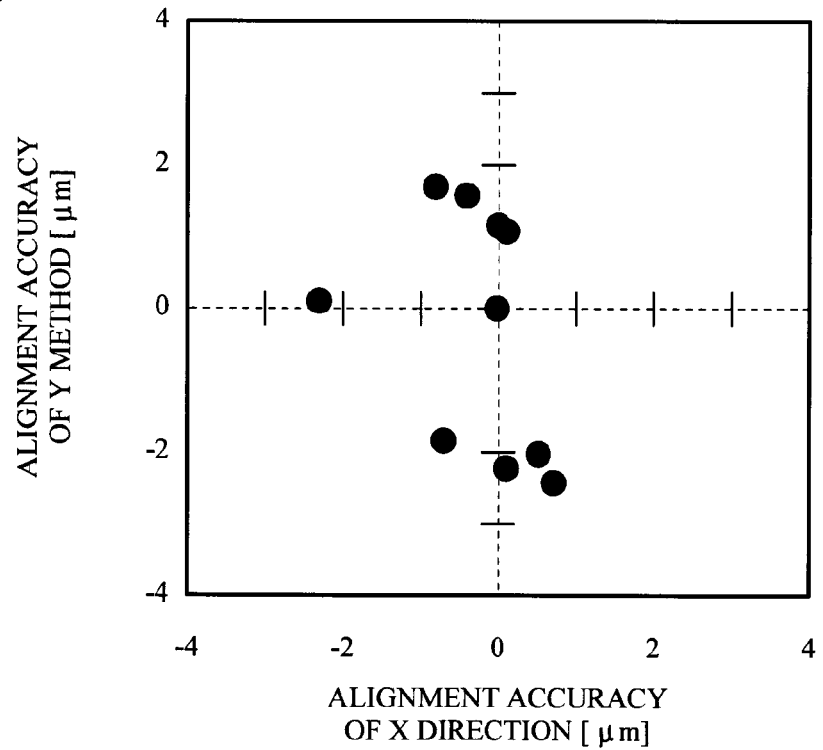

FIG. 17(a) and FIG. 17(b) are views illustrating the alignment accuracy of the chips, in which this example is illustrated in FIG. 17(a) and the comparative example 2 is illustrated in FIG. 17(b). As illustrated in FIG. 17(a), it is found out that the alignment accuracy of the chips 33A is within 1 μm according to this example. Further, as illustrated in FIG. 17(b), it is found out that the alignment accuracy of the chips has variation of ±3 μm, according to the comparative example 2 in which the electrostatic absorption is not performed. According to the example, the chip 33A is absorbed electrostatically to the chip support substrate 42, so as to fix the chip during the chip transfer process or the like. For this reason, it is possible to improve the alignment accuracy as compared with the comparative example 2.

(Temporary Bonding Technique of the Electrostatic Multi-Chip)

Figure 18:
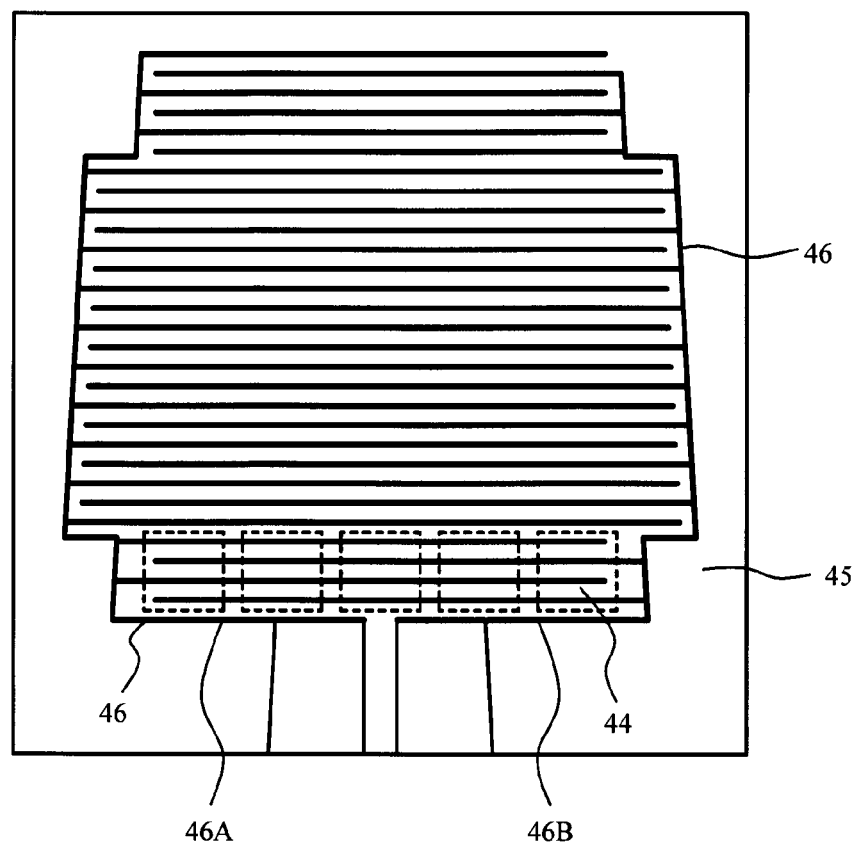
FIG. 18 is a view schematically illustrating an optical image of the chip support substrate.

FIG. 18 is a view schematically illustrating an optical image of the chip support substrate 42. The hydrophilic regions 44 are formed over the region where the electrodes 46 are formed, and in FIG. 18, a part of the hydrophilic regions 44 is illustrated by broken lines. As illustrated in FIG. 18, the chip support substrate 42 is formed by the interdigital electrodes 46 that are formed by Al/W, the hydrophilic regions 44 that are hydrophilic and are formed by the oxide film, and the surrounding hydrophobic region 45 that has the hydrophobic fluorocarbon formed thereon. In the hydrophilic regions 44, the anode 46A and the cathode 46B are formed.

After the self-assembly of the chips, the DC high voltage of 100 V or 200 V is applied between two electrode pads connected to the anode 46A and the cathode 46B formed by Al/W. The direct current voltage generates the electrostatic absorption force. The electrostatic absorption force can be provided by the electrostatic force expressed by the above-described expression (1).

Figure 19A:
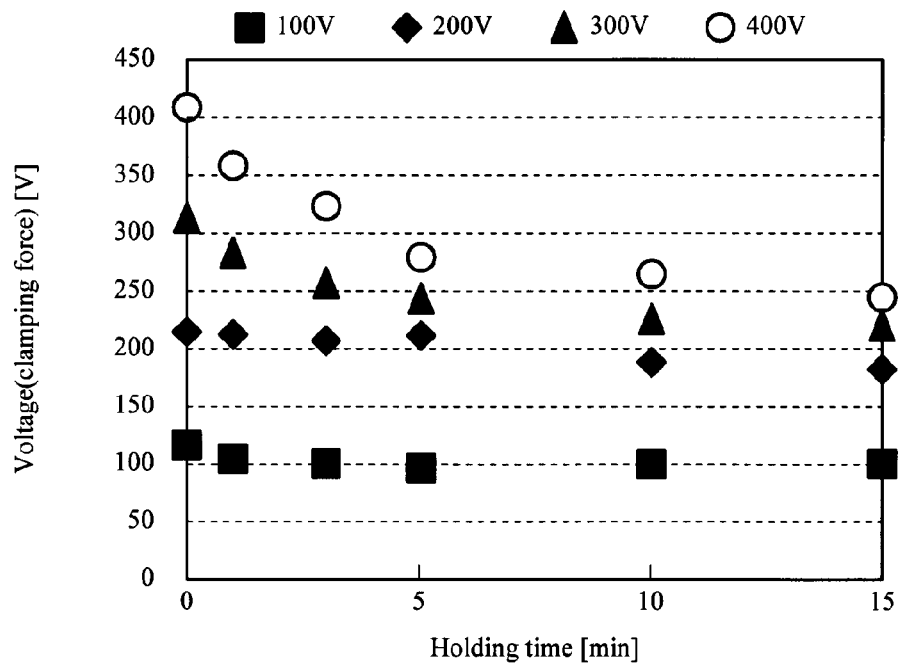
Figure 19B:
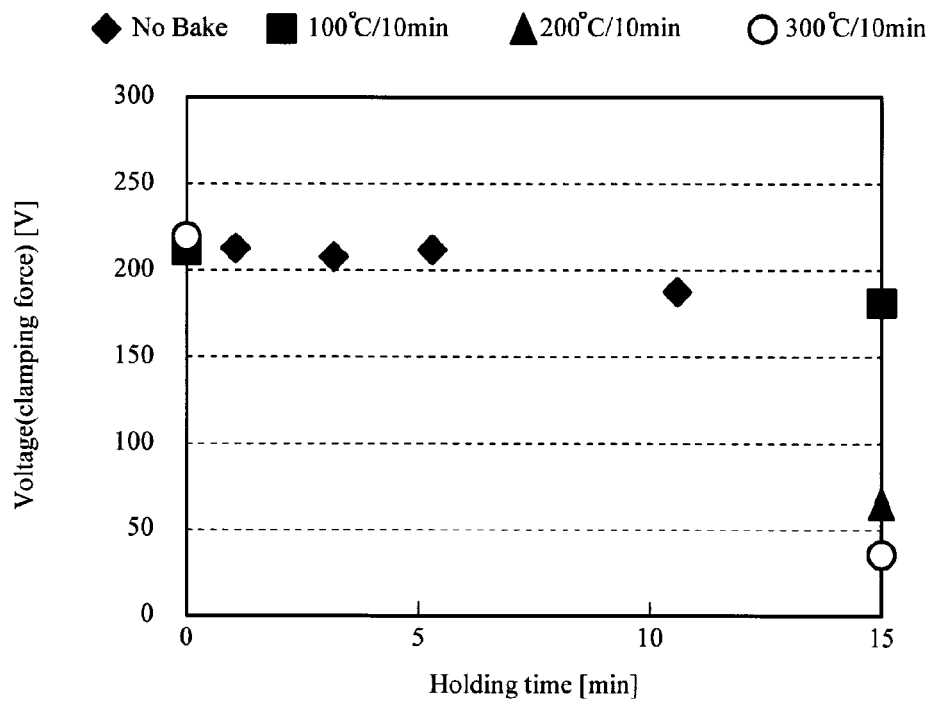

FIG. 19(a) and FIG. 19(b) are views studying influences of parameters on the electrostatic absorption force. FIG. 19(a) illustrates the influences of the applied voltage, as the direct current voltage applied across the anode 64A and the cathode 64B, on the electrostatic absorption force. FIG. 19(b) illustrates the influences of anneal temperature, after the application of the voltage, on the electrostatic absorption force. The horizontal axis in each of FIG. 19(a) and FIG. 19(b) represents holding time (minute) after the voltage is applied across the anode 64A and the cathode 64B, and the vertical axis represents the voltage across the anode 46A and the cathode 46B. The voltage corresponds to the electrostatic absorption force. The applied voltage in FIG. 19(a) is 100 V, 200 V, 300 V, or 400 V. The anneal temperature in FIG. 19(b) is 100° C., 200° C. or 300° C., and anneal time is 10 minutes. The applied voltage is 200 V. Data without the annealing (without baking) is also illustrated for the purpose of comparison.

When the applied voltage is 100 V and 200 V, it is found out that the electrostatic absorption force is held until 15 minutes, as illustrated in FIG. 19(a). As illustrated in FIG. 19(b), it is found out that, after the electrostatic temporary bonding, no influence is exerted on the electrostatic absorption force even at the anneal temperature of 100° C.

(Electrostatic Absorption by the Unipolar Electrodes)

The electrostatic absorption is also possible by using the unipolar electrodes.

Figure 20A:
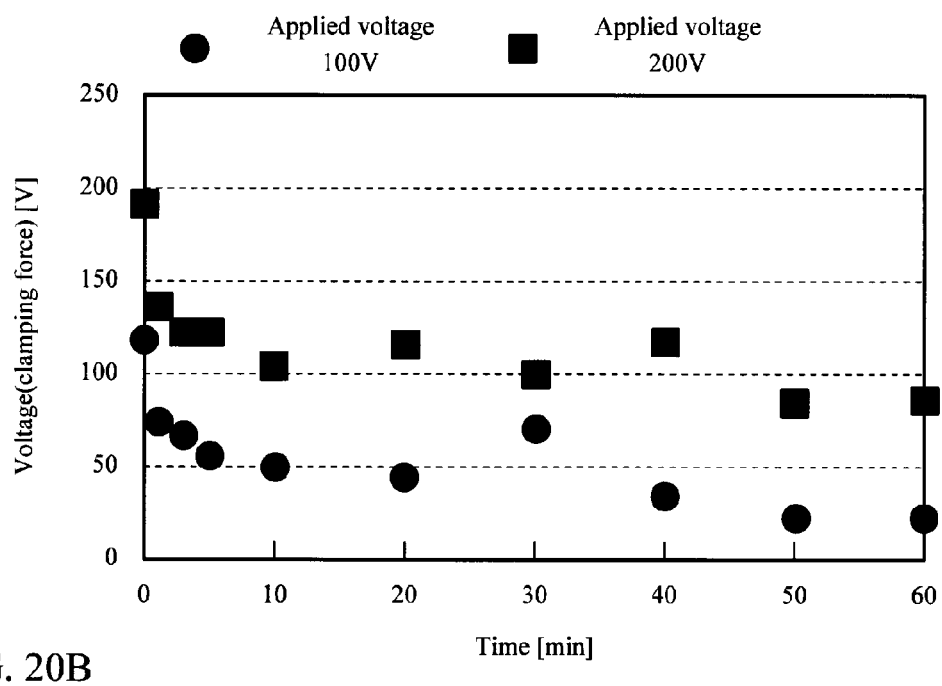
Figure 20B:
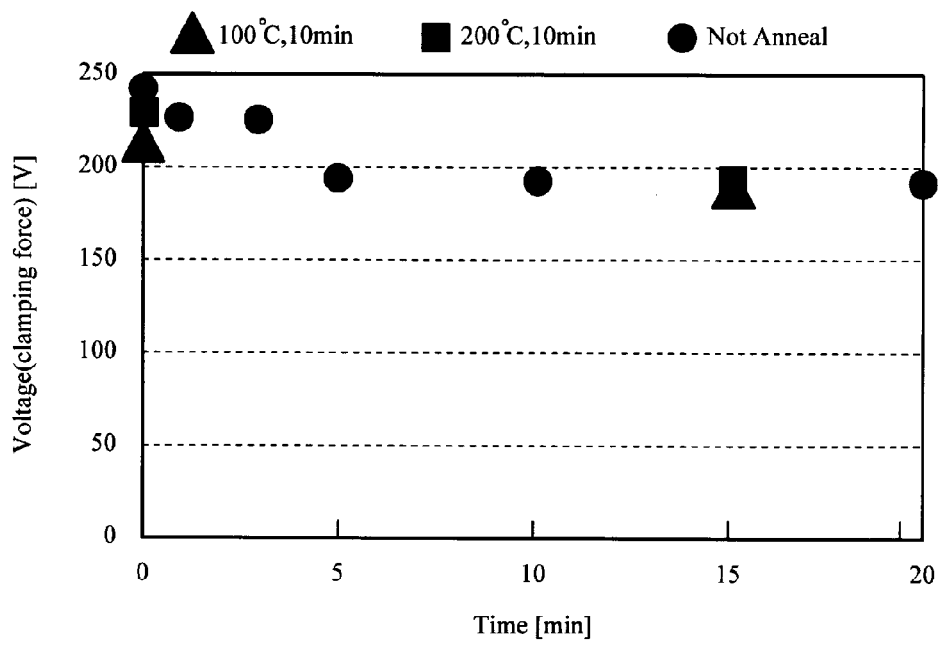

FIG. 20(a) and FIG. 20(b) are views studying influences of the parameters on the electrostatic absorption force of the unipolar electrodes 46. FIG. 20(a) illustrates the influences of the applied voltage, and FIG. 20(b) illustrates the influences of the temperature. The horizontal axis in each of FIG. 20(a) and FIG. 20(b) represents the holding time (minute), and the vertical axis represents the voltage.

It is found out that, when the applied voltage is 100 V and 200 V, the electrostatic absorption force is reduced until 10 minutes but is held after 10 minutes, as illustrated in FIG. 20(a). In this case, the thermal oxide film 42B formed on the substrate 42A is not in contact with a p-TEOS oxide film. As illustrated in FIG. 20(b), it is found out that, after the electrostatic temporary bonding, no influence is exerted on the electrostatic absorption force even at the anneal temperature of 100° C. In this case, the thermal oxide film 42B formed on the substrate 42A is in contact with the p-TEOS oxide film (the hydrophilic region 44).

Characteristics of a MOSFET (Metal Oxide Semiconductor Field Effect Transistor) were measured after the application of the high voltage to the chip support substrate 42 having the interdigital electrodes 46, as illustrated in FIG. 18.

Figure 21A:
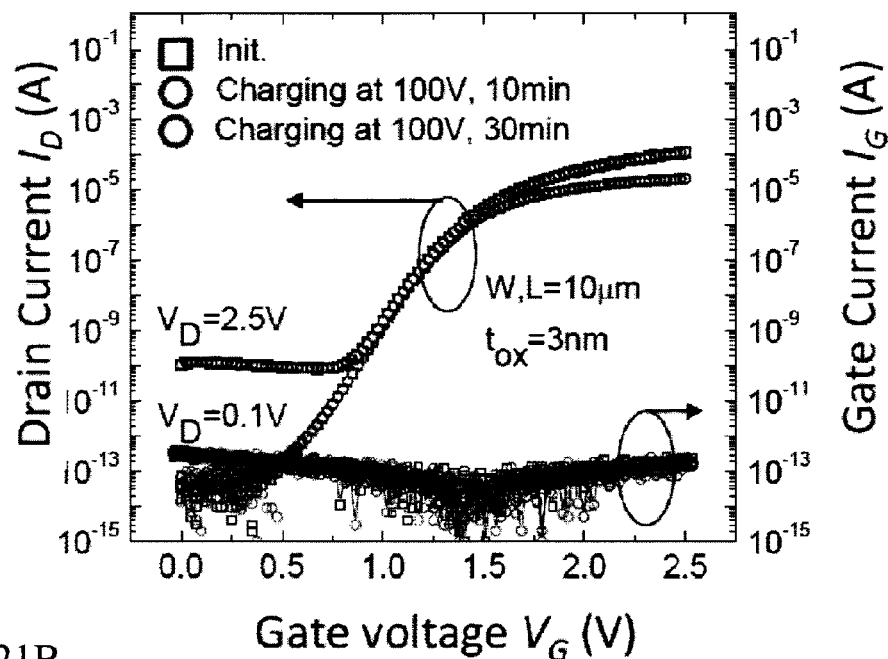
Figure 21B:
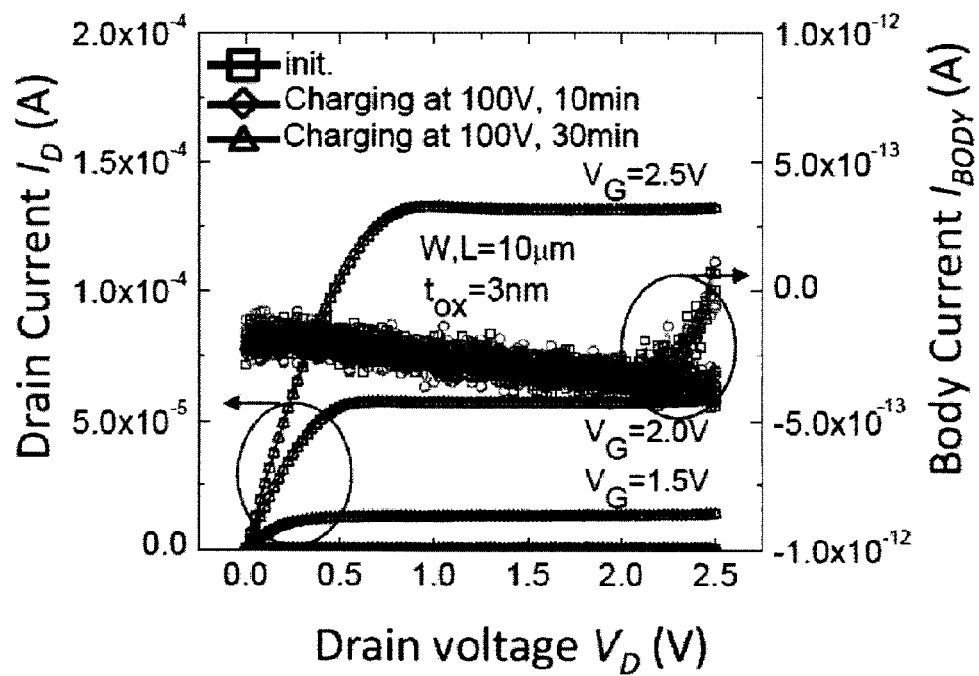

FIG. 21(a) and FIG. 21(b) are views illustrating the characteristics of the MOSFET. Both of the gate length and the gate width of the MOSFET are 10 μm. The film thickness of a gate oxide film is 3 nm FIG. 21(a) and FIG. 21(b) illustrate the characteristics of the case before the voltage is applied to the electrodes 46, the case after the voltage of 100 V is applied to the electrodes 46 for 10 minutes, and the case after the voltage of 100 V is applied to the electrodes 46 for 30 minutes. FIG. 21(a) illustrates drain current-gate voltage ($I_D$-$V_G$) characteristics and gate current-gate voltage ($I_G$-

$V_G$) characteristics when the drain voltage is 1.0 V and 2.5 V. FIG. 21(b) illustrates drain current-drain voltage ($I_D$-$V_D$) characteristics and body current-drain voltage characteristics when the gate voltage is 1.5 V, 2.0 V and 2.5 V.

As illustrated in FIG. 21(a) and FIG. 21(b), all the characteristics are in agreement with each other in the case before the application of the voltage, and the cases after the application of the voltage for 10 minutes and 30 minutes. Thus, it is found out that a threshold voltage of the MOSFET, a gate leakage current, output characteristics and a substrate current are not affected by the DC voltage applied to the electrodes 46.

Figure 22A:
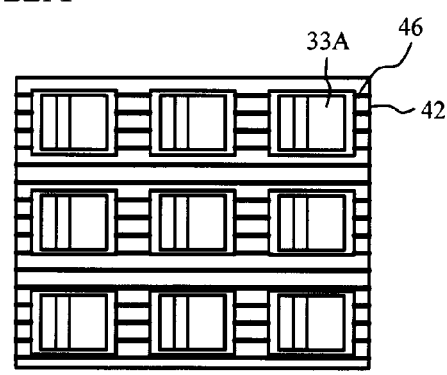
Figure 22B:
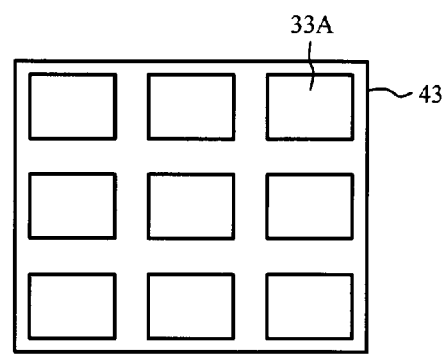
Figure 22C:
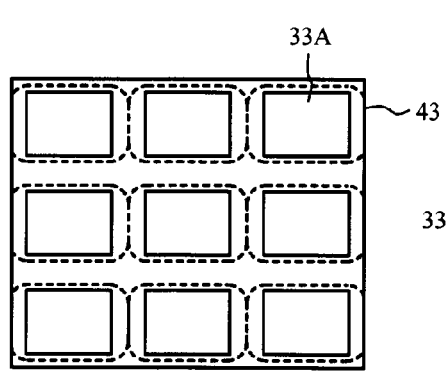
Figure 22D:
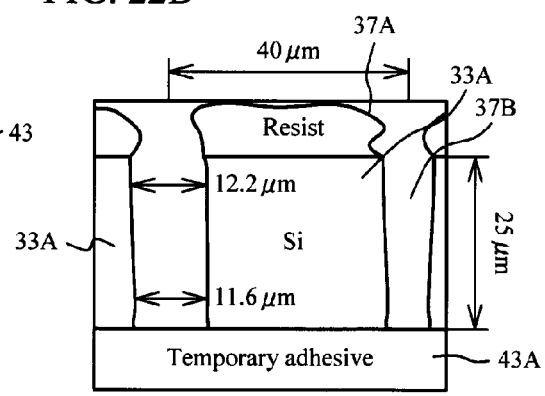

FIG. 22(a) to FIG. 22(d) are views illustrating the self-assembly chips 33A after the electrostatic temporary bonding. FIG. 22(a) is a view illustrating the surface of the chip support substrate 42 after the electrostatic temporary bonding, FIG. 22(b) is a view illustrating the surface of the adhesive wafer 43 after the chips 33A are transferred from the chip support substrate 42 to the adhesive wafer 43, FIG. 22(c) is a view illustrating the surface of the adhesive wafer 43 after the multi-chip thinning, by which the thickness is reduced from 140 μm to 25 μm, and FIG. 22(d) is a view schematically illustrating an SEM (Scanning Electron Microscope) image of the cross section in which Si vias 37B (through holes penetrating the chip 33A) are formed, by using a Bosch process, in the chip 33A after the self-assembly.

It is found out that, as illustrated in FIG. 22(a) and FIG. 22(b), the chips 33A, subjected to the self-assembly by the electric discharge, are transferred to the adhesive wafer 43 on which the adhesive layer 43A that has the thickness of 15 μm and that is thermally stable, is spin-coated.

It is found out that, as illustrated in FIG. 22(d), the deep vias 37B, whose diameter is 10 μm and whose depth is 25 μm, are formed vertically in the transferred chip 33A. The vias 37B are formed by the Bosch process. ICP (Inductively Coupled Plasma)-RIE by $SF_6$ and $C_4F_8$ gas is used to form the vias 37B. After the formation of the vias 37B, a photoresist 37A is peeled off.

Figures 23A, 23B, 23C:
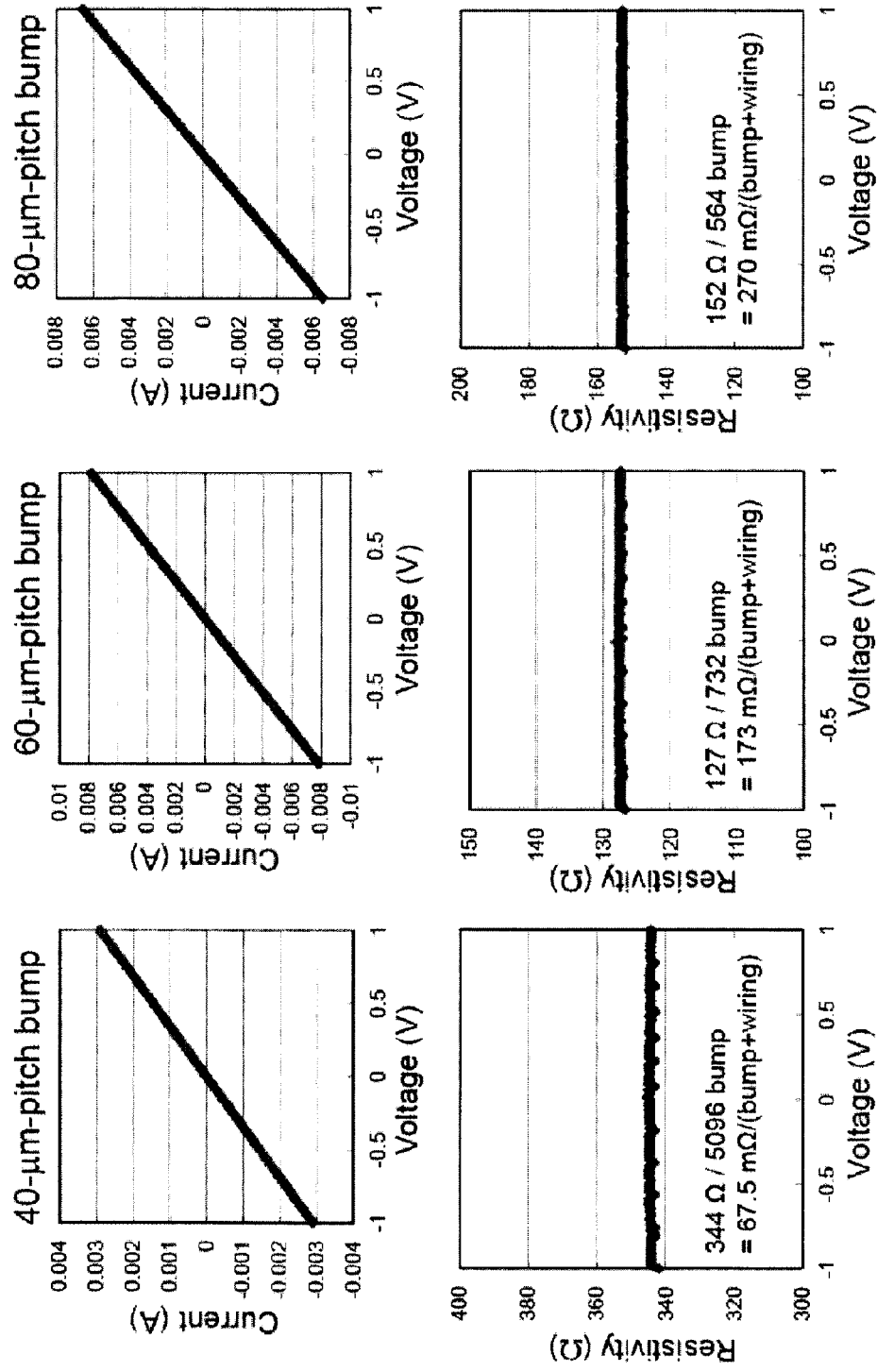
FIG. 23(a) to FIG. 23(c) are views illustrating current (upper drawings) and resistance (lower drawings) characteristics of a wiring pattern that has a lot of micro bumps, formed by Cu/AgSn, connected in series and that is referred to as a Daisy Chain, with respect to the applied voltage, in which pitches of the micro bumps are 40 μm in FIG. 23(a), 60 μm in FIG. 23(b), and 80 μm in FIG. 23(c)

FIG. 23(a) to FIG. 23(c) are views illustrating current (upper drawings) and resistance (lower drawings) characteristics of a wiring pattern that has a lot of the micro bumps 38, formed by Cu/AgSn, connected in series and that is referred to as a Daisy Chain, with respect to the applied voltage. Pitches of the micro bumps 38 are 40 μm in FIG. 23(a), 60 μm in FIG. 23(b), and 80 μm in FIG. 23(c).

It is found out that, as illustrated in FIG. 23(a) to FIG. 23(c), the micro bumps 38, formed by Cu/AgSn, are electrically connected to each other, and the resistance is sufficiently low. According to the wiring pattern having the 40-μm pitch, as illustrated in FIG. 23(a), 5,096 pieces of the bumps are connected, and the resistance between the bump and the wiring per one bump is 67.5 ma According to the wiring pattern having the 60-μm pitch, as illustrated in FIG. 23(b), 732 pieces of the bumps are connected, and the resistance between the bump and the wiring per one bump is 173 ma According to the wiring pattern having the 80-μm pitch, as illustrated in FIG. 23(c), 564 pieces of the bumps are connected, and the resistance between the bump and the wiring per one bump is 2,705 mΩ. Incidentally, the resistance does not include the resistance of the TSVs.

Figure 24:
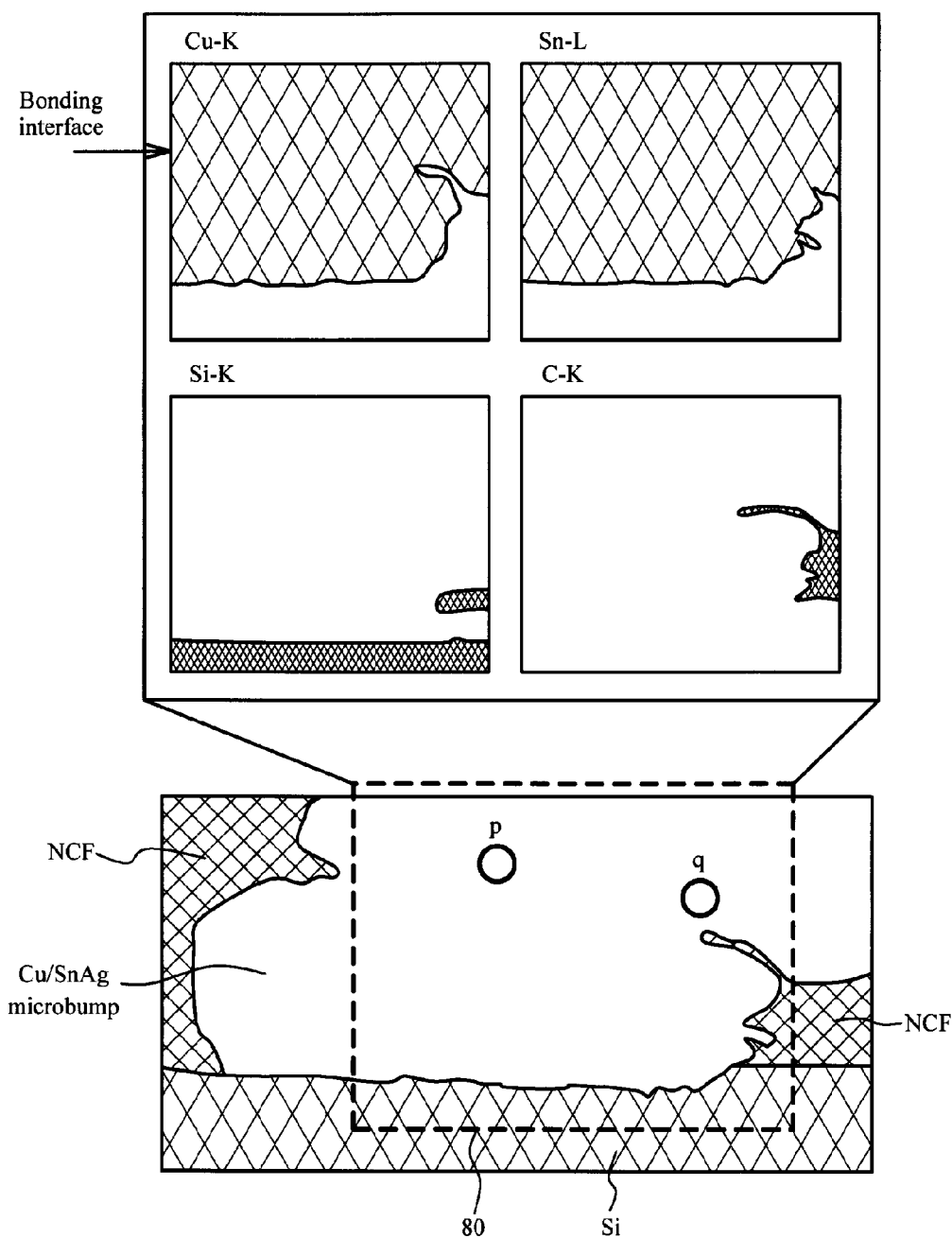
FIG. 24 illustrates an image of the micro bump that is formed by Cu/AgSn and that is bonded via a non-conductive film, in which the lower drawing is a TEM image, and the upper drawing is a map chart of X-ray analysis.
Figure 25A:
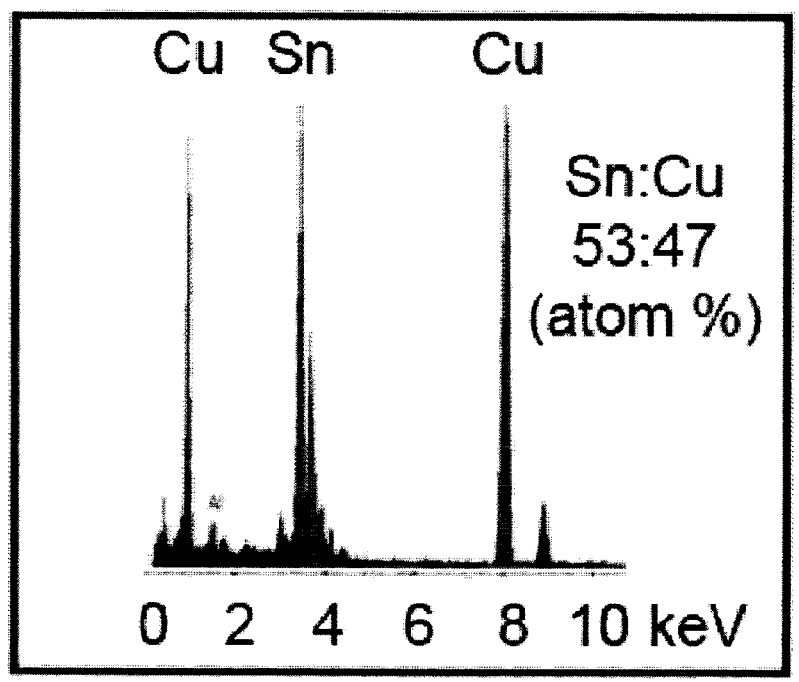
FIG. 25(a) and FIG. 25(b) are views illustrating X-ray analysis spectra at the positions of p and q in the lower drawing in FIG. 24.
Figure 25B:
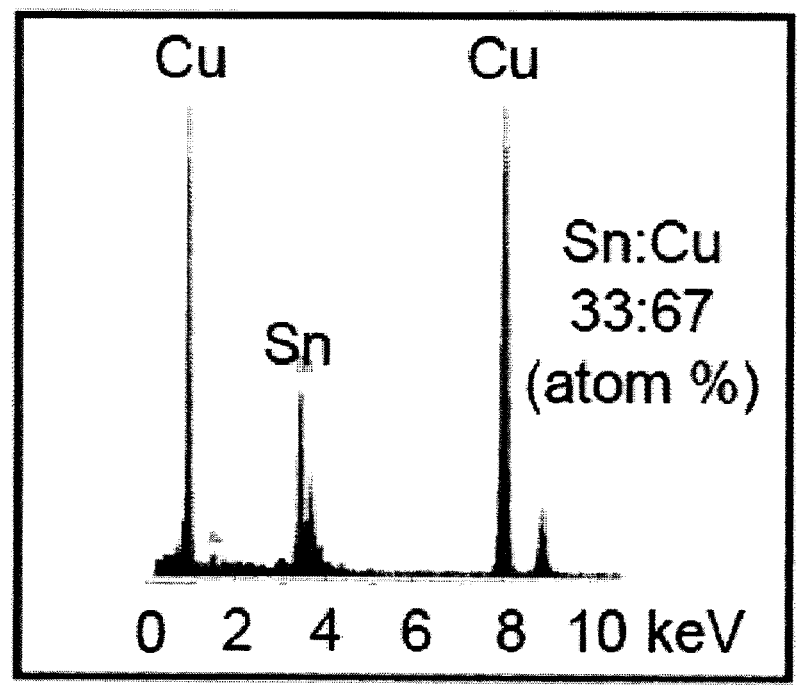

FIG. 24 is schematic views of an image of the micro bump 38 that is formed by Cu/AgSn and that is bonded via the gap filling resin 39 as the non-conductive film. The lower drawing in FIG. 24 is the schematic view of a TEM (Transmission Electron Microscope) image, and the upper drawing in FIG. 24 is a map chart of X-ray analysis. FIG. 25(a) and FIG. 25(b) are views illustrating X-ray analysis spectra at the positions of p and q in the lower drawing in FIG. 24. The X-ray analysis was made by using an energy dispersive (EDX: Energy Dispersive X-ray Spectroscopy) detector.

As illustrated in the lower drawing of FIG. 24, Si, the micro bump, and the NCF (gap filling resin) are observed in the TEM cross section. In the upper drawing of FIG. 24, areas where intensity of Cu—K line, Sn-L line, Si—K line, and C—K line is strong, in an area 80 illustrated by a broken line in the lower drawing of FIG. 24, are illustrated in meshes. In the micro bump area, Cu and Sn are detected more. Si is detected more in Si, and C is detected more in the NCF. As illustrated in FIG. 25(a) and FIG. 25(b), C, as the principal component of the NCF, is hardly detected at the positions of p and q that are near the bonding interface of the micro bump, and Sn and Cu are detected. Thus, an intermetallic compound is formed at the bonding interface. Therefore, the micro bumps 38 are connected to each other structurally. Carbon, derived from the gap filling resin 39 as the non-conductive film, was not measured at the bonding interface.

Figure 26:
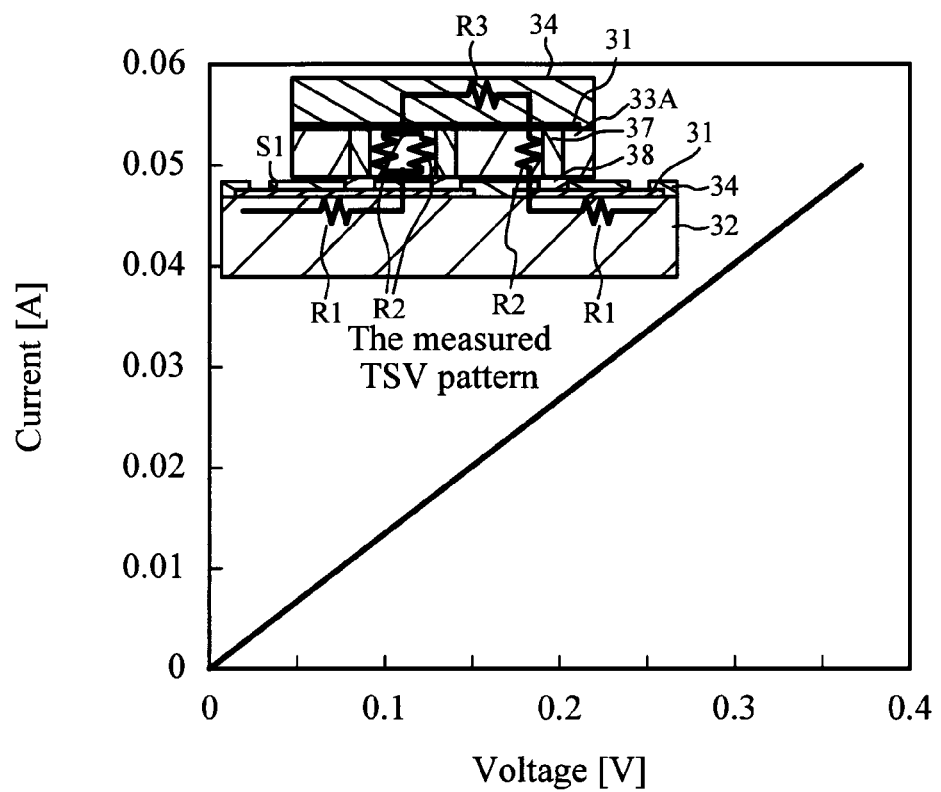
FIG. 26 is a view illustrating I-V characteristics of the wiring pattern that is referred to as the Daisy Chain, in which a lot of the micro bumps, having the 30-μm pitch, are connected in series.

FIG. 26 is a view illustrating current I-voltage V characteristics of the wiring pattern that is referred to as the Daisy Chain, in which a lot of the micro bumps 38, having the 30-μm pitch, are connected in series. By using a TSV pattern, it is possible to measure the sum of resistance R1 to R3. The resistance R1 is resistance of wiring 31 formed on the wafer 32, the resistance R2 is resistance of the micro bump 38 and the TSV 37 formed in the chip 33A, and the resistance R3 is resistance of the wiring 31 formed on the chip 33A. It is found out that, as illustrated in FIG. 26, the Cu-TSV 37 is formed with a high yield, and the I-V characteristics are for a resistant electrode.

An observation of the alignment accuracy after the first transfer and after the second transfer was carried out by using an infrared ray.

Figure 27A:
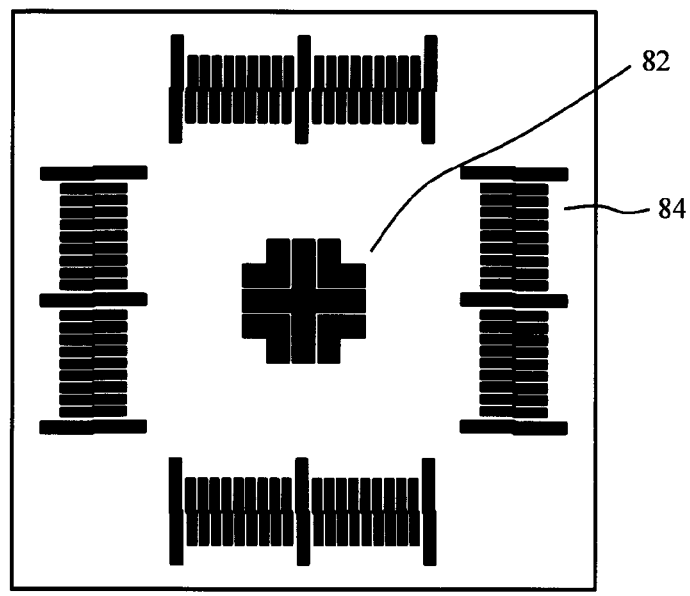
Figure 27B:
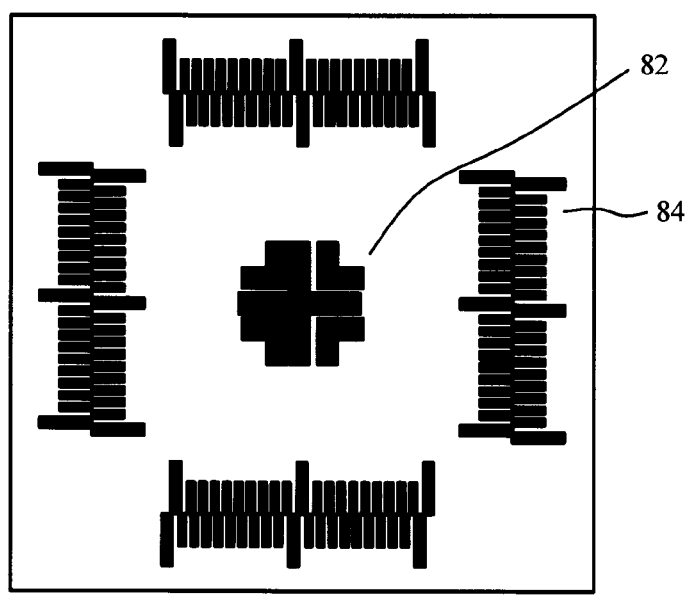

FIG. 27(a) and FIG. 27(b) illustrate infrared ray images schematically. An alignment mark 82 and a registration displacement measurement pattern 84 are illustrated. FIG. 27(a) is a schematic view of the image after the transfer to the adhesive wafer 43, and FIG. 27(b) is a schematic view of the image after the transfer, via the NCF, to the semiconductor wafer 32 as the target wafer. It is found out that, from FIG. 27(a) and FIG. 27(b), the alignment accuracy is within 1 μm, after the transfer of the multi-chip 33 twice by the self-assembly and the thermocompression.

Figure 28:
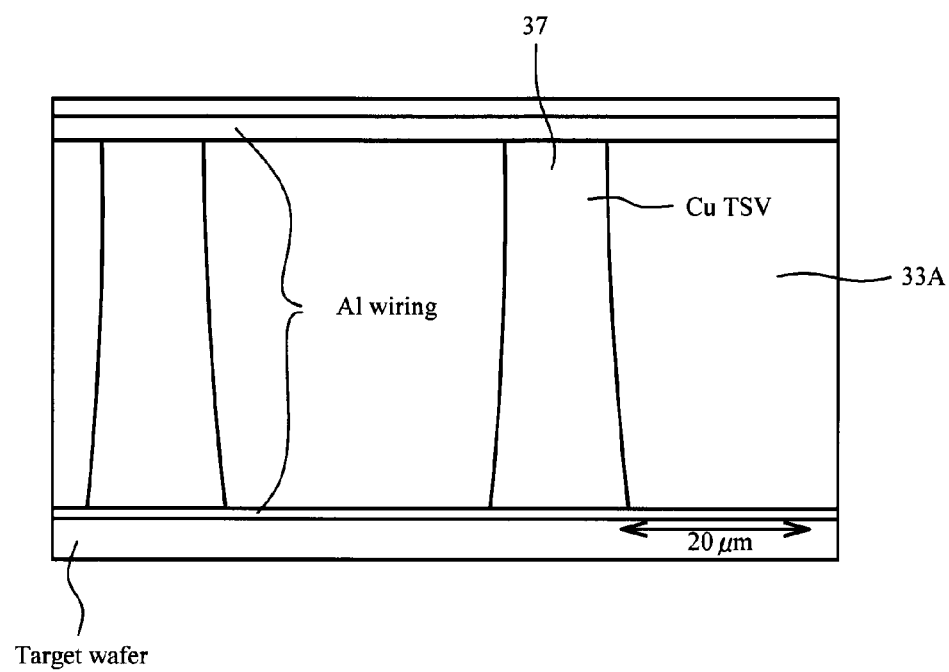
FIG. 28 is a view illustrating an SEM image of the cross section of a thin chip that is subjected to 3D lamination by HSA-CtW and is transferred in a self-assembly manner from the adhesive wafer to another target wafer.

FIG. 28 is a view illustrating an SEM image of the cross section of the thin chip 33 that is subjected to the 3D lamination by HSA-CtW and is transferred in a self-assembly manner from the adhesive wafer 43 to another target wafer 32. As illustrated in FIG. 28, it is found out that the KGD chip 33A is subjected to the 3D lamination by HSA-CtW.

In a table 1, the fabrication method according to the modification example 1 of this embodiment and the fabrication methods of the comparative examples are compared. It is found out that, from the table 1, the three-dimensional integrated circuit 30 can be fabricated with high throughput, a high yield, and low cost, according to the fabrication method of the modification example 1. The throughput is for the case where 10,000 chips are formed on one wafer, as an example.

TABLE 1

| | Modification example 1 | Comparative example 1 | Comparative example 2 |
|---|---|---|---|
| Thermocompression (Heating and cooling: 50° C. → 250° C. → 50° C. | 20 minutes/wafer | 8 seconds/chip + 10 seconds/chip | 20 minutes/wafer |
| Alignment accuracy | <1 μm | ±2 μm | <1 μm |
| Throughput of 10,000 chips in assembly device | About 1.2 hours | About 60 hours | About 1.8 hours |
| Cost | Low | High | Medium |
| Application | Various kinds, Small quantity production | Various kinds, Small quantity production | High yield, Large quantity production |

According to the fabrication method of the three-dimensional integrated circuit 30 of the modification example 1, as is clear from the table 1, the heating and cooling time required for the thermocompression process is 20 minutes/wafer, the alignment accuracy of the chip is less than 1 μm, and the throughput of the assembly of the 10,000 chips is about 1.2 hours. Thus, the three-dimensional integrated circuit of various kinds and small quantity production can be fabricated with lower cost, as compared with CtW in the comparative example 1 and the comparative example 2.

Modification Example 2

Hereinafter, another modification example of this embodiment will be explained. The modification example 2 is an example in which the method of arranging the chip 33A onto the liquid 15 is different from the method of the modification example 1 as illustrated in FIG. 11(*a*) to FIG. 13(*d*). FIG. 29(*a*) to FIG. 31(*d*) are cross sectional views illustrating the fabrication method of the three-dimensional integrated circuit according to the modification example 2. It should be noted that an area of one three-dimensional integrated circuit is illustrated in the drawings, but the plurality of the chips 33A are disposed on the chip support substrate 42, the adhesive wafer, or the semiconductor wafer 32 as illustrated in FIG. 16, for example.

The chip support substrate 42 is prepared as illustrated in FIG. 29(*a*). The chip support substrate 42 is mainly provided with a substrate 51, the electrodes 46, the hydrophilic regions 44, and the hydrophobic region 45. A semiconductor substrate or an insulator substrate may be used as the substrate 51. In addition, the material exemplified with reference to FIG. 4 can be used. The electrodes 46 are formed on the upper surface of the substrate 51. The material of the electrodes 46 may be metal containing, for example, Au, Al or Cu, or a conductor other than the metal. The hydrophilic regions 44 and the hydrophobic region 45 are formed on the upper surface of the chip support substrate 42. Each hydrophilic region 44 is, for example, a layer that is hydrophilic, and is formed by the insulation film such as, for example, a silicon oxide film, a silicon nitride film or the like. The material explained with reference to FIG. 4 may be used for the hydrophilic regions 44 and the hydrophobic region 45. When the surface of the substrate 51 is hydrophobic, the region other than the hydrophilic layer formed in the hydrophilic regions 44 may become the hydrophobic region 45.

As illustrated in FIG. 29(*b*), the liquids 15 are dropped onto the hydrophilic regions 44. As the liquids 15 are not absorbed onto the hydrophobic region 45, the liquids 15 are respectively arranged onto the plurality of hydrophilic regions 44 only. Water is used as the liquid 15, but the liquids explained with reference to FIG. 4 may also be used. The chips 33A are respectively arranged on the plurality of liquids 15. By using the multi-chip pickup tool as explained with reference to FIG. 2, for example, it is possible to arrange the chips 33A simultaneously on the plurality of liquids on the chip support substrate 42 having the wafer shape. The chips 33A may be divided into a plurality of groups and may be arranged by the group. Each of the chips 33A is, for example, a silicon chip, and has the element forming region 34 on the top thereof. The micro bumps 38 are formed on the upper surface of the element forming region 34. The micro bumps 38 mainly contain metal such as Cu, Au, solder or the like, and a conductor other than the metal, and are electrically connected to the element forming region 34.

When the liquids 15 vaporize, the chips 33A are automatically positioned in the X direction, the Y direction, and the rotation direction on the hydrophilic regions 44, due to the surface tension of the liquids 15, and are absorbed to the hydrophilic regions 44, as illustrated in FIG. 29(*c*). Namely, the chips 33A are absorbed to the hydrophilic regions 44 in a self-assembling manner. The hydrophobic region 45 may be removed in the process of FIG. 29(*b*).

As illustrated in FIG. 29(*d*), a voltage is applied to the electrodes 46. The positive voltage is applied to the anode 46A, and the negative voltage is applied to the cathode 46B. Thus, the chips 33A are absorbed electrostatically to the chip support substrate 42. As the bipolar electrostatic absorption is made, it is preferable that at least one anode 46A and at least one cathode 46B are formed in one hydrophilic region 44.

As illustrated in FIG. 30(*a*), the adhesive layer 43A of the adhesive wafer 43 is affixed to the upper surfaces of the chips 33A. For example, all the chips 33A on the chip support substrate 42 are affixed to the adhesive wafer 43.

As illustrated in FIG. 30(*b*), a reverse voltage is applied to the electrodes 46. In other words, the negative voltage is applied to the anode 46A, and the positive voltage is applied to the cathode 46B. Thereby, the chips 33A are separated from the chip support substrate 42.

As illustrated in FIG. 30(*c*), the resin mold 41 is formed on the adhesive wafer 43 so as to cover the chips 33A. The resin mold 41 is for fixing the chips 33A. In FIG. 30(*c*), the formation of the resin mold 41 may not be made, and may be made after laminating the chips 33A to 33C. In this case, the hydrophobic region is not formed.

As illustrated in FIG. 30(*d*), the upper surface of the resin mold 41 is polished. Thereby, the upper surfaces of the chips 33A are exposed. The polishing may be made further, so as to reduce the thickness of the chips 33A.

As illustrated in FIG. 31(*a*), the TSVs 37 that vertically penetrate the chips 33A are formed. The TSVs 37 mainly contain metal such as Cu, Au or the like, or conductive material. The micro bumps 38 are formed on the upper surfaces of the chips 33A. The micro bumps 38 on the upper and lower sides of the chips 33A are connected electrically via the TSVs 37.

As illustrated in FIG. 31(*b*), the semiconductor wafer 32 is registered and arranged on the adhesive wafer 43. The semiconductor wafer 32 is a silicon wafer, for example, and is provided with the element forming region 34 on the top thereof (on the lower side in FIG. 31(*b*)). The micro bumps 38 are formed on the element forming region 34. The gap filling resin 39 is formed to cover the micro bumps 38.

Figure 31A:
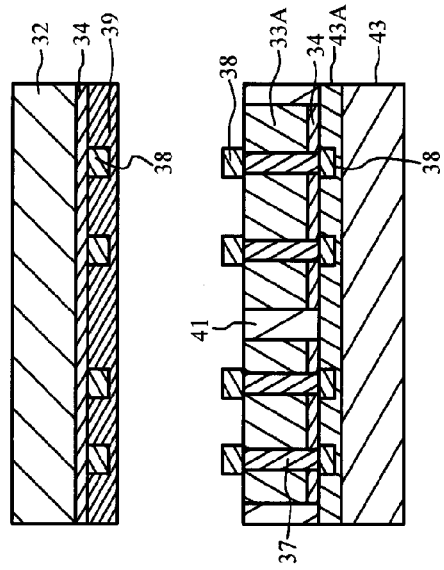
FIG. 31(a) to FIG. 31(d) are cross sectional views illustrating the fabrication method of the three-dimensional integrated circuit according to the modification example 2.
Figure 31B:
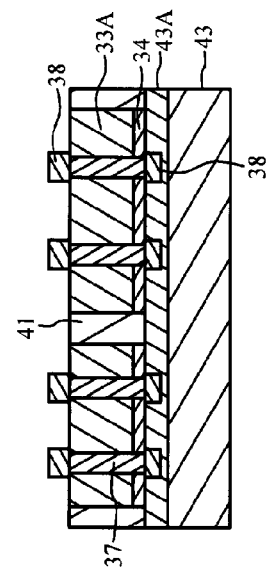
Figure 31C:
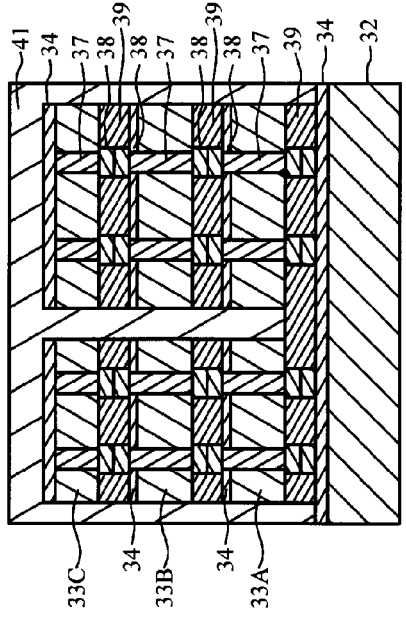
Figure 31D:
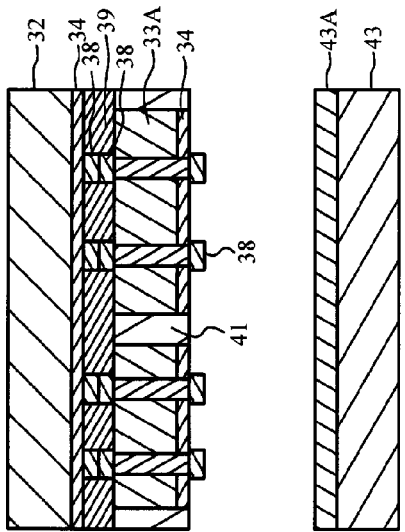

As illustrated in FIG. 31(c), the semiconductor wafer 32 is affixed onto the chips 33A. The micro bumps 38 on the upper surfaces of the chips 33A and the micro bumps 38 on the semiconductor wafer 32 are joined to each other. The chips 33A are peeled off from the adhesive layer 43A. The method of peeling is the same as the method illustrated in FIG. 13(c).

When the processes in FIG. 29(a) to FIG. 31(c) are repeated, the chips 33B are laminated on the chips 33A. Similarly, the chips 33C are laminated on the chips 33B. The laminate body, having the wafer shape, is cut by using a dicing method or the like, so as to form the three-dimensional integrated circuit.

Figure 29B:
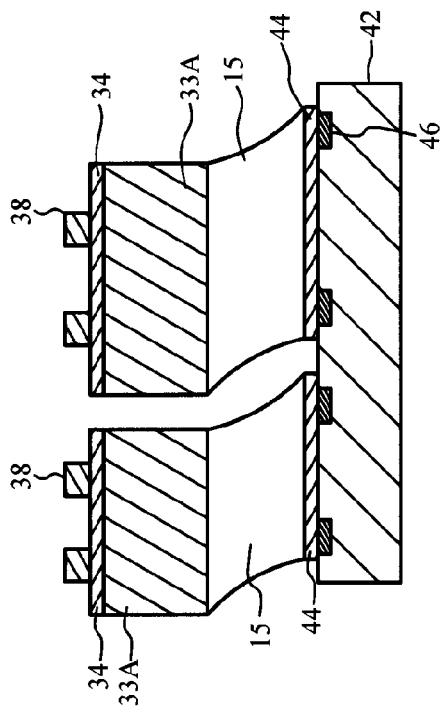
FIG. 29(a) to FIG. 29(d) are cross sectional views illustrating the fabrication method of the three-dimensional integrated circuit according to a modification example 2.
Figure 29D:
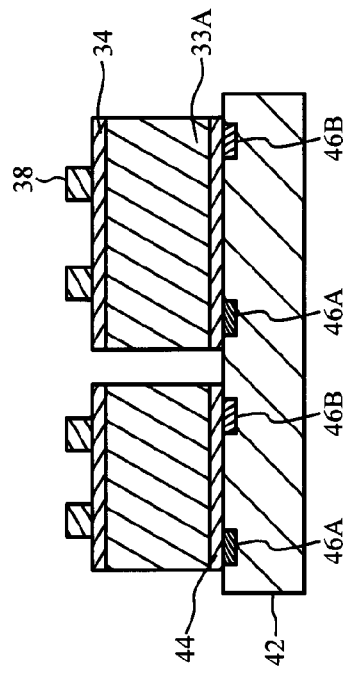

According to the modification example 1 explained with reference to FIG. 11(a) to FIG. 13(d), the chips 33A are arranged onto the liquids 15 one by one, and the chips 33A are absorbed to the chip support substrate 2 one by one, as illustrated in FIG. 11(b) and FIG. 11(c). Meanwhile, according to the modification example 2, the plurality of chips 33A are simultaneously arranged on the liquids 15 and absorbed to the transfer chip support substrate 42 in a self-assembling manner, as illustrated in FIG. 29(b) and FIG. 29(c). For example, different types of the chips 33A are absorbed to the chip support substrate 42 in a self-assembling manner. This makes it possible to increase throughput.

Modification Example 3

A modification example 3 is an example in which the method of applying the electrostatic force to the chips 3A is different from the method in the embodiment as illustrated in FIG. 5(a) to FIG. 7(d). FIG. 32(a) to FIG. 34(d) are cross sectional views illustrating the fabrication method of the three-dimensional integrated circuit according to the modification example 3. It should be noted that an area of one three-dimensional integrated circuit is illustrated in the drawings, but the plurality of the chips 33A are disposed on the chip support substrate 2, as illustrated in FIG. 16, for example.

Figure 5A:
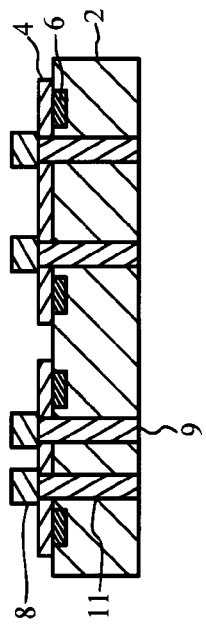
FIG. 5(a) to FIG. 5(d) are cross sectional views illustrating a fabrication method of the integrated circuit that is integrated three-dimensionally according to this embodiment.
Figure 5B:
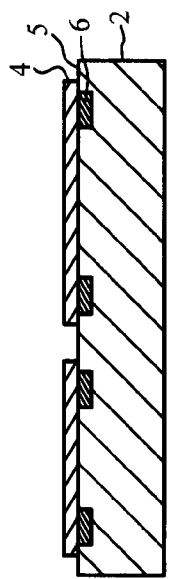
Figure 5C:
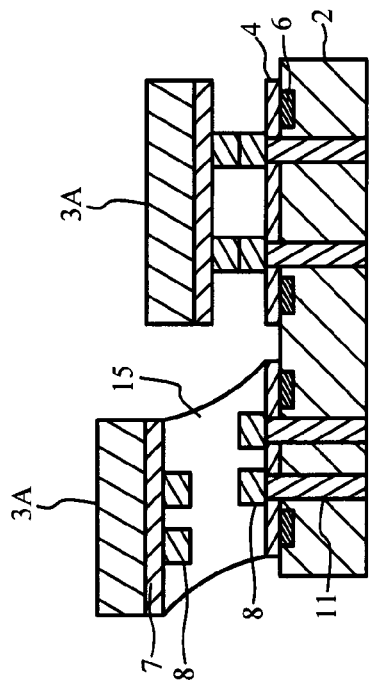
Figure 5D:
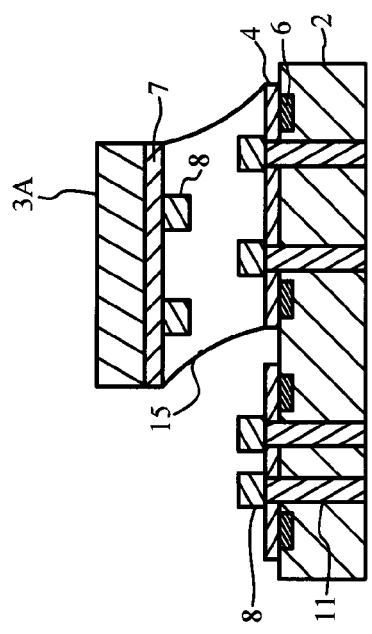
Figure 32A:
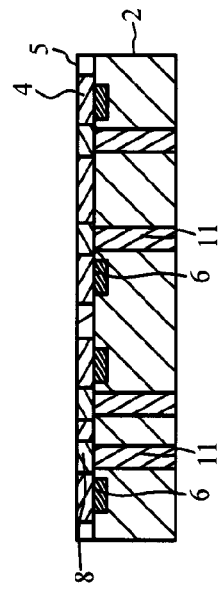
FIG. 32(a) to FIG. 32(d) are cross sectional views illustrating the fabrication method of the three-dimensional integrated circuit according to a modification example 3.
Figure 32B:
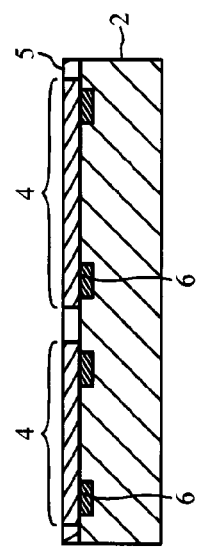

The chip support substrate 2 that is provided with the hydrophilic regions 4, the hydrophobic region 5, and the electrodes 6, similarly to FIG. 5(a), is prepared as illustrated in FIG. 32(a). As illustrated in FIG. 32(b), the through electrodes 11 that vertically penetrate the chip support substrate 2 are formed. The through electrodes 11 mainly contain metal such as Cu, or the conductive material. The micro bumps 38 are formed on the chip support substrate 2. The micro bumps 8 are embedded in the insulation film that forms the hydrophilic regions 4. The surfaces of the micro bumps 8 are exposed at the insulation film.

Figure 32C:
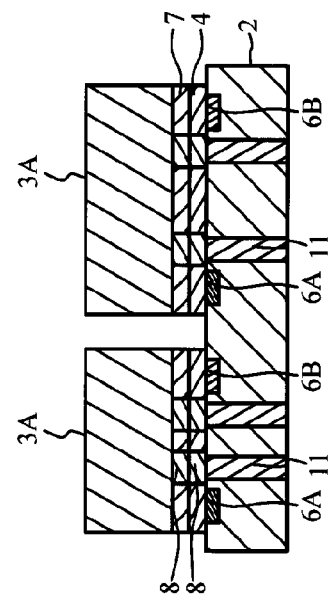

As illustrated in FIG. 32(c), the liquids 15 are dropped onto the hydrophilic regions 4. As the liquids 15 are not absorbed onto the hydrophobic region 5, the liquids 15 are arranged only to the plurality of hydrophilic regions 4. Water is used as the liquid 15, for example. The chips 3A are respectively arranged on the plurality of liquids 15. The insulation film 7 is formed on the chips 3A (on the lower side in the drawings). The insulation film 7 is, for example, the silicon oxide film or the silicon nitride film. The material of the insulation film 7 may be the same as or different from the insulation film forming the hydrophilic regions 4. The micro bumps 8 are formed on the chips 3A. The micro bumps 8 are embedded in the insulation film 7, and the surfaces of the micro bumps 8 are exposed at the insulation film 7. When, for example, the NCF is used for the insulation film 7, the surfaces of the micro bumps 8 may not be exposed at the insulation film. A voltage is applied to the electrodes 6. The positive voltage is applied to the anode 6A, and the negative voltage is applied to the cathode 6B. Thereby, the electrostatic force is generated in the chips 3A so as to improve the alignment accuracy.

Figure 32D:
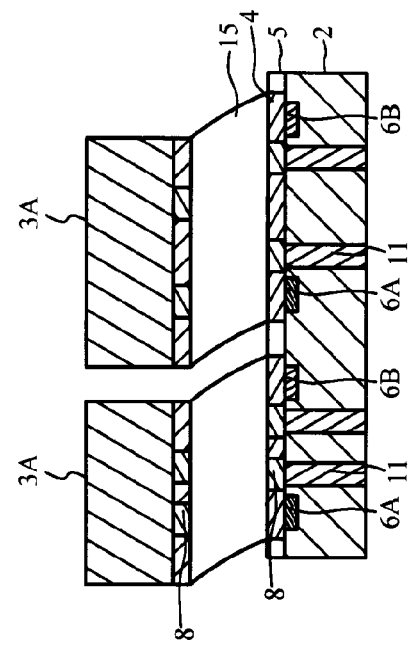

As illustrated in FIG. 32(d), when the liquids 15 vaporize, the chips 3A are absorbed onto the hydrophilic regions 4 of the chip support substrate 2. The micro bumps 8 are joined to each other by the thermocompression. Incidentally, the voltage may be applied to the electrodes after the liquids 15 vaporize, similarly to FIG. 6(b). Moreover, the hydrophobic region 5 may be removed in FIG. 32(d).

Figure 33A:
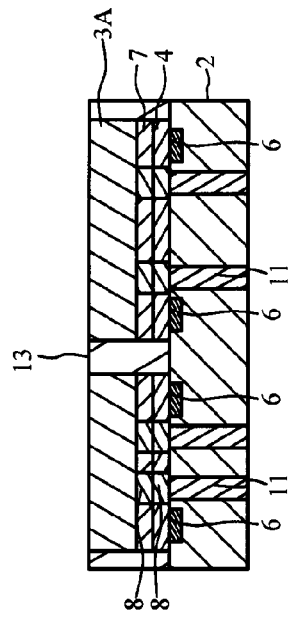
FIG. 33(a) to FIG. 33(d) are cross sectional views illustrating the fabrication method of the three-dimensional integrated circuit according to the modification example 3.
Figure 33B:
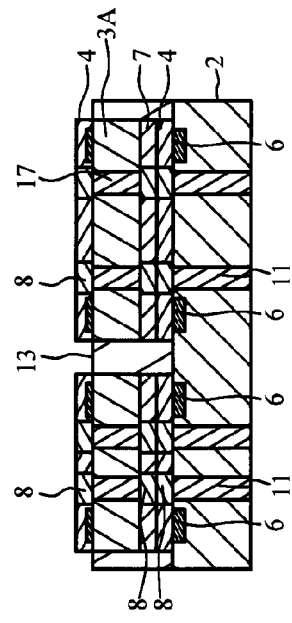
Figure 33C:
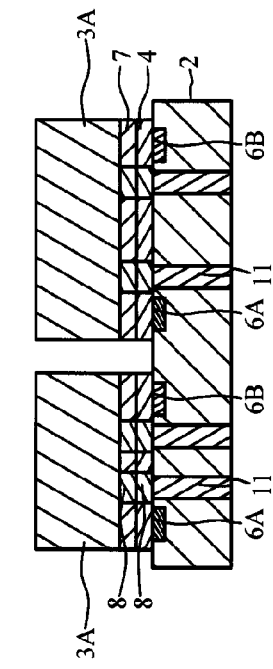
Figure 33D:
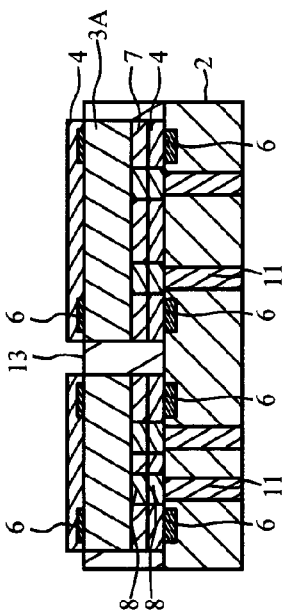

As illustrated in FIG. 33(a), the back surfaces of the chips 3A (the upper surfaces in the drawings) are polished, and the thickness of the chips 3A is reduced. As illustrated in FIG. 33(b), the resin mold 13 is formed between the chips 3A. In FIG. 33(b), the formation of the resin mold 13 may not be made, and may be made after laminating the chips 3A to 3C. In this case, the hydrophobic region is not formed. As illustrated in FIG. 33(c), the electrodes 6 are formed on the back surfaces of the chips 3A. The insulation film, as the hydrophilic regions 4, is formed on the chips 3A so as to cover the electrodes 6. The hydrophobic region 5 is formed on the region other than the hydrophilic regions 4. The hydrophobic region 5 may be the surface of the resin mold 13. As illustrated in FIG. 33(d), the TSVs 17 that vertically penetrate the chips 3A are formed. The micro bumps 8 are formed in the insulation film, as the hydrophilic regions 4. The micro bumps 8 formed on the chips 3A and the micro bumps 8 formed on the chips 3A chip support substrate 2 are electrically connected via the TSVs 17. The surfaces of the micro bumps 8 are exposed at the insulation film.

Figure 34A:
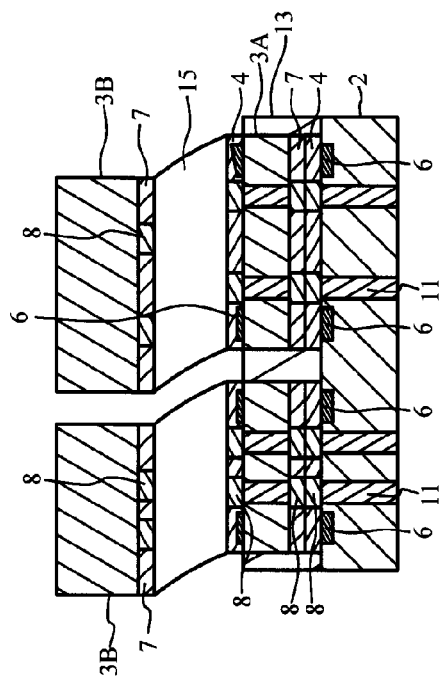
FIG. 34(a) to FIG. 34(d) are cross sectional views illustrating the fabrication method of the three-dimensional integrated circuit according to the modification example 3.
Figure 34B:
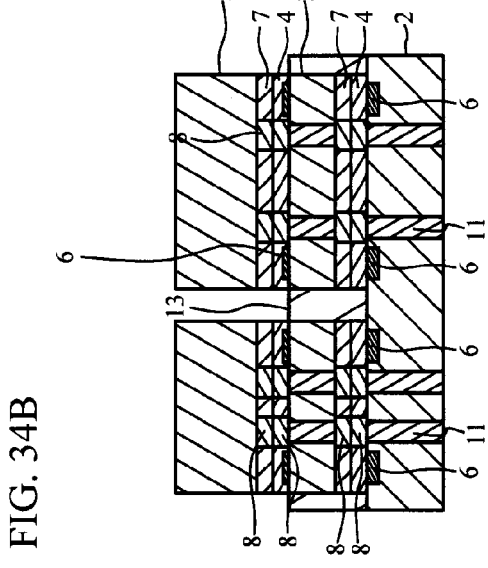
Figure 34C:
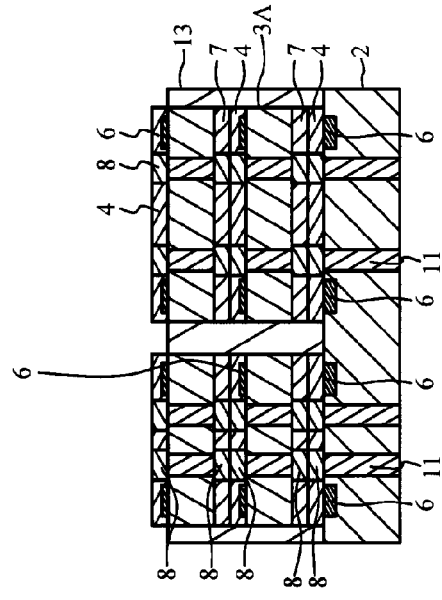

As illustrated in FIG. 34(a), the liquids 15 are dropped onto the hydrophilic regions 4 of the chips 3A. The chips 3B are simultaneously arranged on the liquids 15. A voltage is applied to the electrodes 6 of the chips 3A. Thereby, the chips 3B are positioned in a self-assembling manner due to the surface tension of the liquids 15 and the electrostatic force. As illustrated in FIG. 34(b), after the liquids 15 vaporize, the micro bumps 8 of the chips 3A and 3B are joined to each other. As illustrated in FIG. 34(c), the thickness of the chips 3B is reduced. The TSVs 17 are formed in the chips 3B, the electrodes 6, the hydrophilic regions 4, and the micro bumps 8 are formed on the chips 3B. The resin mold 13 is formed between the chips 3B.

Figure 34D:
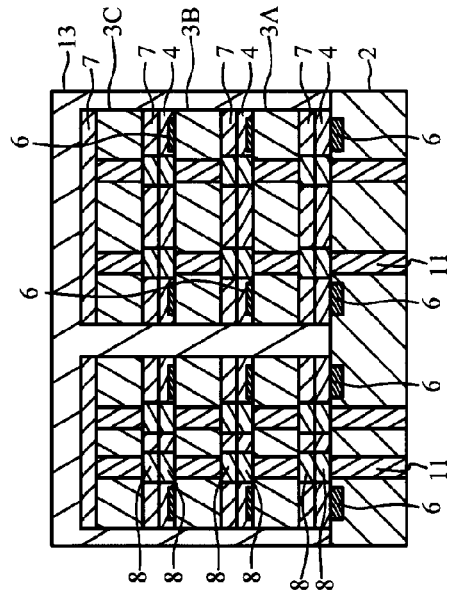

Similarly, the chips 3C are laminated on the chips 3B, as illustrated in FIG. 34(d). The chips 3A to 3C are sealed by the resin mold 13. The laminate body, having the wafer shape, is cut by using the dicing method or the like, so as to form the three-dimensional integrated circuit.

The hydrophobic region 5 may be removed or modified to be less hydrophobic, after dropping the liquids 15. The resin mold 13 may be formed collectively after the chips 3A to 3C are laminated.

According to the modification example 3, the chips 3A to 3C are laminated in a face-down manner. Thereby, the thickness of the chips 3A or 3B can be reduced after the chips 3A or 3B are laminated. Moreover, the TSVs 17 may be formed in the chips 3A or 3B, and the electrodes 6 and the micro bumps 8 may be formed on the chips 3A or 3B. When the chips, having the thickness reduced in advance and having the TSVs, the micro bumps and the electrodes formed thereon, are used, it is possible to laminate the chips 3A to 3C in a face-up manner.

Figure 35A:
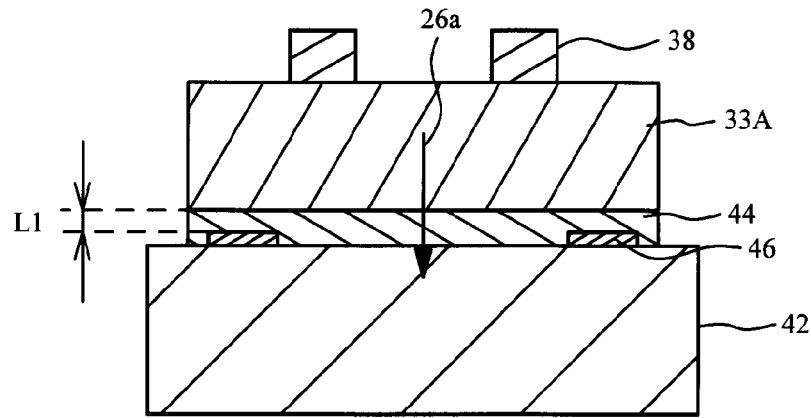
FIG. 35(a) to FIG. 35(c) are cross sectional views when the chip is absorbed to the chip support substrate.
Figure 35B:
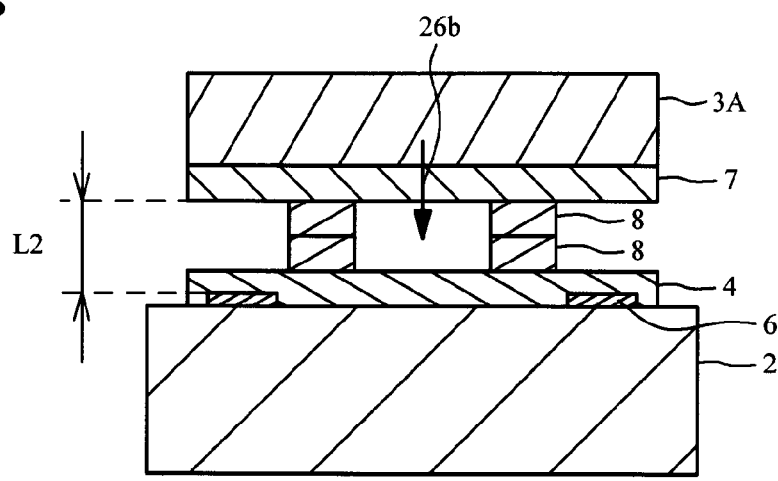
Figure 35C:
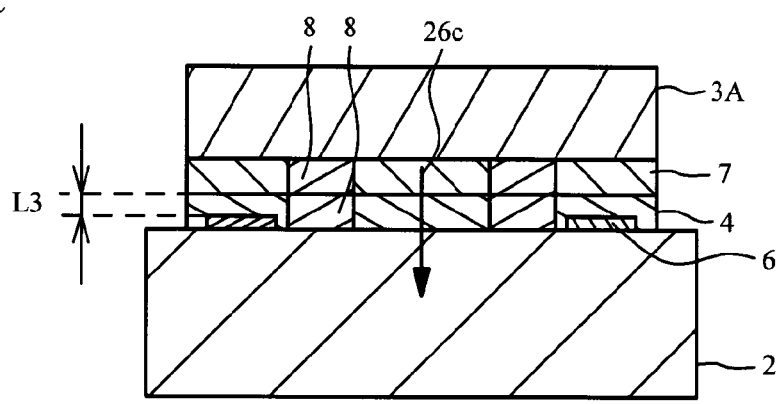

FIG. 35(a) to FIG. 35(c) are cross sectional views when the chip is absorbed to the chip support substrate. When the chip 33A is directly absorbed onto the chip support substrate 42 as in the modification example 1 and the modification example 2, a distance L1 between the electrodes 46 and the chip 33A is small, as illustrated in FIG. 35(a). Therefore, the electrostatic force 26a applied to the chip 33A is large, as in the expression 1.

When the chip 3A is absorbed to the chip support substrate 2 via the micro bumps 8 as in this embodiment, a distance L2 between the electrodes 6 and the chip 3A is large, as illustrated in FIG. 35(b). For example, the height of the micro bump 8 is about 10 μm, and the distance L2 is about 20 μm. Therefore, the electromagnetic force 26b applied to the chip 3A is small, and the electrostatic absorption force to the chip 3A becomes smaller.

According to the modification example 3, the micro bumps 8 are embedded in the insulation film 7 and the insulation film forming the hydrophilic region 4, as illustrated in FIG. 35(c). Thereby, a distance L3 between the electrodes 6 and the chip 3A can be made smaller. Therefore, the electrostatic force 26c applied to the chip 3A can be made larger.

When the electrodes 6 and the chip 3A are separated from each other, as illustrated in FIG. 35(b), a voltage is applied to the electrodes 6 when there is the liquid 15. As is clear from the expression 1, when the permittivity of the liquid is larger, the electrostatic force applied to the chip 3A can be made larger.

Modification Example 4

A modification example 4 is an example of transferring the chips from the chip support substrate to the semiconductor wafer. FIG. 36(a) to FIG. 38(c) are cross sectional views illustrating the fabrication method of the three-dimensional integrated circuit according to the modification example 4. It should be noted that an area of one three-dimensional integrated circuit is illustrated in the drawings, but the plurality of the chips 33A are disposed on the chip support substrate 42, or the semiconductor wafer 32 as illustrated in FIG. 16, for example.

Figure 29A:
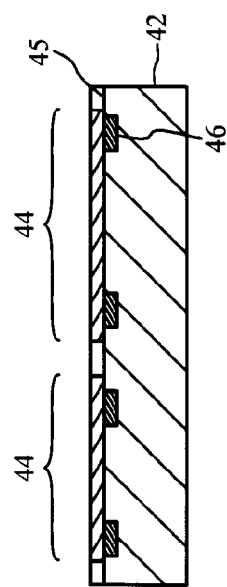
Figure 29C:
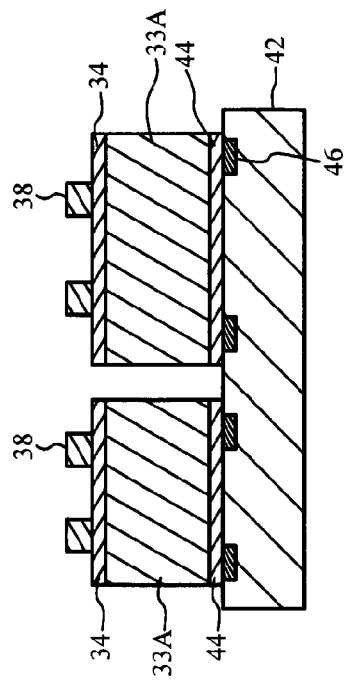
Figure 30A:
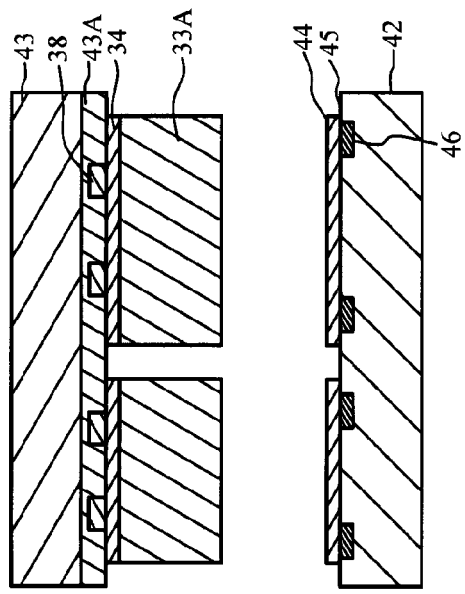
FIG. 30(a) to FIG. 30(d) are cross sectional views illustrating the fabrication method of the three-dimensional integrated circuit according to the modification example 2.
Figure 30B:
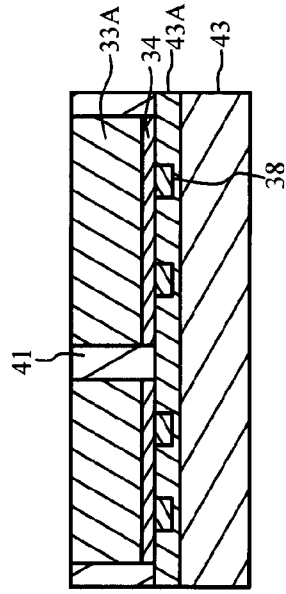
Figure 30C:
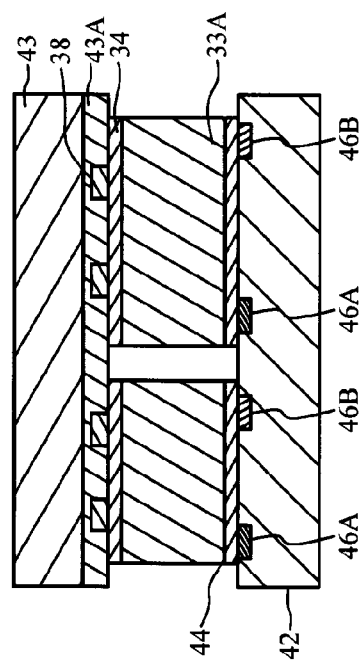
Figure 30D:
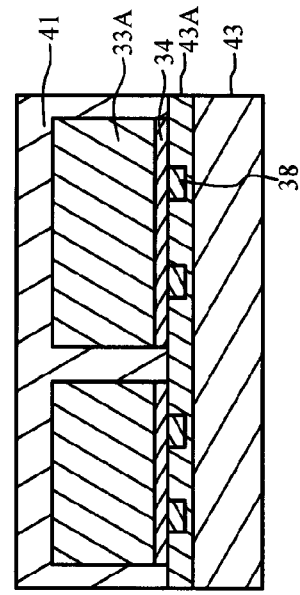
Figure 36A:
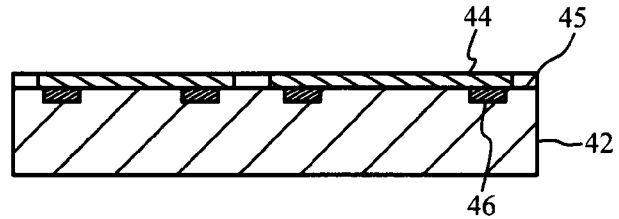
FIG. 36(a) to FIG. 36(c) are cross sectional views illustrating the fabrication method of the three-dimensional integrated circuit according to a modification example 4.
Figure 36B:
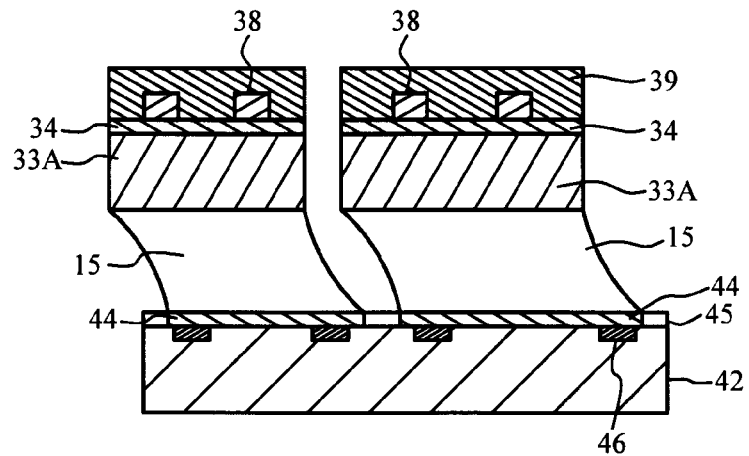

As illustrated in FIG. 36(a), the chip support substrate 42 is prepared similarly to FIG. 29(a). As illustrated in FIG. 36(b), the liquids 15 are dropped onto the hydrophilic regions 44. The chips 33A are arranged onto the liquids 15. The chips 33A are arranged simultaneously. The chip 33A is provided with the element forming region 34 on the top thereof. The micro bumps 38 are formed on the element forming region 34. The gap filling resin 39 is formed on the element forming region 34 so as to cover the micro bumps 38. The side opposite to the element forming region 34 of the chip 33A is arranged on the liquid 15.

Figure 36C:
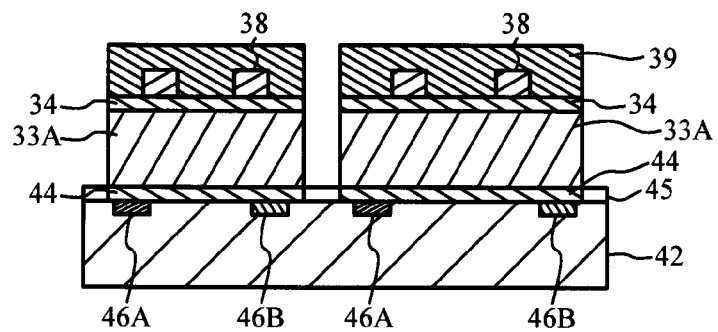

As illustrated in FIG. 36(c), the liquids 15 are vaporized and a voltage is applied to the electrodes 46, so that the chips 33A are absorbed to the chip support substrate 42 due to the surface tension of the liquids 15 and the electrostatic absorption of the electrodes 46. Incidentally, the voltage may be applied to the electrodes 46 while there exist the liquids 15 as in FIG. 32(c) of the modification example 3.

Figure 37A:
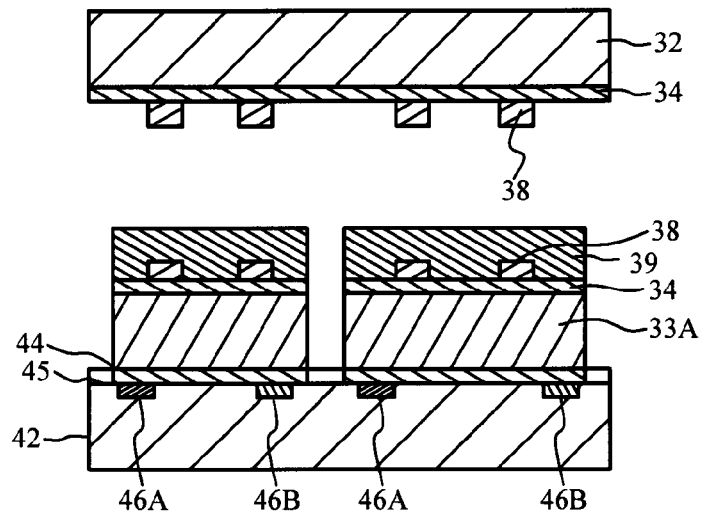
FIG. 37(a) to FIG. 37(c) are cross sectional views illustrating the fabrication method of the three-dimensional integrated circuit according to the modification example 4.

As illustrated in FIG. 37(a), the semiconductor wafer 32 is registered and arranged on the chips 33A. The element forming region 34 is formed on the semiconductor wafer 32, and the micro bumps 38 are formed on the element forming region 34.

Figure 37B:
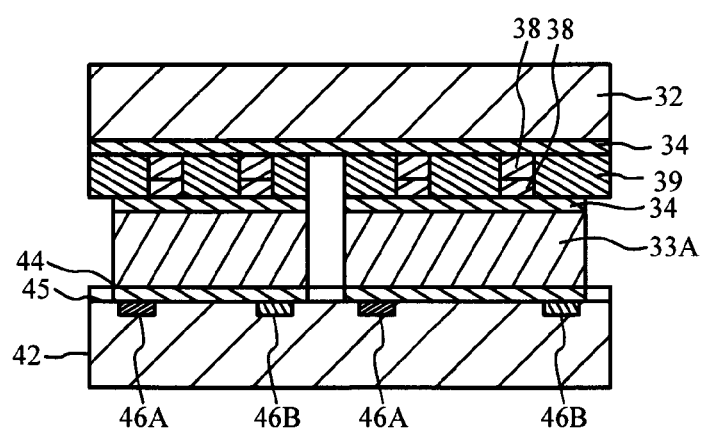

As illustrated in FIG. 37(b), the micro bumps 38 on the chips 33A are joined to the micro bumps 38 under the semiconductor wafer 32. Thereby, the chips 33A are joined to the semiconductor wafer 32.

Figure 37C:
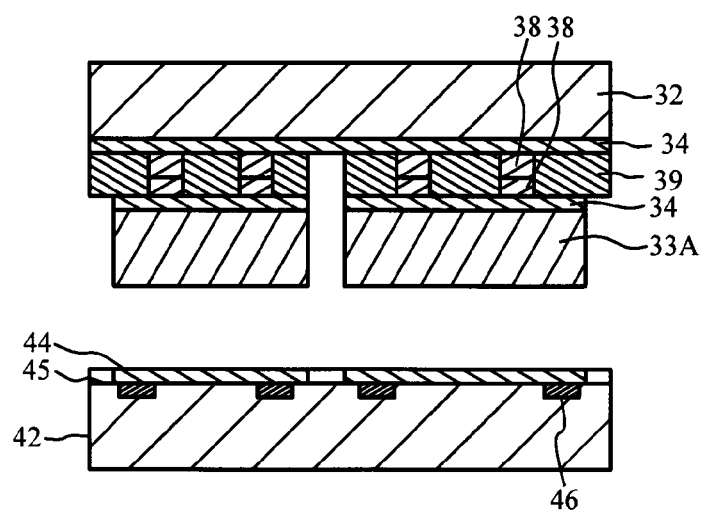

As illustrated in FIG. 37(c), when the reverse voltage is applied to the electrodes 46, the chips 33A are separated from the chip support substrate 42. Thereby, the chips 33A are simultaneously transferred from the chip support substrate 42 to the semiconductor wafer 32. Incidentally, the hydrophobic region 45 may not be removed until FIG. 37(c).

Figure 38A:
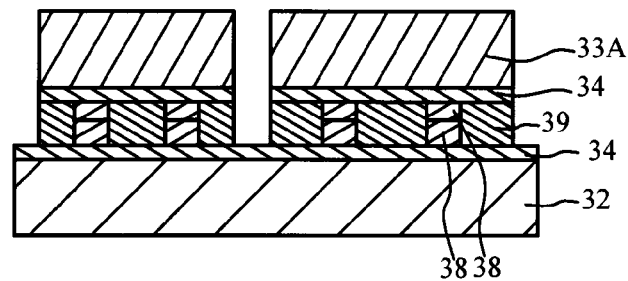
FIG. 38(a) to FIG. 38(c) are cross sectional views illustrating the fabrication method of the three-dimensional integrated circuit according to the modification example 4.
Figure 38B:
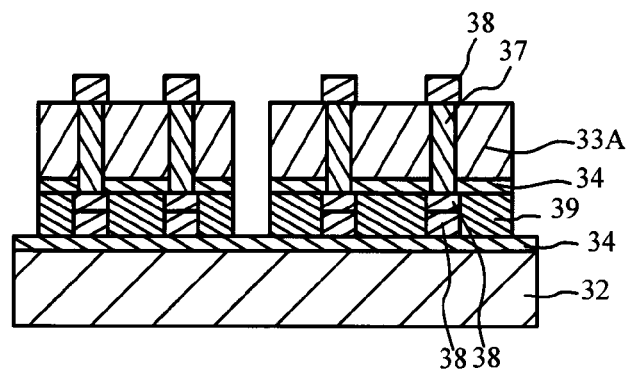

As illustrated in FIG. 38(a), it is turned upside-down, and the back surfaces (the upper surfaces) of the chips 33A are polished, so as to reduce the thickness of the chips 33A. As illustrated in FIG. 38(b), the TSVs 37 that penetrate the chip 33A are formed. The micro bumps 38 are formed on the upper surfaces of the chips 33A.

Figure 38C:
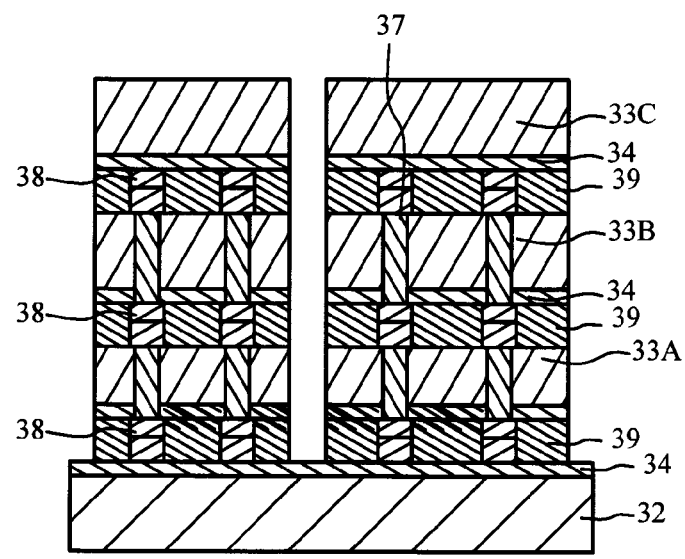

When FIG. 36(a) to FIG. 37(b) are repeated, the chips 33B are laminated on the chips 33A, as illustrated in FIG. 38(c). The chips 33C are laminated on the chips 33B. Thereafter, the resin mold is used to seal the chips 33A to 33C. By cutting the laminate body, the three-dimensional integrated circuit is completed.

According to the modification example 4, the chips can be directly transferred from the chip support substrate 42 to the semiconductor wafer 32, without using the adhesive wafer 43 that is used in the modification example 2.

Figure 39A:
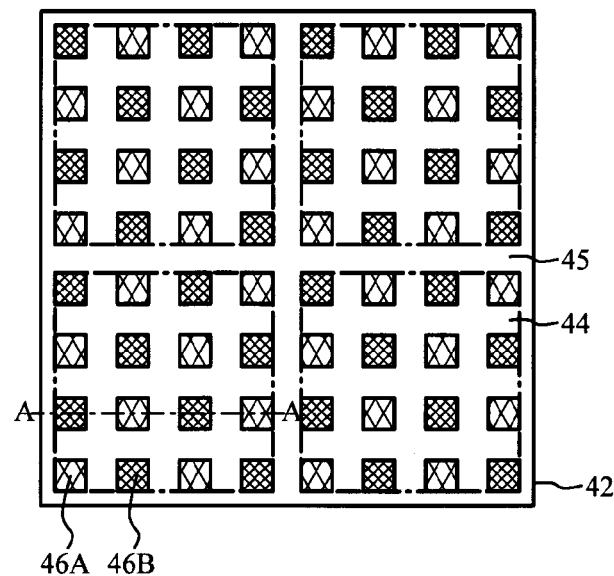
FIG. 39(a) is a plan view of the chip support substrate.

Another example of arranging the electrodes 46 is as follows. FIG. 39(a) is a plan view of the chip support substrate, and FIG. 39(b) and FIG. 39(c) are cross sectional views taken along the A-A line.

As illustrated in FIG. 39(a), a plurality of the electrodes 46 are formed on the upper surface of the chip support substrate 42. The electrodes 46 include the anodes 46A and the cathodes 46B. The electrodes 46 are disposed in a lattice shape. The electrodes 46 may be disposed not only in a square-shaped lattice shape, but also a diamond-shaped lattice shape, or a triangle-shaped lattice shape, for example. The anodes 46A and the cathodes 46B are disposed alternately. In each of the hydrophilic regions 44, a plurality of the anodes 46A and a plurality of the cathodes 46B are disposed.

Figure 39B:
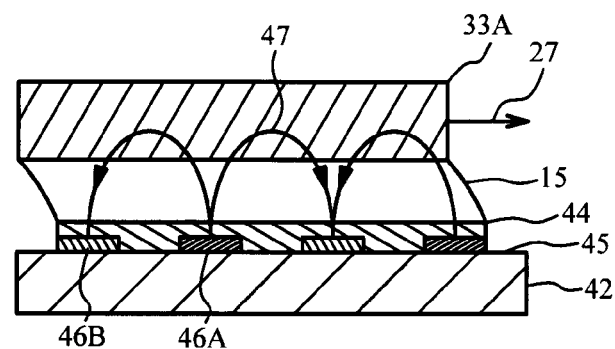
FIG. 39(b) and FIG. 39(c) are cross sectional views taken along the A-A line.

As illustrated in FIG. 39(b), the chip 33A is arranged on the hydrophilic region 44 with the liquid 15 interposed therebetween. When the positive voltage is applied to the anodes 46A and the negative voltage is applied to the cathodes 46B, lines of electric force 47 extend from the anodes 46A to the cathodes 46B. As the liquids 15 have a relative permittivity higher than that of the air, the lines of electric force 47 become dense. For this reason, the lines of electric force 47 become the densest at the center of the hydrophilic region 44. The electrostatic force 27 is generated in such a manner that the center of the chip 3A moves to the center of the hydrophilic region 44.

Figure 39C:
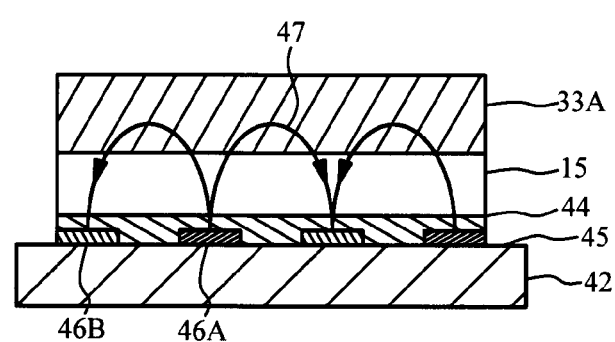

As illustrated in FIG. 39(c), the chip 33A is positioned onto the hydrophilic region 44 with high accuracy. Thus, the alignment accuracy of the chip 33A improves due to the electrostatic force, as well as the surface tension of the liquid 15.

Figure 40A:
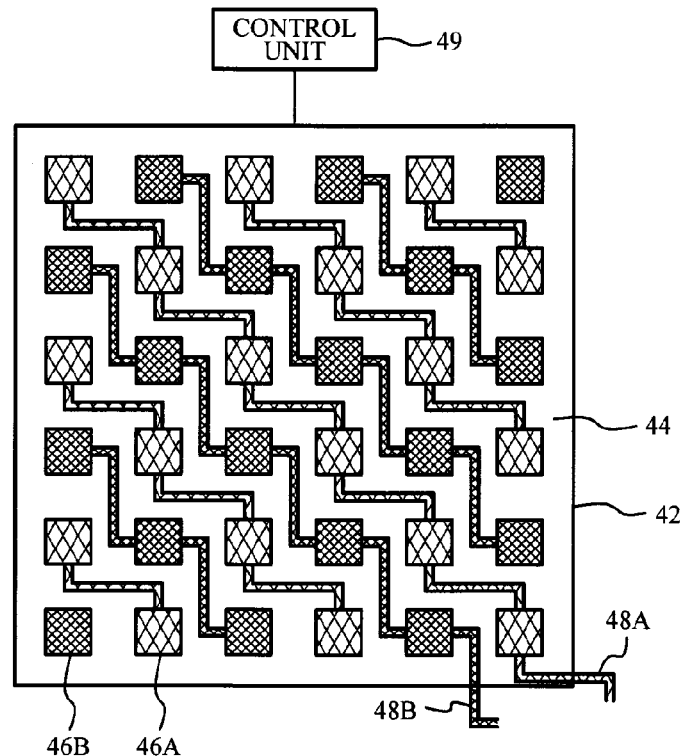
FIG. 40(a) and FIG. 40(b) are plan views illustrating another example of the chip support substrate.
Figure 40B:
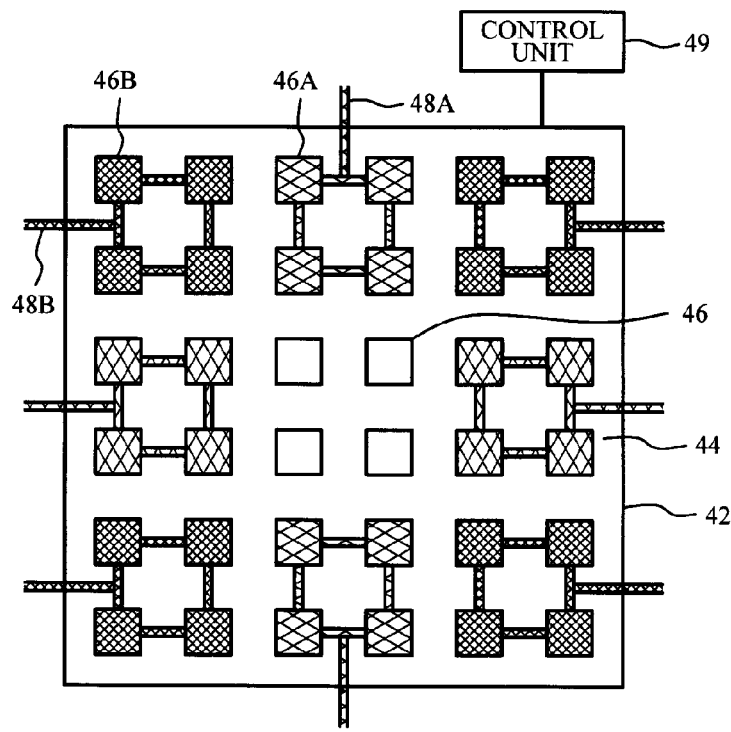

FIG. 40(a) and FIG. 40(b) are plan views illustrating another example of the chip support substrate. As illustrated in FIG. 40(a) and FIG. 40(b), a plurality of the electrodes 46 are disposed in a lattice shape on the chip support substrate 42. The chip support substrate 42 may be a multilayer substrate, for example. Wiring that electrically connects the electrodes 46 is formed in the chip support substrate 42. A control unit 49 can optionally connect the wiring between the electrodes 46. For example, wiring 48A for the anode and wiring 48B for the cathode are connected in such a manner that the anodes 46A and the cathodes 46B are arranged alternately, as illustrated in FIG. 40(a). This makes it possible to increase the electrostatic force applied to the chip.

As illustrated in FIG. 40(b), four adjacent electrodes 46 are wired to make the anode 46A, and four adjacent electrodes 46 are wired to make the cathode 46B. Thereby, the electrostatic force applied to the chip can be reduced. Thus, the control unit 49 optionally wires the electrodes 46, so as to control the electrostatic absorption force of the chip.

With the chip support substrate 2 or 42 according to this embodiment and its modification examples, the plurality of hydrophilic regions 4 or 44 (the lyophilic regions), corresponding to the plurality of chips, are formed on the substrate. In addition, the electrodes 6 or 46 that generate the electrostatic force in the plurality of chips are formed on the substrate and in the plurality of hydrophilic regions 4 or 44.

The chip support substrate like this is used, and the plurality of chips 3A or 33A are arranged onto the plurality of hydrophilic regions 4 or 44, with the liquids 15 interposed therebetween. A voltage is applied to the electrodes 6 or 46, so that the electrostatic force is generated in the chips 3A and 33A corresponding to the electrodes 6 or 46.

For example, the electrostatic force is generated so that the corresponding chip 3A or 33A is absorbed to the chip support substrate 2 or 42. Thus, when the plurality of chips 3A or 33A are absorbed to the chip support substrate 2 or 42, the chips 3A or 33A can be absorbed by the electrostatic absorption in addition to the surface tension of the liquids 15. Therefore, it is possible to prevent deterioration in the arrangement state of the chips in the processes after the transfer process and the like. Thus, the alignment accuracy of the chips can be improved. Moreover, as the voltage is applied to the electrodes 6 or 46, a lot of the chips can be absorbed simultaneously. Thus, the throughput can be improved.

When, for example, a voltage is supplied to the anode 6A or 46A and the cathode 6B or 46B while there exist the liquid 15, the electrostatic force is generated in such a manner that the center of the corresponding chip 3A or 33A is arranged between the cathode and the anode. Thereby, the chip 3A or 33A is registered to the electrode 6 or 46 not only by the surface tension of the liquid 15 but also by the electrostatic force. Therefore, the alignment accuracy of the chips 3A or 33A to the chip support substrate 2 or 42 is improved further.

As in the embodiment and the modification example 3, the chips 3B are laminated on each of the plurality of chips 3A that are absorbed to the chip support substrate 42, so as to form the three-dimensional integrated circuit. The chips 3A are not transferred according to this method, and hence the alignment displacement of the chips 3A due to the transfer can be suppressed. In addition, it is not necessary to use the substrate for the transfer.

As in the modification examples 1 and 2, the plurality of chips 33A that are absorbed to the chip support substrate 42 are transferred to another substrate such as the adhesive wafer 43. The plurality of chips 33A that are transferred to the adhesive wafer 43 are transferred to the semiconductor wafer 32. The three-dimensional integrated circuit can be formed like this. According to this method, it is not necessary to form the electrodes 6 and the like on the chips 3A, contrary to this embodiment and the modification example 3. Moreover, stress is easily accumulated on the substrate according to this embodiment and the modification example 3, but the stress is hardly accumulated on the substrate according to the modification examples 1 and 2.

As in the modification example 4, the plurality of chips 33A that are absorbed to the chip support substrate 42 are transferred onto the semiconductor wafer 32. Thus, the three-dimensional integrated circuit can be formed. According to this method, the number of times of the transfer can be reduced as compared with the modification examples 1 and 2.

Moreover, the cathodes and the anodes are formed in the plurality of hydrophilic regions. Thus, the chips can be absorbed electrostatically without applying the voltage to the chips, as in FIG. 9.

Further, as illustrated in FIG. 39(a), the anodes 46A and the cathodes 46B, formed along the first direction (the vertical direction in FIG. 39(a), for example) that is in parallel to the upper surface of the substrate, and the anodes 46A and the cathodes 46B, formed along the second direction (the horizontal direction in FIG. 39(a), for example) that is in parallel to the upper surface and that crosses the first direction, are formed. Thus, the alignment accuracy of the chips 33A can be improved as in FIGS. 39(a) and 35(b).

Moreover, as in FIG. 40(a) and FIG. 40(b), the control unit 49 optionally sets the arrangement of the anodes 46A and the cathodes 46B among the electrodes 46. Thereby, the electrostatic force applied to the chips can be set optionally.

It is needless to say that the present invention is not limited to the above-described examples, and various modifications can be made within the scope of the invention as set forth in the claims, which are also included in the scope of the invention.

The invention claimed is:

1. A chip support substrate comprising:
a lyophilic region that is formed on the substrate and that absorbs a chip; and
a cathode and an anode that are formed on the substrate and in the lyophilic region, that generate electrostatic force in the chip by applying a negative voltage to the cathode and applying a positive voltage to the anode.

2. The chip support substrate according to claim 1, wherein the lyophilic region includes a plurality of lyophilic regions that respectively absorb a plurality of the chips, and
wherein the cathode and the anode are formed in each of the plurality of lyophilic regions.

3. The chip support substrate according to claim 1, wherein the substrate is formed by a semiconductor, glass, ceramic, plastic or an interposer substrate.

4. The chip support substrate according to claim 1, wherein the cathode includes a plurality of cathodes, the anode includes a plurality of anodes, and
wherein, in the electrode, arrangement of the plurality of anodes and the plurality of cathodes is not fixed.

5. The chip support substrate according to claim 1, wherein the lyophilic region absorbs the chip by surface tension of a liquid dropped on the lyophilic region.

6. A chip support substrate comprising:
a lyophilic region that is formed on the substrate and that absorbs a chip; and
an electrode that is formed on the substrate and in the lyophilic region, that generates electrostatic force in the chip, and that comprises a cathode and an anode,
wherein the lyophilic region is formed by an insulation film.

7. A chip support substrate comprising:
a lyophilic region that is formed on the substrate and that absorbs a chip; and
an electrode that is formed on the substrate and in the lyophilic region, that generates electrostatic force in the chip, and that comprises a cathode and an anode, wherein a region where the lyophilic region is not arranged on the substrate comprises a region having a lyophilic property lower than that of the lyophilic region.

8. A chip support substrate comprising:
a lyophilic region that is formed on the substrate and that absorbs a chip; and
an electrode that is formed on the substrate and in the lyophilic region, that generates electrostatic force in the chip, and that comprises a cathode and an anode,
wherein the cathode includes a plurality of cathodes, the anode includes a plurality of anodes, and
wherein, in the lyophilic region, the plurality of cathodes and the plurality of anodes are disposed in a lattice shape along a first direction that is in parallel to an upper surface of the substrate and a second direction that is in parallel to the upper surface and that crosses the first direction.

9. A three-dimensional integrated circuit comprising:
the chip support substrate comprising a lyophilic region that is formed on the substrate and that absorbs a chip, and an electrode that is formed on the substrate and in the lyophilic region, that generates electrostatic force in the chip, and that comprises a cathode and an anode;
a chip that is laminated on the lyophilic region; and
another chip of one layer or more that is laminated on the chip.

10. The three-dimensional integrated circuit according to claim 9,
wherein the chip comprises another lyophilic region that absorbs the another chip on its upper surface, and other cathode and other anode that are formed on the upper surface of the chip and in the another lyophilic region and that generate electrostatic force in the another chip.

11. A chip support method comprising the steps of:
arranging a chip via a liquid onto a lyophilic region of a chip support substrate comprising the lyophilic region that is formed on the substrate, and an electrode that is formed on the substrate and in the lyophilic region and that comprise a cathode and an anode; and generating electrostatic force in the chip corresponding to the electrode by applying a voltage to the electrode.

12. The chip support method according to claim 11,
wherein the lyophilic region includes a plurality of the lyophilic regions that respectively absorb a plurality of the chips,
wherein the electrode is formed in each of the plurality of lyophilic regions, and
wherein the step of arranging the chip comprises the step of arranging each of the plurality of chips onto each of the plurality of lyophilic regions via the liquids.

13. The chip support method according to claim 11, further comprising the step of
allowing the chip to be absorbed to the lyophilic region.

14. The chip support method according to claim 11,
wherein the step of generating the electrostatic force comprises the step of generating the electrostatic force in such a manner that a center of the chip is arranged between the cathode and the anode, by supplying a voltage to the cathode and the anode while there is the liquid.

15. The chip support method according to claim 11,
wherein the step of generating the electrostatic force comprises the step of generating the electrostatic force in such a manner that the chip is absorbed to the chip support substrate.

16. The chip support method according to claim 11, further comprising the step of laminating another chip on the chip while the chip is absorbed to the chip support substrate.

17. The chip support method according to claim 11, further comprising the steps of:
transferring the chip that is absorbed to the chip support substrate to another substrate; and
transferring the chip that is transferred to the another substrate to a semiconductor wafer.

18. The chip support method according to claim 11, further comprising the step of
transferring the chip that is absorbed to the chip support substrate onto a semiconductor wafer.

19. The chip support method according to claim 11,
wherein a region where the lyophilic region is not arranged on the substrate comprises a region having a lyophilic property lower than that of the lyophilic region.

20. The chip support method according to claim 19, further comprising the step of
removing the region having the lower lyophilic property.

21. A fabrication method of a three-dimensional integrated circuit comprising the chip support method according to claim 11.

22. An assembly device comprising:
a stage for mounting a chip support substrate comprising a lyophilic region that is formed on the substrate and a cathode and an anode that are formed on the substrate and in the lyophilic region;
a droplet supply unit for supplying a droplet onto the lyophilic region;
a carrier robot for supplying a chip onto the droplet supplied onto the lyophilic region; and
a power source unit for supplying a voltage to the electrode in such a manner that electrostatic force is generated in the chip,
wherein the electrostatic force is generated in the chip by applying a negative voltage to the cathode and applying a positive voltage to the anode.

* * * * *

UNITED STATES PATENT AND TRADEMARK OFFICE
CERTIFICATE OF CORRECTION

| | |
|---|---|
| PATENT NO. | : 9,449,948 B2 |
| APPLICATION NO. | : 14/427232 |
| DATED | : September 20, 2016 |
| INVENTOR(S) | : Mitsumasa Koyanagi et al. |

It is certified that error appears in the above-identified patent and that said Letters Patent is hereby corrected as shown below:

On the Title Page

Change
(71) Applicant: TOHOKU UNIVERSITY, Sendai-shi, "Myagi" (JP)

To be
(71) Applicant: TOHOKU UNIVERSITY, Sendai-shi, --Miyagi-- (JP)

Signed and Sealed this
Third Day of January, 2017

Michelle K. Lee
*Director of the United States Patent and Trademark Office*